US010833277B2

(12) United States Patent
Huh et al.

(10) Patent No.: US 10,833,277 B2
(45) Date of Patent: Nov. 10, 2020

(54) HETEROCYCLIC COMPOUND AND ORGANIC LIGHT EMITTING DIODE COMPRISING SAME

(71) Applicant: LG Chem, Ltd., Seoul (KR)

(72) Inventors: Jungoh Huh, Daejeon (KR); Dong Hoon Lee, Daejeon (KR); Boonjae Jang, Daejeon (KR); Minyoung Kang, Daejeon (KR); Dong Uk Heo, Daejeon (KR); Miyeon Han, Daejeon (KR); Min Woo Jung, Daejeon (KR)

(73) Assignee: LG Chem, Ltd. (KR)

( * ) Notice: Subject to any disclaimer, the term of this patent is extended or adjusted under 35 U.S.C. 154(b) by 311 days.

(21) Appl. No.: 15/757,574

(22) PCT Filed: Sep. 8, 2016

(86) PCT No.: PCT/KR2016/010060
§ 371 (c)(1),
(2) Date: Mar. 5, 2018

(87) PCT Pub. No.: WO2017/047977
PCT Pub. Date: Mar. 23, 2017

(65) Prior Publication Data

US 2018/0248126 A1 Aug. 30, 2018

(30) Foreign Application Priority Data

Sep. 15, 2015 (KR) ........................ 10-2015-0130353

(51) Int. Cl.
*H01L 51/00* (2006.01)
*C09K 11/06* (2006.01)
(Continued)

(52) U.S. Cl.
CPC ............ *H01L 51/0067* (2013.01); *C07F 9/58* (2013.01); *C07F 9/6512* (2013.01); *C07F 9/6521* (2013.01); *C07F 9/65517* (2013.01); *C07F 9/65685* (2013.01); *C07F 9/655354* (2013.01); *C09K 11/06* (2013.01); *H01L 51/0052* (2013.01); *H01L 51/0058* (2013.01);
(Continued)

(58) Field of Classification Search
None
See application file for complete search history.

(56) References Cited

U.S. PATENT DOCUMENTS

2008/0241518 A1 10/2008 Satou et al.
2012/0256171 A1 10/2012 Terashima et al.
2014/0048792 A1 2/2014 Chun et al.

FOREIGN PATENT DOCUMENTS

CN 103187531 A 7/2013
JP 2004095221 A 3/2004
(Continued)

OTHER PUBLICATIONS

Machine Engliish translation of Park et al. (WO-2017/105039 A1). Mar. 6, 2020.*
(Continued)

*Primary Examiner* — Jay Yang
(74) *Attorney, Agent, or Firm* — Lerner, David, Littenberg, Krumholz & Mentlik, LLP

(57) ABSTRACT

The present specification provides a heterocyclic compound and an organic light emitting device comprising the same.

19 Claims, 1 Drawing Sheet

(51) Int. Cl.

| | |
|---|---|
| ***C07F 9/6521*** | (2006.01) |
| ***C07F 9/6568*** | (2006.01) |
| ***C07F 9/655*** | (2006.01) |
| ***H01L 51/50*** | (2006.01) |
| ***C07F 9/6553*** | (2006.01) |
| ***C07F 9/6512*** | (2006.01) |
| ***C07F 9/58*** | (2006.01) |

(52) U.S. Cl.

CPC ...... *H01L 51/0071* (2013.01); *H01L 51/0073* (2013.01); *H01L 51/50* (2013.01); *C09K 2211/1018* (2013.01); *H01L 51/5016* (2013.01); *H01L 51/5056* (2013.01); *H01L 51/5072* (2013.01); *H01L 51/5088* (2013.01); *H01L 51/5092* (2013.01)

(56) References Cited

FOREIGN PATENT DOCUMENTS

| | | | |
|---|---|---|---|
| JP | 2008270729 | A | 11/2008 |
| JP | 2012224626 | A | 11/2012 |
| KR | 20130023071 | A | 3/2013 |
| KR | 20130037186 | A | 4/2013 |
| KR | 101652323 | B1 | 8/2016 |
| WO | WO-2017/105039 | A1 * | 6/2017 |

OTHER PUBLICATIONS

International Search Report From PCT/KR2016/010060 dated Dec. 14, 2016.

* cited by examiner

[Figure 1]
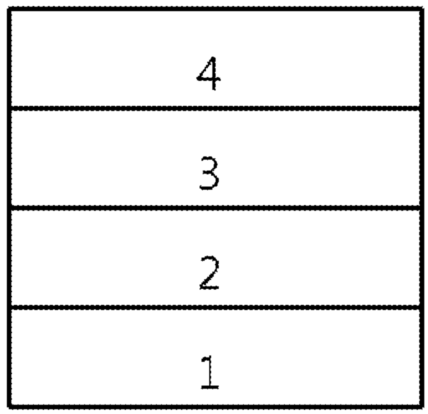
[Figure 2]
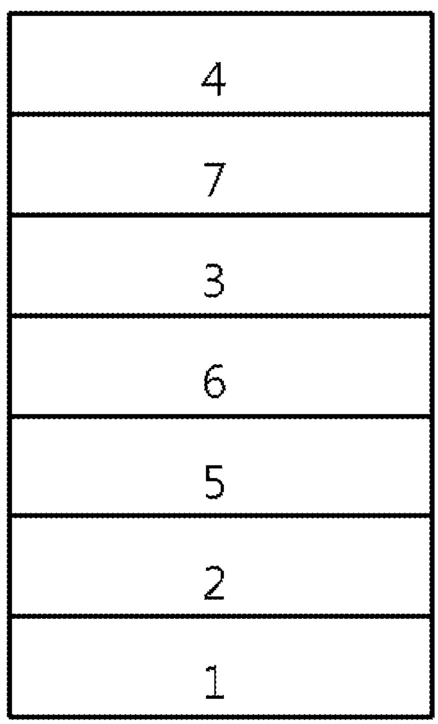

HETEROCYCLIC COMPOUND AND ORGANIC LIGHT EMITTING DIODE COMPRISING SAME

CROSS-REFERENCE TO RELATED APPLICATIONS

This application is a national phase entry under 35 U.S.C. § 371 of International Application No. PCT/KR2016/010060, filed Sep. 8, 2016, which claims priority to Korean Patent Application No. 10-2015-0130353, filed Sep. 15, 2015, the disclosures of which are incorporated herein by reference.

TECHNICAL FIELD

The present specification relates to a heterocyclic compound and an organic light emitting device comprising the same.

BACKGROUND ART

In general, an organic light emitting phenomenon refers to a phenomenon in which electric energy is converted into light energy by using an organic material. An organic light emitting device using the organic light emitting phenomenon usually has a structure including a positive electrode, a negative electrode, and an organic material layer interposed therebetween. Here, the organic material layer may have a multi-layered structure composed of different materials in order to improve the efficiency and stability of an organic light emitting device in many cases, and for example, may be composed of a hole injection layer, a hole transport layer, a light emitting layer, an electron transport layer, an electron injection layer, and the like. In the structure of the organic light emitting device, if a voltage is applied between two electrodes, holes are injected from a positive electrode into the organic material layer and electrons are injected from a negative electrode into the organic material layer, and when the injected holes and electrons meet each other, an exciton is formed, and light is emitted when the exciton falls down again to a ground state.

There is a continuous need for developing a new material for the aforementioned organic light emitting device.

DETAILED DESCRIPTION OF THE INVENTION

Technical Problem

The present specification describes a heterocyclic compound and an organic light emitting device comprising the same.

Technical Solution

An exemplary embodiment of the present specification provides a compound represented by the following Chemical Formula 1:

[Chemical Formula 1]

$$(HAr)_a \!-\!\!\left(L_1 - Ar_1 - L_2 - (R)_b\right)_c$$

in Chemical Formula 1, $L_1$ and $L_2$ are the same as or different from each other, and are each independently a substituted or unsubstituted arylene group, $Ar_1$ is a single bond; or a substituted or unsubstituted arylene group, a to c are the same as or different from each other, and are each independently an integer of 1 to 3, when a is 2 or more, c is 1 and HAr's are the same as or different from each other, when b is 2 or more, R's are the same as or different from each other, when c is 2 or more, a is 1 and the structures in the parenthesis are the same as or different from each other, HAr is any one selected from the following structures of (a) to (e), (a)

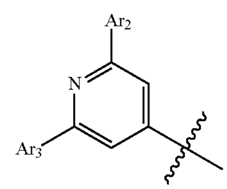

(b)

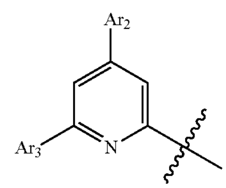

(c)

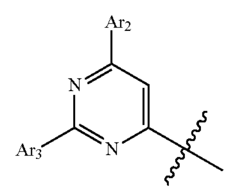

(d)

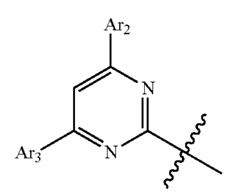

(e)

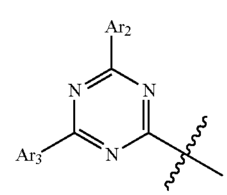

$Ar_2$ and $Ar_3$ are the same as or different from each other, and are each independently a substituted or unsubstituted aryl group; or a substituted or unsubstituted heterocyclic group including O or S, when c is 2, at least one of $Ar_2$ and $Ar_3$ is represented by

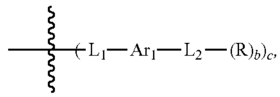

when c is 3, $Ar_2$ and $Ar_3$ are the same as or different from each other, and are each independently represented by

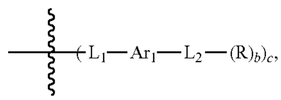

and

R is represented by the following Chemical Formula 2,

[Chemical Formula 2]

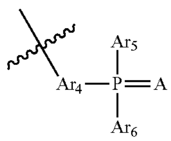

in Chemical Formula 2,

A is O; S; or Se, $Ar_4$ is a substituted or unsubstituted arylene group, and $Ar_5$ and $Ar_6$ are the same as or different from each other, and are each independently a substituted or unsubstituted aryl group, or adjacent groups may combine with each other to form a ring.

Further, an exemplary embodiment of the present specification provides an organic light emitting device including: a first electrode; a second electrode provided to face the first electrode; and one or more organic material layers provided between the first electrode and the second electrode, in which one or more layers of the organic material layers include the compound of Chemical Formula 1.

Advantageous Effects

The compound described in the present specification may be used as a material for an organic material layer of an organic light emitting device. The compound according to at least one exemplary embodiment may improve the efficiency, achieve low driving voltage and/or improve lifetime characteristics in the organic light emitting device. In particular, the compound described in the present specification may be used as a material for hole injection, hole transport, hole injection and hole transport, electron inhibition, light emission, hole inhibition, electron transport, or electron injection.

DESCRIPTION OF DRAWINGS

FIG. 1 illustrates an example of an organic light emitting device composed of a substrate 1, a positive electrode 2, a light emitting layer 3, and a negative electrode 4.

FIG. 2 illustrates an example of an organic light emitting device composed of a substrate 1, a positive electrode 2, a hole injection layer 5, a hole transport layer 6, a light emitting layer 3, an electron transport layer 7, and a negative electrode 4.

1: Substrate
2: Positive electrode
3: Light emitting layer
4: Negative electrode
5: Hole injection layer
6: Hole transport layer
7: Electron transport layer

BEST MODE

Hereinafter, the present specification will be described in more detail.

An exemplary embodiment of the present specification provides the compound represented by Chemical Formula 1.

Examples of the substituents will be described below, but are not limited thereto.

In the present specification,

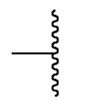

and

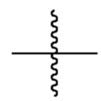

mean a moiety linked to another substituent.

In the present specification, the term "substituted or unsubstituted" means that a group is unsubstituted or substituted with one or more substituents selected from the group consisting of deuterium; a halogen group; a nitrile group; a nitro group; a hydroxy group; a carbonyl group; an ester group; an imide group; an amino group; a phosphine oxide group; an alkoxy group; an aryloxy group; an alkylthioxy group; an arylthioxy group; an alkylsulfoxy group; an arylsulfoxy group; a silyl group; a boron group; an alkyl group; a cycloalkyl group; an alkenyl group; an aryl group; an aralkyl group; an aralkenyl group; an alkylaryl group; an alkylamine group; an aralkylamine group; a heteroarylamine group; an arylamine group; an arylphosphine group; and a heterocyclic group, or a substituent to which two or more substituents among the substituents exemplified above are linked is substituted or unsubstituted. For example, "the substituent to which two or more substituents are linked" may be a biphenyl group. That is, the biphenyl group may also be an aryl group, and may be interpreted as a substituent to which two phenyl groups are linked.

In the present specification, the "adjacent" group may mean a substituent substituted with an atom directly linked to an atom in which the corresponding substituent is substituted, a substituent disposed to be sterically closest to the corresponding substituent, or another substituent substituted with an atom in which the corresponding substituent is substituted. For example, two substituents substituted at the ortho position in a benzene ring and two substituents substituted with the same carbon in an aliphatic ring may be interpreted as groups which are "adjacent" to each other. Or, $Ar_5$ and $Ar_6$ of Chemical Formula 2 may be interpreted as groups which are "adjacent" to each other.

In the present specification, examples of a halogen group include fluorine, chlorine, bromine or iodine.

In the present specification, the number of carbon atoms of a carbonyl group is not particularly limited, but is preferably 1 to 40. Specifically, the carbonyl group may be a compound having the following structures, but is not limited thereto.

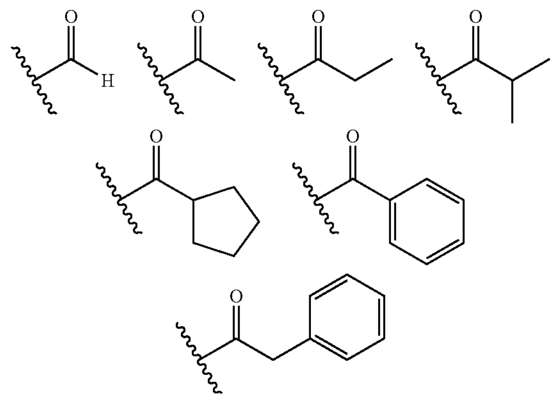

In the present specification, in an ester group, the oxygen of the ester group may be substituted with a straight-chained, branch-chained, or cyclic alkyl group having 1 to 40 carbon atoms, or an aryl group having 6 to 30 carbon atoms. Specifically, the ester group may be a compound having the following structural formulae, but is not limited thereto.

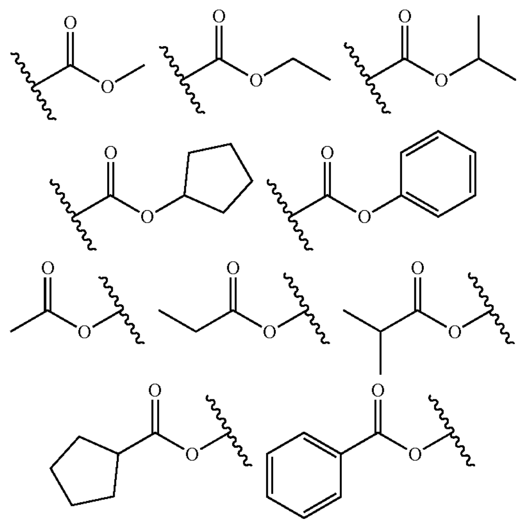

In the present specification, the number of carbon atoms of an imide group is not particularly limited, but is preferably 1 to 25. Specifically, the imide group may be a compound having the following structures, but is not limited thereto.

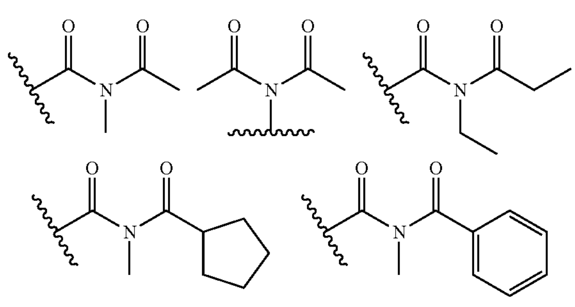

In the present specification, a silyl group may be represented by a chemical formula of —$SiR_aR_bR_c$, and $R_a$, $R_b$, and $R_c$ may be each hydrogen; a substituted or unsubstituted alkyl group; or a substituted or unsubstituted aryl group. Specific examples of the silyl group include a trimethylsilyl group, a triethylsilyl group, a t-butyldimethylsilyl group, a vinyldimethylsilyl group, a propyldimethylsilyl group, a triphenylsilyl group, a diphenylsilyl group, a phenylsilyl group, and the like, but are not limited thereto.

In the present specification, a boron group may be represented by a chemical formula of —$BR_aR_b$, and $R_a$ and $R_b$ may be each hydrogen; a substituted or unsubstituted alkyl group; or a substituted or unsubstituted aryl group. Specific examples of the boron group include a trimethylboron group, a triethylboron group, a t-butyldimethylboron group, a triphenylboron group, a phenylboron group, and the like, but are not limited thereto.

In the present specification, the alkyl group may be straight-chained or branch-chained, and the number of carbon atoms thereof is not particularly limited, but is preferably 1 to 40. According to an exemplary embodiment, the number of carbon atoms of the alkyl group is 1 to 20. According to another exemplary embodiment, the number of carbon atoms of the alkyl group is 1 to 10. According to still another exemplary embodiment, the number of carbon atoms of the alkyl group is 1 to 6. Specific examples of the alkyl group include methyl, ethyl, propyl, n-propyl, isopropyl, butyl, n-butyl, isobutyl, tert-butyl, sec-butyl, 1-methyl-butyl, 1-ethyl-butyl, pentyl, n-pentyl, isopentyl, neopentyl, tert-pentyl, hexyl, n-hexyl, 1-methylpentyl, 2-methylpentyl, 4-methyl-2-pentyl, 3,3-dimethylbutyl, 2-ethylbutyl, heptyl, n-heptyl, 1-methylhexyl, cyclopentylmethyl, cyclohexylmethyl, octyl, n-octyl, tert-octyl, 1-methylheptyl, 2-ethylhexyl, 2-propylpentyl, n-nonyl, 2,2-dimethylheptyl, 1-ethylpropyl, 1,1-dimethyl-propyl, isohexyl, 4-methylhexyl, 5-methylhexyl, and the like, but are not limited thereto.

In the present specification, the alkoxy group may be straight-chained, branch-chained, or cyclic. The number of carbon atoms of the alkoxy group is not particularly limited, but is preferably 1 to 40. Specific examples thereof include methoxy, ethoxy, n-propoxy, isopropoxy, i-propyloxy, n-butoxy, isobutoxy, tert-butoxy, sec-butoxy, n-pentyloxy, neopentyloxy, isopentyloxy, n-hexyloxy, 3,3-dimethylbutyloxy, 2-ethylbutyloxy, n-octyloxy, n-nonyloxy, n-decyloxy, benzyloxy, p-methylbenzyloxy, and the like, but are not limited thereto.

A substituent including an alkyl group, an alkoxy group, and other alkyl group moieties described in the present specification includes both a straight-chained form and a branch-chained form.

In the present specification, the alkenyl group may be straight-chained or branch-chained, and the number of carbon atoms thereof is not particularly limited, but is preferably 2 to 40. According to an exemplary embodiment, the number of carbon atoms of the alkenyl group is 2 to 20. According to another exemplary embodiment, the number of carbon atoms of the alkenyl group is 2 to 10. According to still another exemplary embodiment, the number of carbon atoms of the alkenyl group is 2 to 6. Specific examples thereof include vinyl, 1-propenyl, isopropenyl, 1-butenyl, 2-butenyl, 3-butenyl, 1-pentenyl, 2-pentenyl, 3-pentenyl, 3-methyl-1-butenyl, 1,3-butadienyl, allyl, 1-phenylvinyl-1-yl, 2-phenylvinyl-1-yl, 2,2-diphenylvinyl-1-yl, 2-phenyl-2-(naphthyl-1-yl) vinyl-1-yl, 2,2-bis(diphenyl-1-yl)vinyl-1-yl, a stilbenyl group, a styrenyl group, and the like, but are not limited thereto.

In the present specification, a cycloalkyl group is not particularly limited, but has preferably 3 to 60 carbon atoms, and according to an exemplary embodiment, the number of carbon atoms of the cycloalkyl group is 3 to 40. According to another exemplary embodiment, the number of carbon atoms of the cycloalkyl group is 3 to 20. According to still another exemplary embodiment, the number of carbon atoms of the cycloalkyl group is 3 to 6. Specific examples thereof include cyclopropyl, cyclobutyl, cyclopentyl, 3-methylcyclopentyl, 2,3-dimethylcyclopentyl, cyclohexyl, 3-methylcyclohexyl, 4-methylcyclohexyl, 2,3-dimethylcyclohexyl, 3,4,5-trimethylcyclohexyl, 4-tert-butylcyclohexyl, cycloheptyl, cyclooctyl, and the like, but are not limited thereto.

In the present specification, the number of carbon atoms of an alkylamine group is not particularly limited, but is preferably 1 to 40. Specific examples of the alkylamine group include a methylamine group, a dimethylamine group, an ethylamine group, a diethylamine group, a phenylamine group, a naphthylamine group, a biphenylamine group, an anthracenylamine group, a 9-methyl-anthracenylamine group, a diphenylamine group, a phenylnaphthylamine group, a ditolylamine group, a phenyltolylamine group, a triphenylamine group, and the like, but are not limited thereto.

In the present specification, examples of an arylamine group include a substituted or unsubstituted monoarylamine group, a substituted or unsubstituted diarylamine group, or a substituted or unsubstituted triarylamine group. The aryl group in the arylamine group may be a monocyclic aryl group or a polycyclic aryl group. The arylamine group including the two or more aryl groups may include a monocyclic aryl group, a polycyclic aryl group, or both a monocyclic aryl group and a polycyclic aryl group.

Specific examples of the arylamine group include phenylamine, naphthylamine, biphenylamine, anthracenylamine, 3-methyl-phenylamine, 4-methyl-naphthylamine, 2-methyl-biphenylamine, 9-methyl-anthracenylamine, a diphenylamine group, a phenylnaphthylamine group, a ditolylamine group, a phenyltolylamine group, carbazole, a triphenylamine group, and the like, but are not limited thereto.

In the present specification, examples of a heteroarylamine group include a substituted or unsubstituted monoheteroarylamine group, a substituted or unsubstituted diheteroarylamine group, or a substituted or unsubstituted triheteroarylamine group. The heteroaryl group in the heteroarylamine group may be a monocyclic heterocyclic group or a polycyclic heterocyclic group. The heteroarylamine group including two or more heterocyclic groups may include a monocyclic heterocyclic group, a polycyclic heterocyclic group, or both a monocyclic heterocyclic group and a polycyclic heterocyclic group.

In the present specification, an arylheteroarylamine group means an amine group substituted with an aryl group and a heterocyclic group.

In the present specification, examples of an arylphosphine group include a substituted or unsubstituted monoarylphosphine group, a substituted or unsubstituted diarylphosphine group, or a substituted or unsubstituted triarylphosphine group. The aryl group in the arylphosphine group may be a monocyclic aryl group, and may be a polycyclic aryl group. The arylphosphine group including two or more aryl groups may include a monocyclic aryl group, a polycyclic aryl group, or both a monocyclic aryl group and a polycyclic aryl group.

In the present specification, an aryl group is not particularly limited, but has preferably 6 to 60 carbon atoms, and may be a monocyclic aryl group or a polycyclic aryl group. According to an exemplary embodiment, the number of carbon atoms of the aryl group is 6 to 30. According to an exemplary embodiment, the number of carbon atoms of the aryl group is 6 to 20. When the aryl group is a monocyclic aryl group, examples of the monocyclic aryl group include a phenyl group, a biphenyl group, a terphenyl group, and the like, but are not limited thereto. Examples of the polycyclic aryl group include a naphthyl group, an anthracenyl group, a phenanthryl group, a pyrenyl group, a perylenyl group, a chrysenyl group, a fluorenyl group, and the like, but are not limited thereto.

In the present specification, a fluorenyl group may be substituted, and two substituents may combine with each other to form a spiro structure.

When the fluorenyl group is substituted, the fluorenyl group may be a substituted fluorenyl group such as a spiro fluorenyl group such as

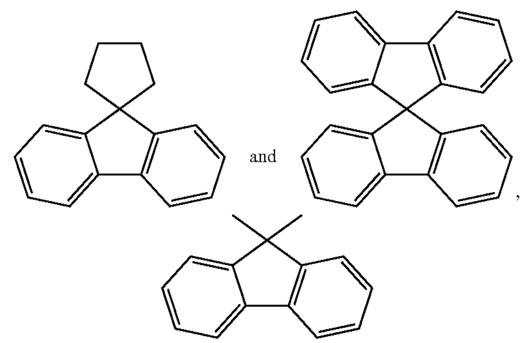

(a 9,9-dimethylfluorenyl group), and

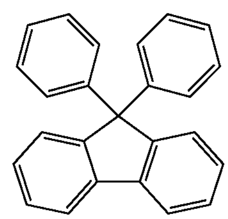 [SMILES: c1ccc(C2(c3ccccc3)c3ccccc3-c3ccccc32)cc1]

(a 9,9-diphenylfluorenyl group). However, the fluorenyl group is not limited thereto.

In the present specification, a heterocyclic group is a heterocyclic group including one or more of N, O, P, S, Si, and Se as a hetero atom, and the number of carbon atoms thereof is not particularly limited, but is preferably 1 to 60. According to an exemplary embodiment, the number of carbon atoms of the heterocyclic group is 1 to 30. Examples of the heterocyclic group include a pyridyl group, a pyrrole group, a pyrimidyl group, a pyridazinyl group, a furanyl group, a thiophenyl group, an imidazole group, a pyrazole group, an oxazole group, an isooxazole group, a triazole group, an isothiazole group, a triazole group, an oxadiazole group, a thiadiazole group, a dithiazole group, a tetrazole group, a pyranyl group, a thiopyranyl group, a pyrazinyl group, an oxazinyl group, a triazinyl group, a dioxynyl group, a triazinyl group, a tetrazinyl group, a quinolinyl group, an isoquinolinyl group, a quinolyl group, a quinazolinyl group, a quinoxalinyl group, a naphthyridinyl group, an acrydyl group, a xanthenyl group, a phenanthridinyl group, a diaza naphthalenyl group, a triazaindenyl group, an indole group, an indolinyl group, an indolizinyl group, a phthalazinyl group, a pyrido pyrimidinyl group, a pyrido pyrazinyl group, a pyrazino pyrazinyl group, a benzothiazole group, a benzoxazole group, a benzimidazole group, a benzothiophene group, a benzofuranyl group, a dibenzothiophenyl group, a dibenzofuranyl group, a carbazole group, a benzocarbazole group, a dibenzocarbazole group, an indolocarbazole group, an indenocarbazole group, a phenazinyl group, an imidazopyridine group, a phenoxazinyl group, a phenanthridine group, a phenanthroline group, a phenothiazine group, an imidazopyridine group, an imidazophenanthridine group, a benzoimidazoquinazoline group, or a benzoimidazophenanthridine group, and the like, but are not limited thereto.

In the present specification, the above-described description on the heterocyclic group may be applied to a heteroaryl group except for an aromatic group.

In the present specification, the above-described description on the aryl group may be applied to an aryl group in an aryloxy group, an arylthioxy group, an arylsulfoxy group, an arylphosphine group, an aralkyl group, an aralkylamine group, an aralkenyl group, an alkylaryl group, an arylamine group, and an arylheteroarylamine group. In the present specification, the above-described description on the alkyl group may be applied to an alkyl group in an alkylthioxy group, an alkylsulfoxy group, an aralkyl group, an aralkylamine group, an alkylaryl group, and an alkylamine group.

In the present specification, the above-described description on the heterocyclic group may be applied to a heteroaryl group in a heteroaryl group, a heteroarylamine group, and an arylheteroarylamine group.

In the present specification, the above-described description on the alkenyl group may be applied to an alkenyl group in an aralkenyl group.

In the present specification, the above-described description on the aryl group may be applied to an arylene group except for a divalent arylene group.

In the present specification, the above-described description on the heterocyclic group may be applied to a heteroarylene group except for a divalent group of an aromatic heterocyclic group.

In the present specification, the meaning of combining with an adjacent group to form a ring means combining with an adjacent group to form a substituted or unsubstituted aliphatic hydrocarbon ring; a substituted or unsubstituted aromatic hydrocarbon ring; a substituted or unsubstituted aliphatic hetero ring; a substituted or unsubstituted aromatic hetero ring; or a condensed ring thereof.

In the present specification, an aliphatic hydrocarbon ring means a ring composed only of carbon and hydrogen atoms as a ring which is not an aromatic group. Specifically, examples of the aliphatic hydrocarbon ring include cyclopropane, cyclobutane, cyclobutene, cyclopentane, cyclopentene, cyclohexane, cyclohexene, 1,4-cyclohexadiene, cycloheptane, cycloheptene, cyclooctane, cyclooctene, and the like, but are not limited thereto.

In the present specification, an aromatic hydrocarbon ring means an aromatic ring composed only of carbon and hydrogen atoms. Specifically, examples of the aromatic hydrocarbon ring include benzene, naphthalene, anthracene, phenanthrene, perylene, fluoranthene, triphenylene, phenalene, pyrene, tetracene, chrysene, pentacene, fluorene, indene, acenaphthylene, benzofluorene, spirofluorene, and the like, but are not limited thereto.

In the present specification, an aliphatic hetero ring means an aliphatic ring including one or more of hetero atoms. Specifically, examples of the aliphatic hetero ring include oxirane, tetrahydrofuran, 1,4-dioxane, pyrrolidine, piperidine, morpholine, oxepane, azocane, thiocane, and the like, but are not limited thereto. In the present specification, an aromatic hetero ring means an aromatic ring including one or more of hetero atoms. Specifically, examples of the aromatic hetero ring include pyridine, pyrrole, pyrimidine, pyridazine, furan, thiophene, imidazole, pyrazole, oxazole, isoxazole, triazole, isothiazole, triazole, oxadiazole, thiadiazole, dithiazole, tetrazole, pyran, thiopyran, diazine, oxazine, triazine, dioxine, triazine, tetrazine, isoquinoline, quinoline, quinol, quinazoline, quinoxaline, naphthyridine, acridine, phenanthridine, diaza naphthalene, triazaindene, indole, indolizine, benzothiazole, benzoxazle, benzoimidazole, benzothiophene, benzofuran, dibenzothiophene, dibenzofuran, carbazole, benzophosphindole (benzo[b]phosphindole,

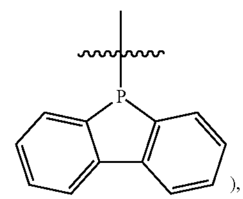 [SMILES: *p1c2ccccc2c2ccccc21]

), benzocarbazole, dibenzocarbazole, phenazine, imidazopyridine, phenoxazine, phenanthridine, indolocarbazole, indenocarbazole, and the like, but are not limited thereto.

In the present specification, the aliphatic hydrocarbon ring, the aromatic hydrocarbon ring, the aliphatic hetero ring, and the aromatic hetero ring may be monocyclic or polycyclic.

In the present specification, $L_1$ and $L_2$ are the same as or different from each other, and are each independently an arylene group having 6 to 60 ring members.

In the present specification, $L_1$ and $L_2$ are the same as or different from each other, and are each independently a substituted or unsubstituted phenylene group; a substituted or unsubstituted biphenylylene group; a substituted or unsubstituted terphenylene group; a substituted or unsubstituted quaterphenylene group; a substituted or unsubstituted naphthylene group; a substituted or unsubstituted anthracenylene group; a substituted or unsubstituted phenanthrenylene group; a substituted or unsubstituted triphenylenylene group; a substituted or unsubstituted pyrenylene group; or a substituted or unsubstituted fluorenylene group.

Further, in the present specification, $L_1$ and $L_2$ are the same as or different from each other, and are each independently preferably any one substituent selected from the following group, but are not limited thereto, and the following structures may be additionally substituted.

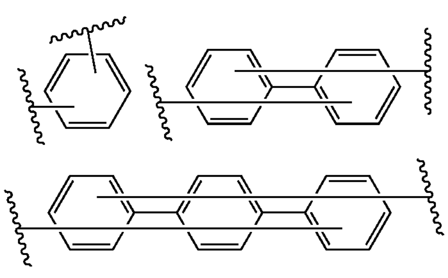

-continued

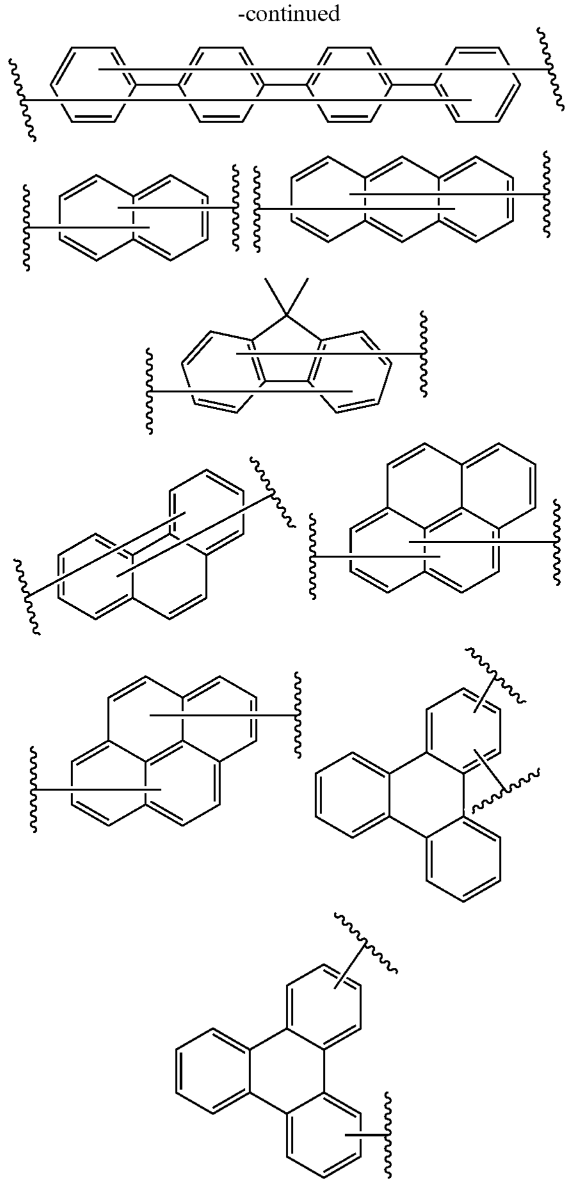

The structures may be unsubstituted or substituted with one or more substituents selected from the group consisting of deuterium; a halogen group; a nitrile group; a nitro group; a hydroxy group; a carbonyl group; an ester group; an imide group; an amine group; a phosphineoxide group, an alkoxy group; an aryloxy group; an alkylthioxy group; an arylthioxy group; an alkylsulfoxy group; an arylsulfoxy group; a silyl group; a boron group; an alkyl group; a cycloalkyl group; an alkenyl group; an aryl group; an aralkyl group; an aralkenyl group; an alkylaryl group; an alkylamine group; an aralkylamine group; a heteroarylamine group; an arylamine group; an arylheteroarylamine group; an arylphosphine group; and a heterocyclic group.

In an exemplary embodiment, $L_1$ and $L_2$ are the same as or different from each other, and are each independently a substituted or unsubstituted phenylene group.

In an exemplary embodiment, $L_1$ is a substituted or unsubstituted phenylene group, and $L_2$ is a substituted or unsubstituted biphenylylene group.

In an exemplary embodiment, $L_1$ and $L_2$ are the same as or different from each other, and are each independently a substituted or unsubstituted biphenylylene group.

In an exemplary embodiment, $L_1$ is a substituted or unsubstituted phenylene group, and $L_2$ is a substituted or unsubstituted terphenylene group.

In an exemplary embodiment of the present invention, An is a single bond or a substituted or unsubstituted arylene group.

In an exemplary embodiment of the present invention, $Ar_1$ is a single bond; a substituted or unsubstituted phenylene group; a substituted or unsubstituted biphenylylene group; a substituted or unsubstituted terphenylene group; a substituted or unsubstituted quarterphenylene group; a substituted or unsubstituted naphthylene group; a substituted or unsubstituted anthracenylene group; a substituted or unsubstituted phenanthrenylene group; a substituted or unsubstituted triphenylene group; a substituted or unsubstituted pyrenylene group; or a substituted or unsubstituted fluorenylene group.

In an exemplary embodiment, $Ar_1$ is a single bond.

In an exemplary embodiment, $Ar_1$ is a substituted or unsubstituted phenylene group.

In an exemplary embodiment, $Ar_1$ is a substituted or unsubstituted biphenylylene group.

In an exemplary embodiment, $Ar_1$ is a substituted or unsubstituted terphenylene group.

In an exemplary embodiment, $Ar_1$ is a substituted or unsubstituted naphthylene group.

In an exemplary embodiment of the present invention, $Ar_2$ and $Ar_3$ are the same as or different from each other, and are each independently a substituted or unsubstituted aryl group.

In an exemplary embodiment of the present invention, $Ar_2$ and $Ar_3$ are the same as or different from each other, and are each independently a substituted or unsubstituted phenyl group; a substituted or unsubstituted biphenyl group; a substituted or unsubstituted naphthyl group; a substituted or unsubstituted anthracenyl group; a substituted or unsubstituted chrysenyl group; a substituted or unsubstituted phenanthrenyl group; a substituted or unsubstituted triphenylenyl group; a substituted or unsubstituted pyrenyl group; a substituted or unsubstituted tetracenyl group; a substituted or unsubstituted fluorenyl group; a substituted or unsubstituted dibenzofuran group; or a substituted or unsubstituted dibenzothiophene group.

In an exemplary embodiment, $Ar_2$ and $Ar_3$ are the same as or different from each other, and are each independently a substituted or unsubstituted phenyl group.

In an exemplary embodiment, $Ar_2$ is a substituted or unsubstituted phenyl group, and $Ar_3$ is a substituted or unsubstituted biphenyl group.

In an exemplary embodiment, $Ar_2$ and $Ar_3$ are the same as or different from each other, and are each independently a substituted or unsubstituted biphenyl group.

In an exemplary embodiment, $Ar_2$ is a substituted or unsubstituted phenyl group, and $Ar_3$ is a substituted or unsubstituted fluorenyl group.

In an exemplary embodiment, $Ar_2$ and $Ar_3$ are the same as or different from each other, and are each independently a substituted or unsubstituted naphthyl group.

In an exemplary embodiment, $Ar_2$ is a substituted or unsubstituted phenyl group, and $Ar_3$ is a substituted or unsubstituted dibenzofuran group.

In an exemplary embodiment, $Ar_2$ is a substituted or unsubstituted phenyl group, and $Ar_3$ is a substituted or unsubstituted dibenzothiophene group.

In an exemplary embodiment, $Ar_2$ and $Ar_3$ are the same as or different from each other, and are each independently a phenyl group; a biphenyl group; a naphthyl group; a dimethylfluorenyl group; a dipheylfluorenyl group; a dibenzofuran group; or a dibenzothiophene group.

In an exemplary embodiment of the present invention, $Ar_4$ is a substituted or unsubstituted arylene group having 6 to 60 ring members.

More specifically, $Ar_4$ is a substituted or unsubstituted phenylene group; a substituted or unsubstituted biphenylylene group; a substituted or unsubstituted terphenylene group; a substituted or unsubstituted quarterphenylene group; a substituted or unsubstituted naphthylene group; a substituted or unsubstituted anthracenylene group; a substituted or unsubstituted phenanthrenylene group; a substituted or unsubstituted triphenylenylene group; a substituted or unsubstituted pyrenylene group; or a substituted or unsubstituted fluorenylene group.

In an exemplary embodiment, $Ar_4$ is a substituted or unsubstituted phenylene group.

In an exemplary embodiment, $Ar_4$ is a substituted or unsubstituted biphenylylene group.

In an exemplary embodiment, $Ar_4$ is a substituted or unsubstituted naphthylene group.

In an exemplary embodiment of the present invention, $Ar_5$ and $Ar_6$ are the same as or different from each other, and are each independently a substituted or unsubstituted aryl group having 6 to 60 ring members, or $Ar_5$ and $Ar_6$ combine with each other to form a ring.

In an exemplary embodiment of the present invention, $Ar_5$ and $Ar_6$ are the same as or different from each other, and are each independently a substituted or unsubstituted phenyl group; a substituted or unsubstituted biphenyl group; a substituted or unsubstituted naphthyl group; a substituted or unsubstituted anthracenyl group; a substituted or unsubstituted chrysenyl group; a substituted or unsubstituted phenanthrenyl group; a substituted or unsubstituted triphenylenyl group; a substituted or unsubstituted pyrenyl group; a substituted or unsubstituted tetracenyl group; or a substituted or unsubstituted fluorenyl group, or $Ar_5$ and $Ar_6$ combine with each other to form an aromatic hetero ring.

In an exemplary embodiment, $Ar_5$ and $Ar_6$ are the same as or different from each other, and are each independently a substituted or unsubstituted phenyl group.

In an exemplary embodiment, $Ar_5$ is a substituted or unsubstituted phenyl group, and $Ar_6$ is a substituted or unsubstituted biphenyl group.

In an exemplary embodiment, $Ar_5$ and $Ar_6$ are the same as or different from each other, and are each independently a substituted or unsubstituted biphenyl group.

In an exemplary embodiment, $Ar_5$ and $Ar_6$ combine with each other to form a substituted or unsubstituted benzophosphindole (benzo[b]phosphindole,

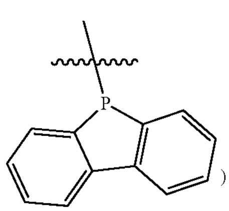 [SMILES: *p1c2ccccc2c2ccccc21]

) ring.

Specifically, a P atom of the benzophosphindole ring may be unsubstituted or substituted with an atom of O, S, or Se. According to an exemplary embodiment of the present specification, R may be any one selected from the following structures, and the following structures may be additionally substituted.

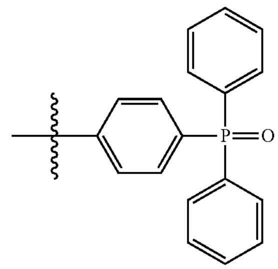

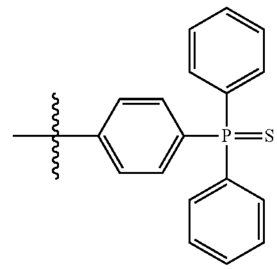

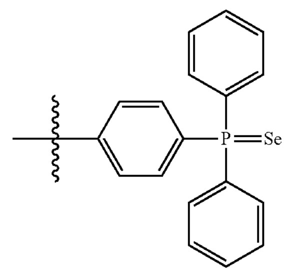

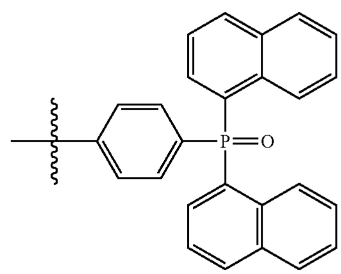

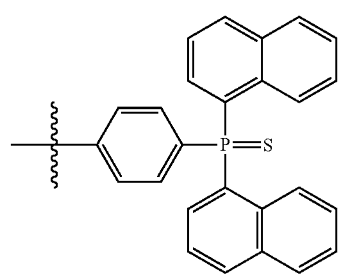

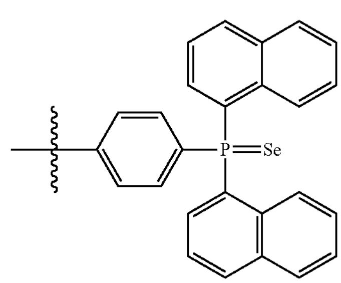

-continued

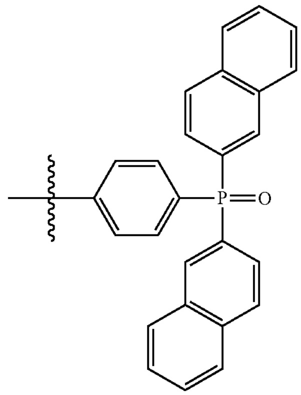

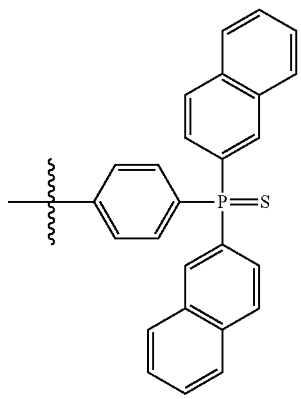

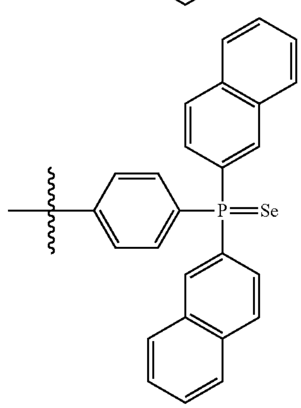

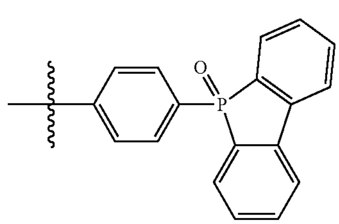

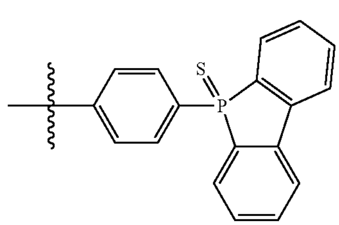

-continued

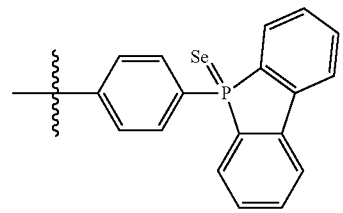

Specifically, the structures may be unsubstituted or substituted with one or more substituents selected from the group consisting of deuterium; a halogen group; a nitrile group; a nitro group; a hydroxy group; a carbonyl group; an ester group; an imide group; an amine group; a phosphineoxide group, an alkoxy group; an aryloxy group; an alkylthioxy group; an arylthioxy group; an alkylsulfoxy group; an arylsulfoxy group; a silyl group; a boron group; an alkyl group; a cycloalkyl group; an alkenyl group; an aryl group; an aralkyl group; an aralkenyl group; an alkylaryl group; an alkylamine group; an aralkylamine group; a heteroarylamine group; an arylamine group; an arylheteroarylamine group; an arylphosphine group; and a heterocyclic group.

In an exemplary embodiment of the present invention, the compound of Chemical Formula 1 is represented by any one of the following Chemical Formulae 3 to 5.

[Chemical Formula 3]

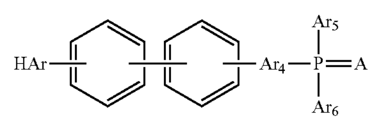

[Chemical Formula 4]

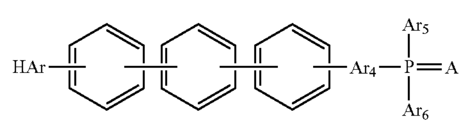

[Chemical Formula 5]

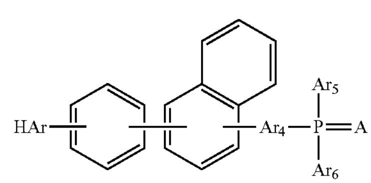

In Chemical Formulae 3 to 5, the definition of HAr is the same as that in Chemical Formula 1, and the definitions of $Ar_4$ to $Ar_6$ and A are the same as those in Chemical Formula 2.

In an exemplary embodiment of the present invention, the compound of Chemical Formula 1 may be any one selected from the following compounds.

Compound 1
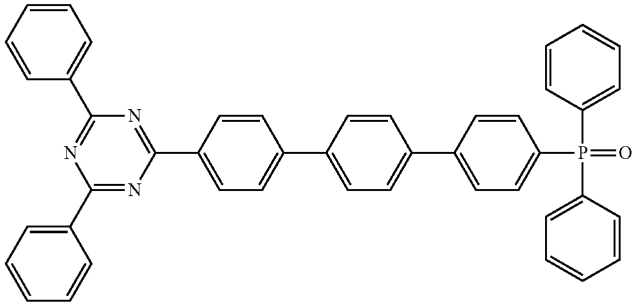
Compound 2
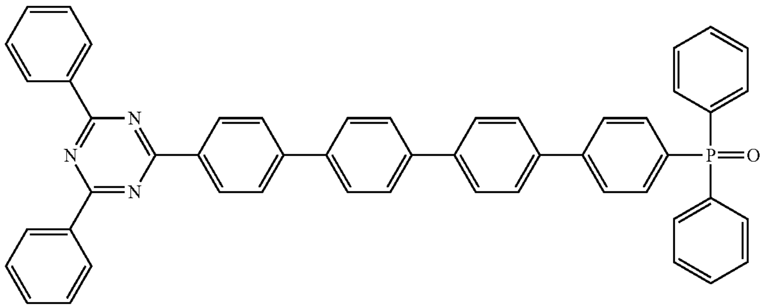
Compound 3
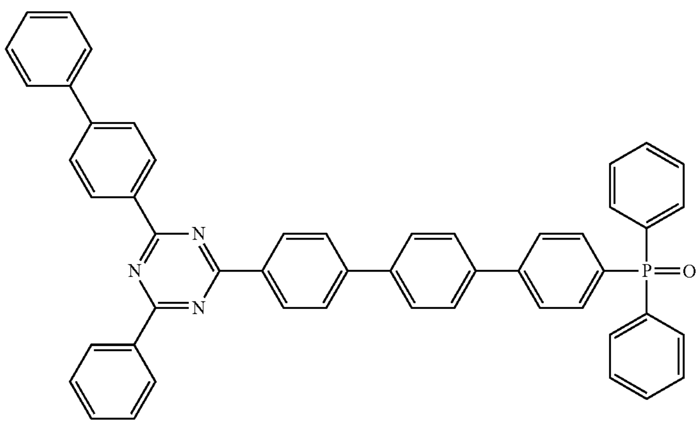
Compound 4
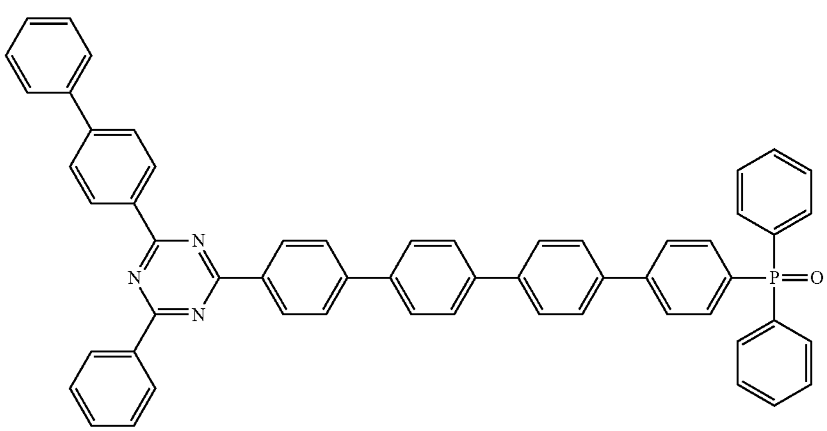

-continued
Compound 5
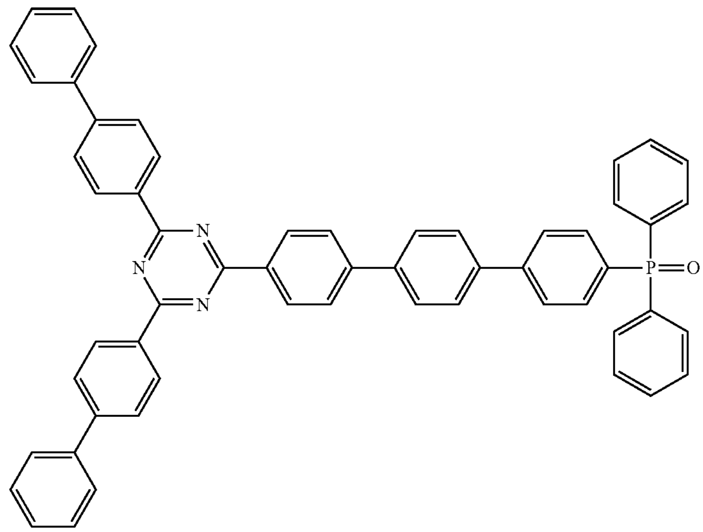
Compound 6
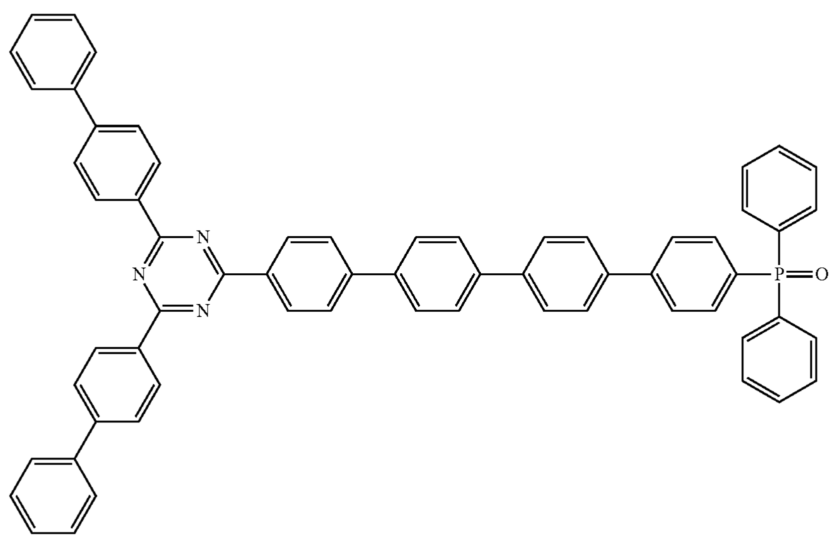
Compound 7
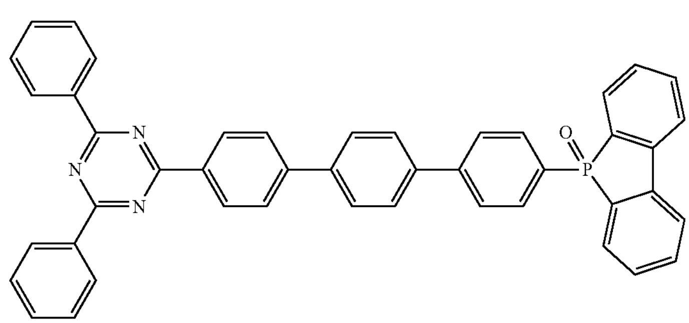

-continued
Compound 8
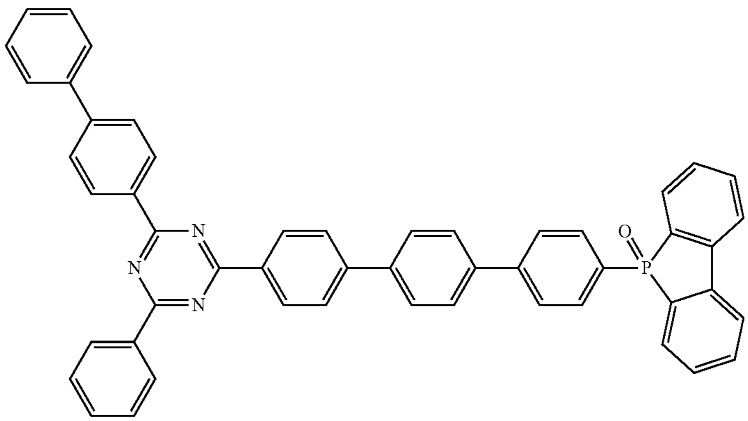
Compound 9
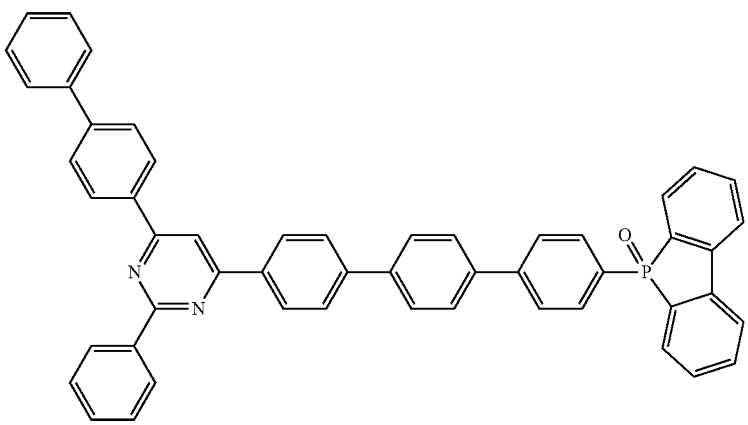
Compound 10
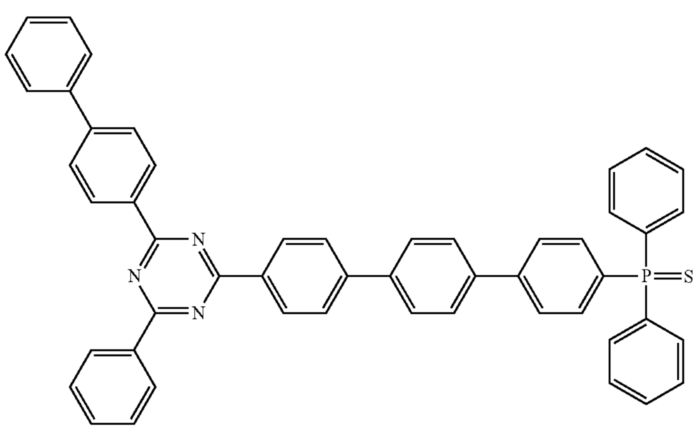

-continued
Compound 11
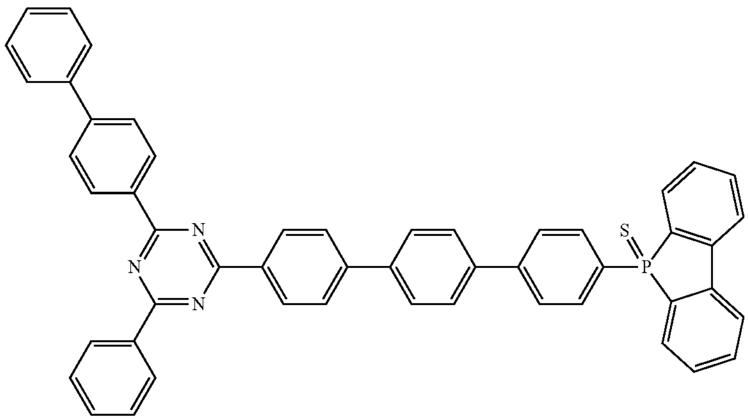
Compound 12
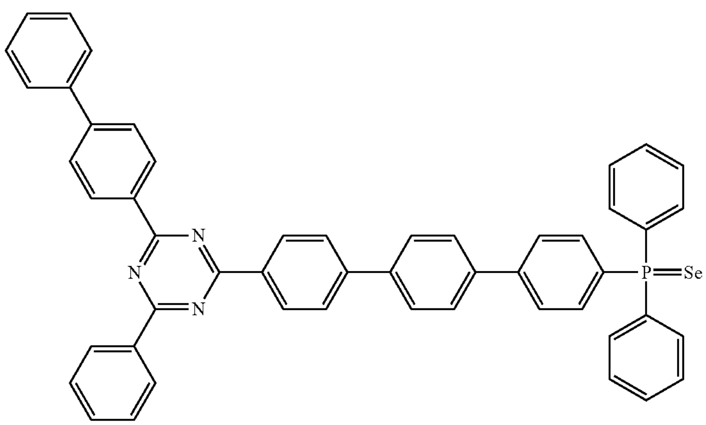
Compound 13
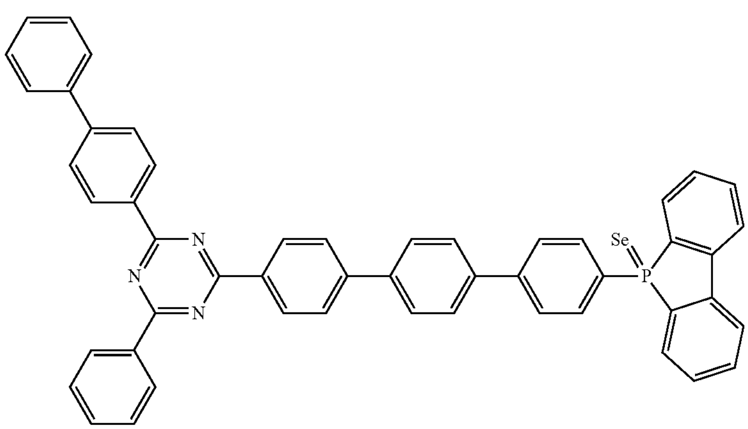

-continued
Compound 14
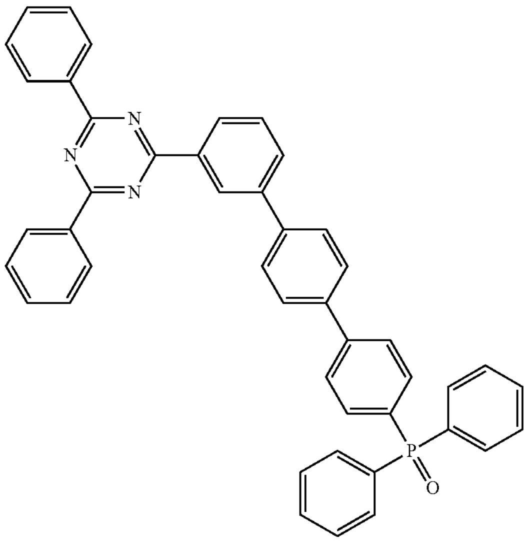
Compound 15
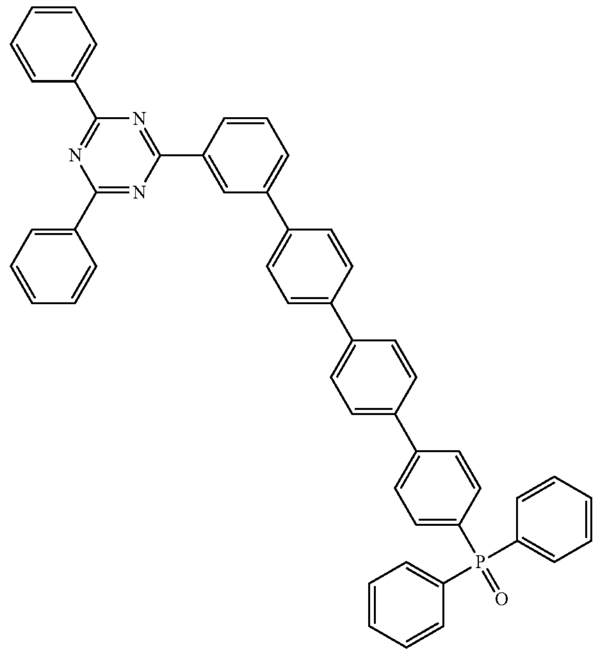
Compound 16
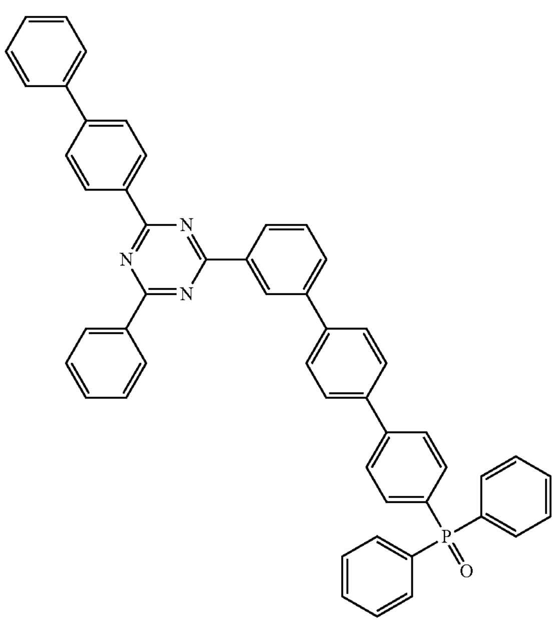
Compound 17
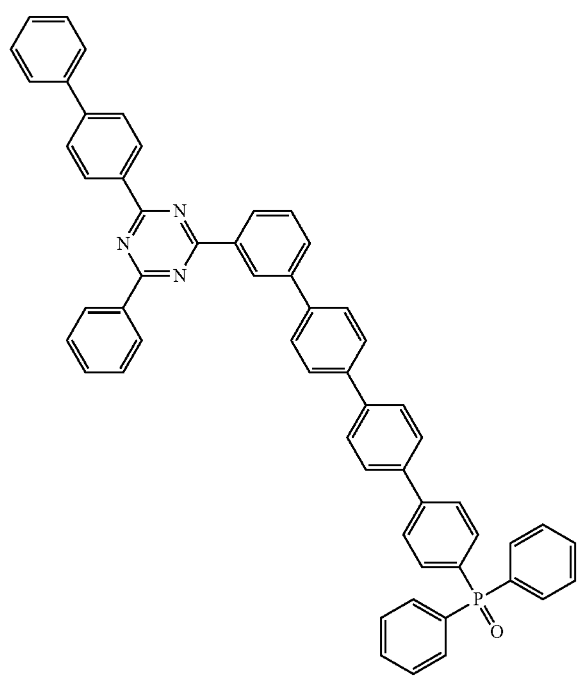

-continued
Compound 18
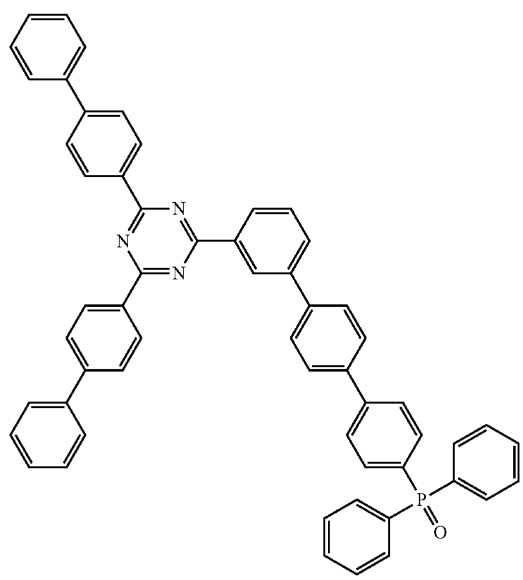
Compound 19
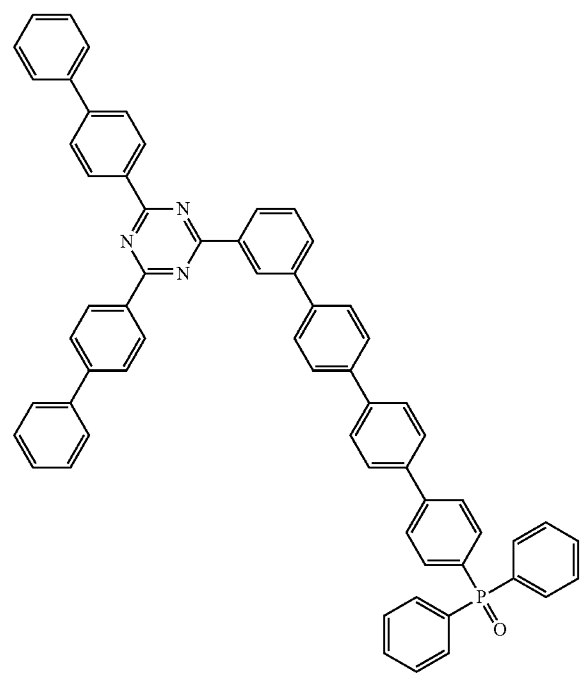
Compound 20
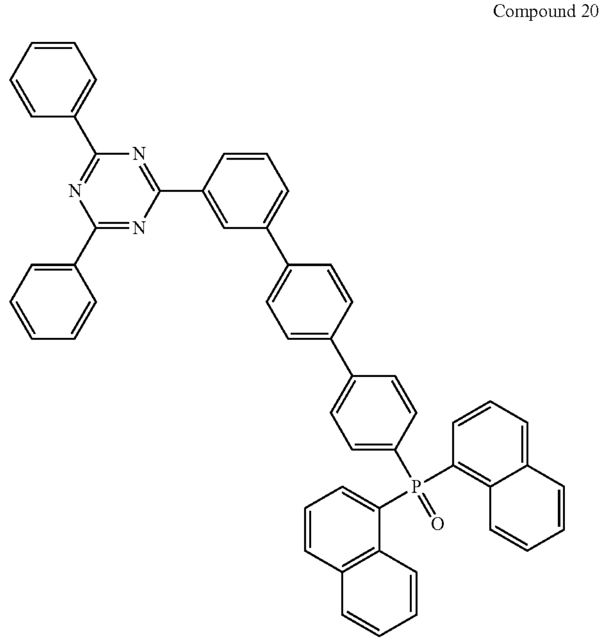
Compound 21
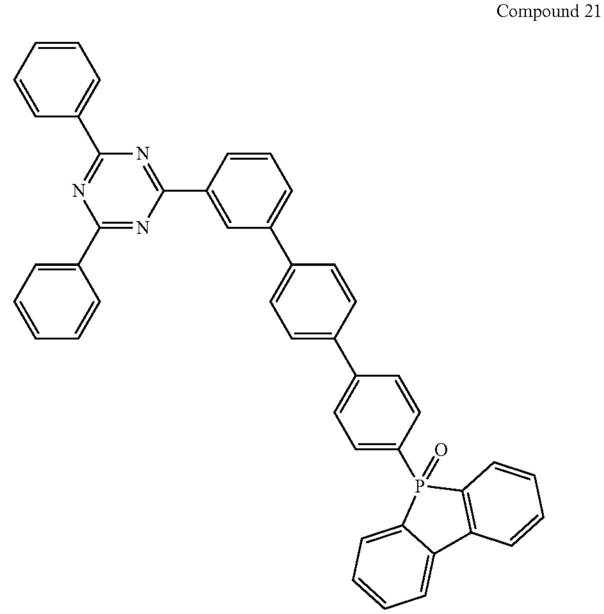

-continued
Compound 22
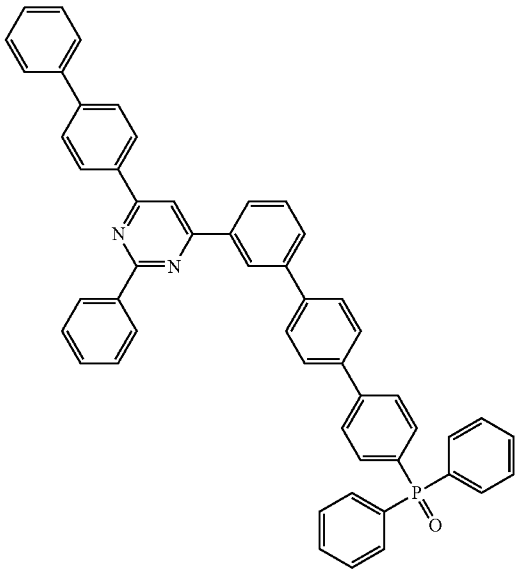
Compound 23
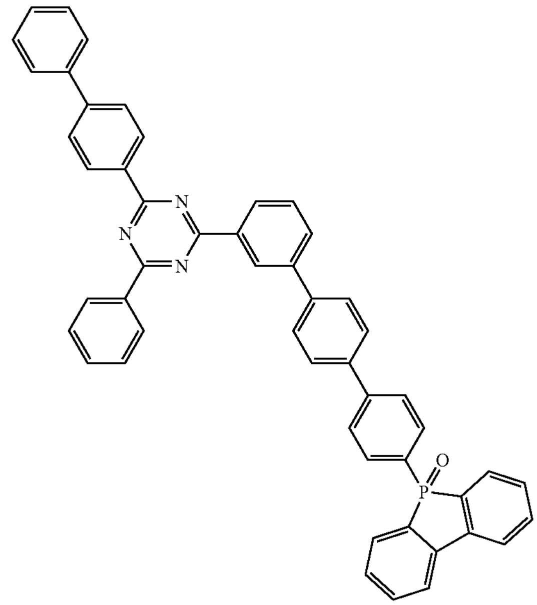
Compound 24
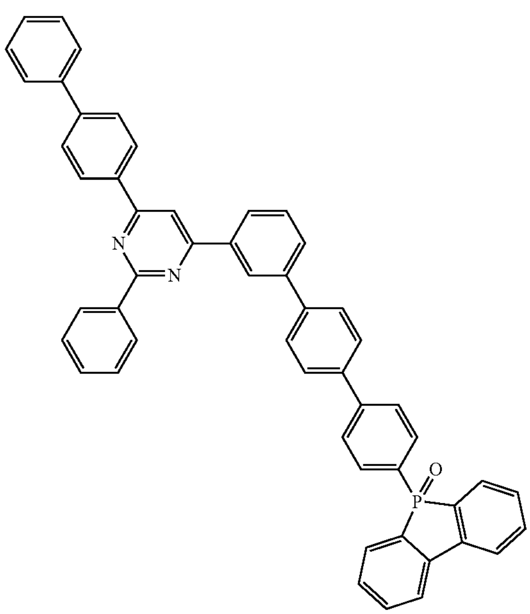
Compound 25
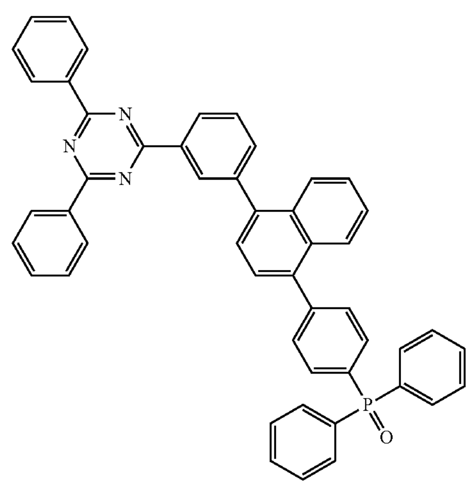

-continued
Compound 26
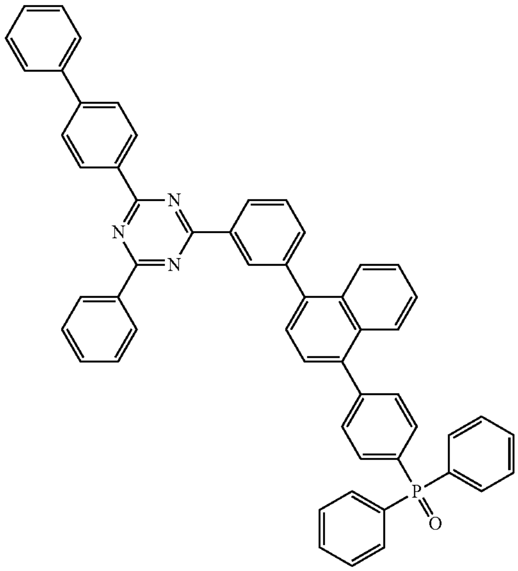
Compound 27
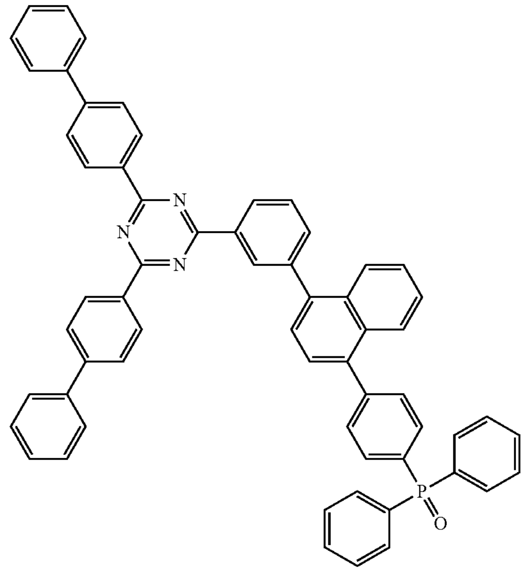
Compound 28
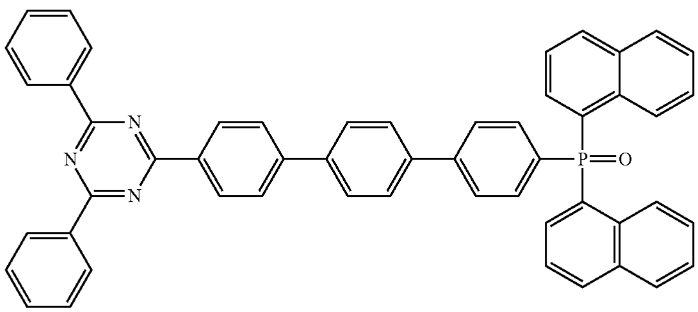
Compound 29
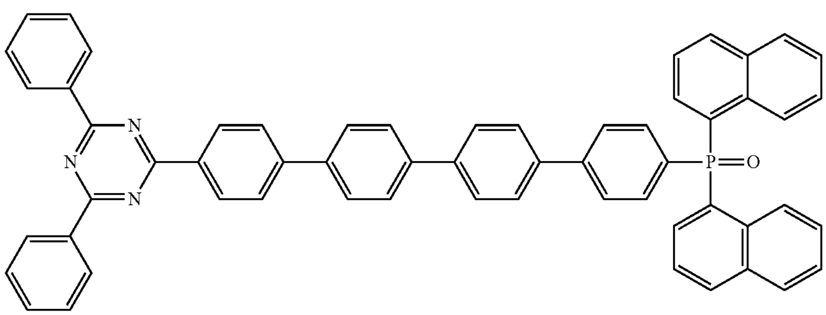
Compound 30
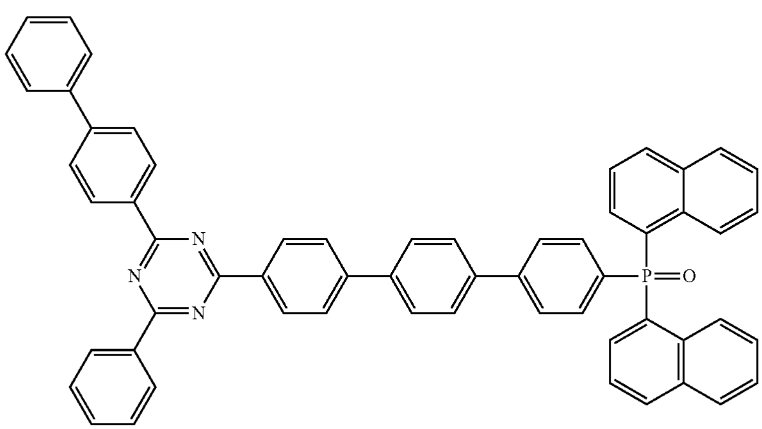

-continued
Compound 31
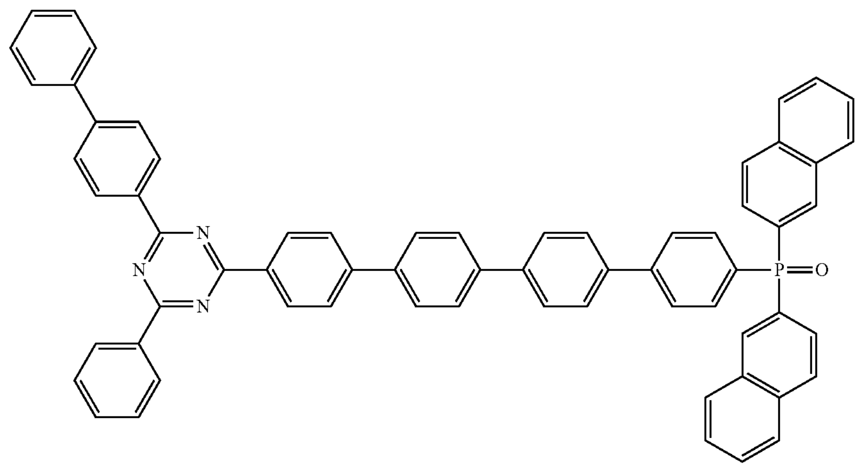
Compound 32
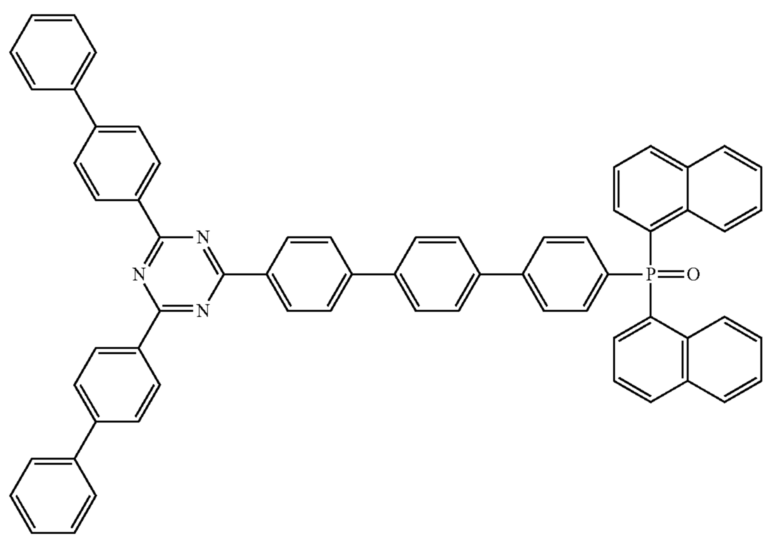
Compound 33
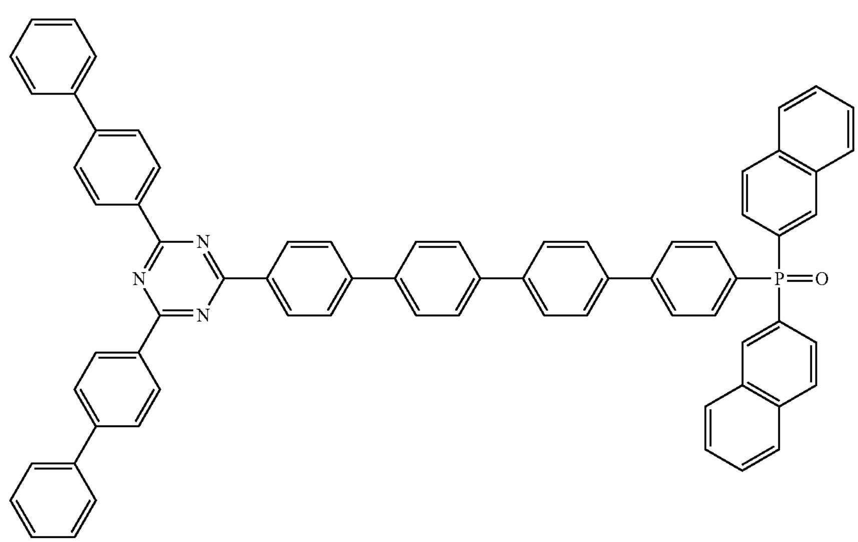

-continued
Compound 34
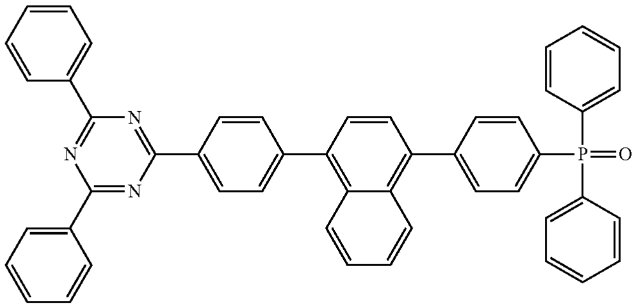
Compound 35
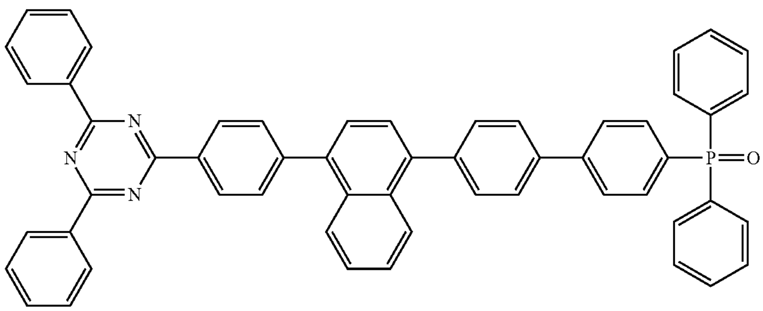
Compound 36
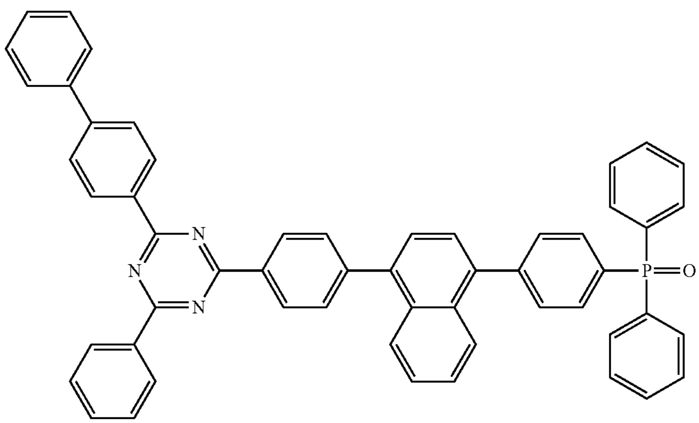
Compound 37
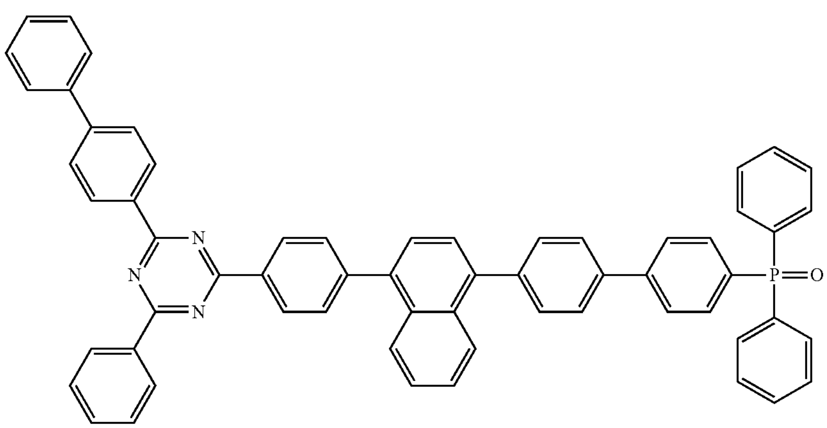

-continued
Compound 38
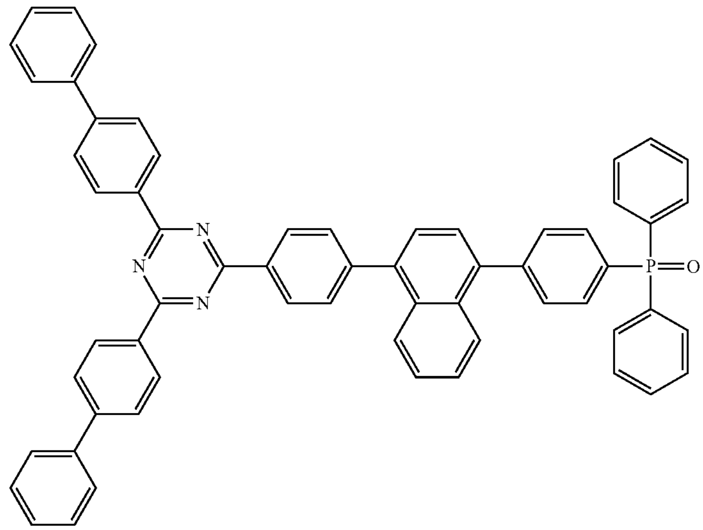
Compound 39
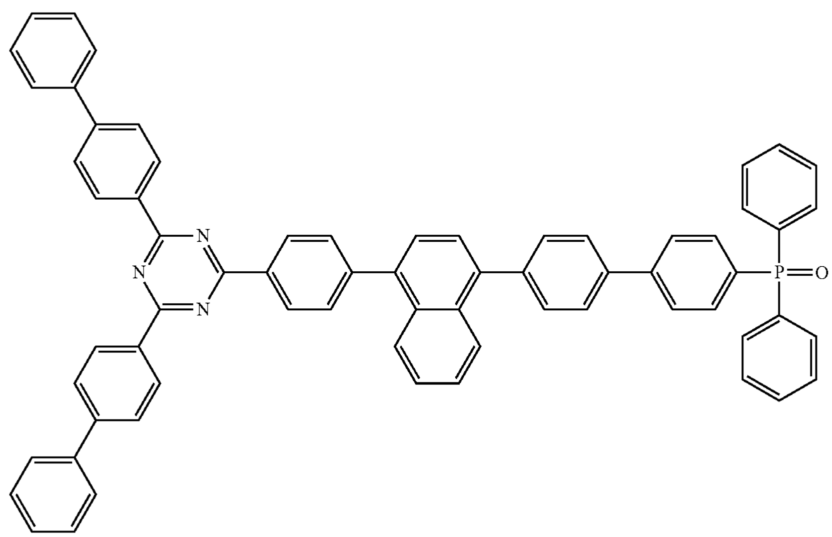
Compound 40
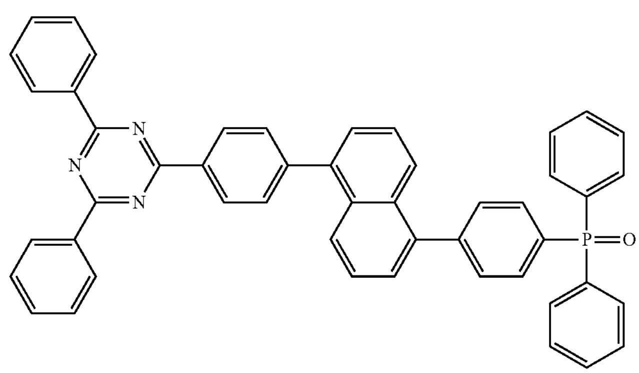

-continued
Compound 41
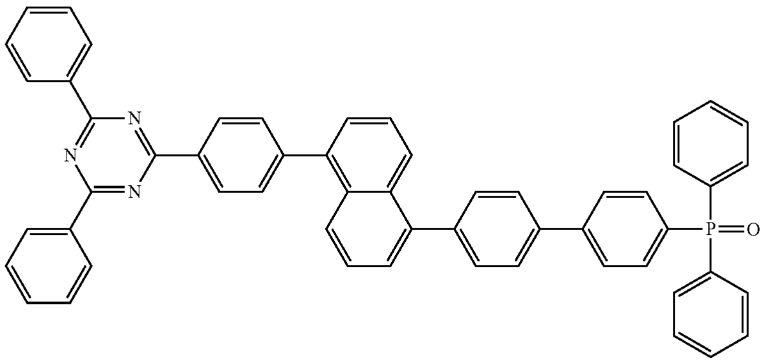
Compound 42
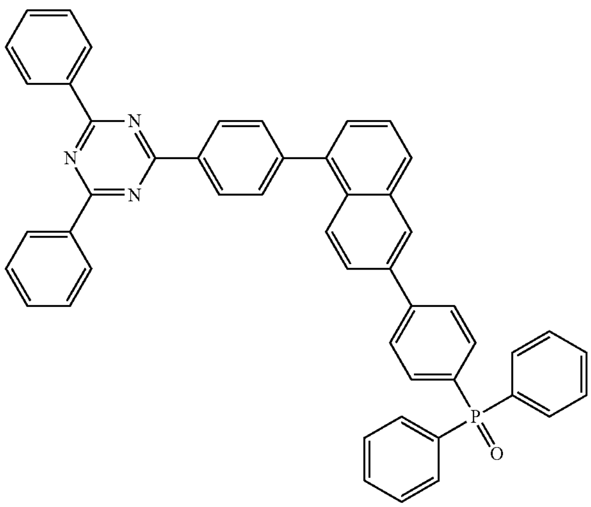
Compound 43
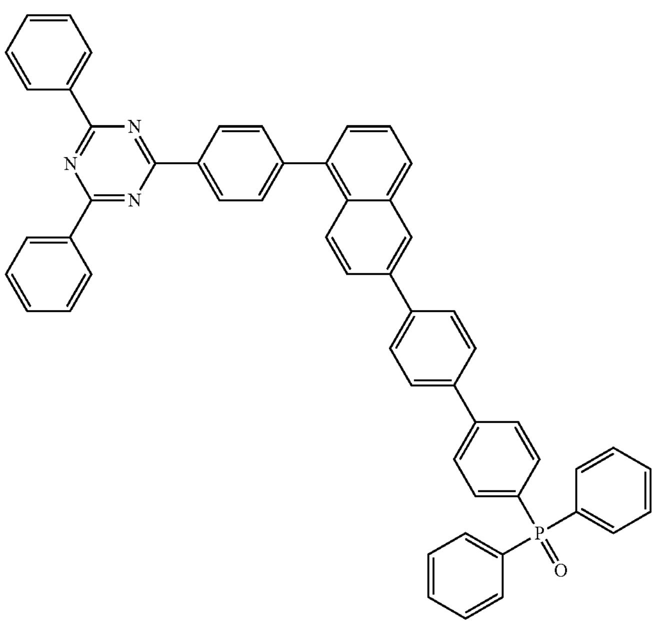

-continued
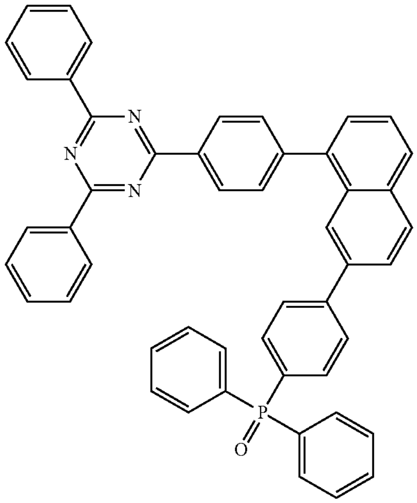
Compound 44
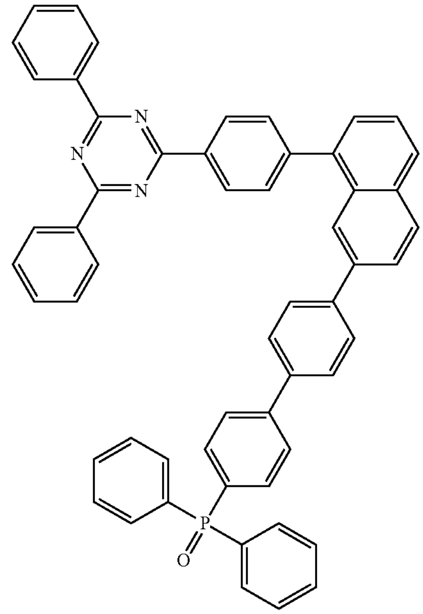
Compound 45
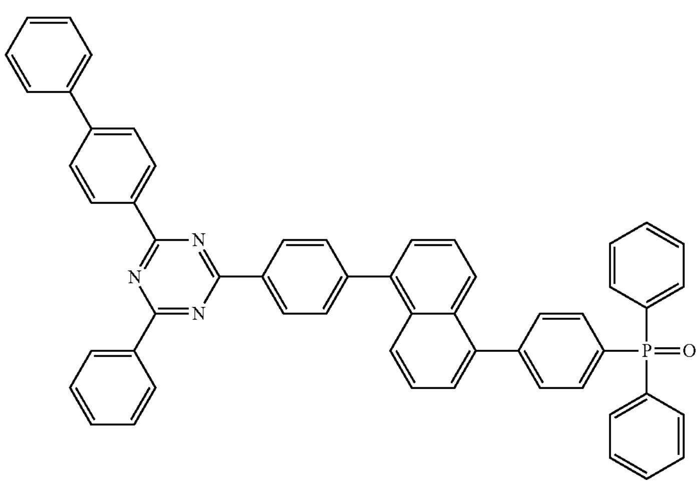
Compound 46

-continued
Compound 47
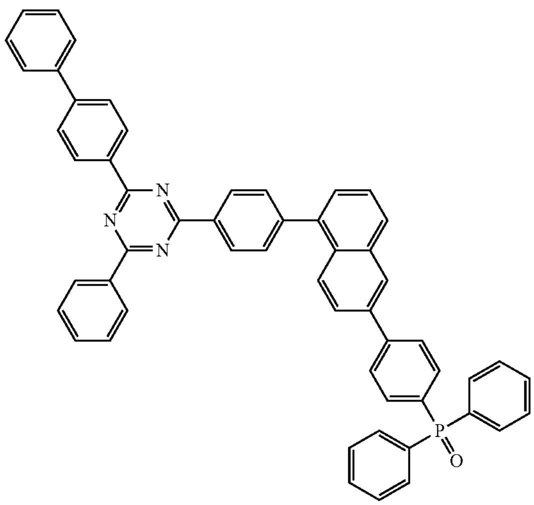
Compound 48
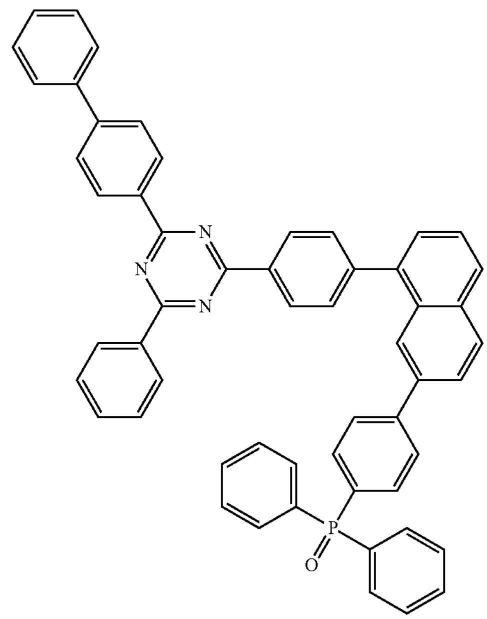
Compound 49
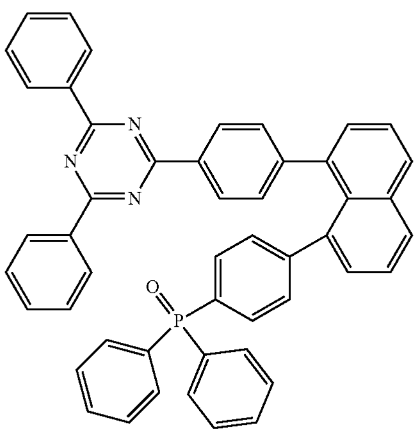
Compound 50
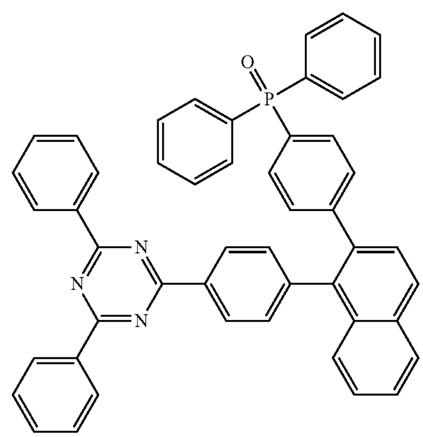
Compound 51
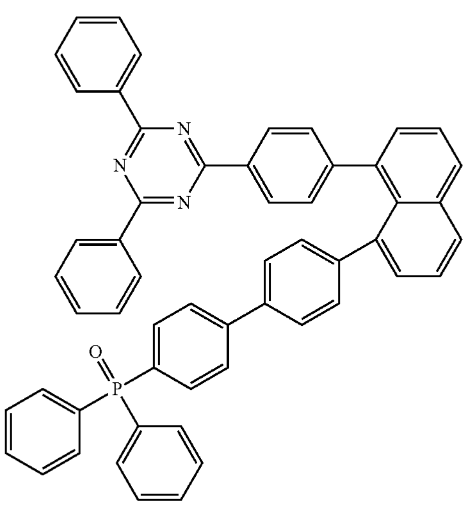
Compound 52
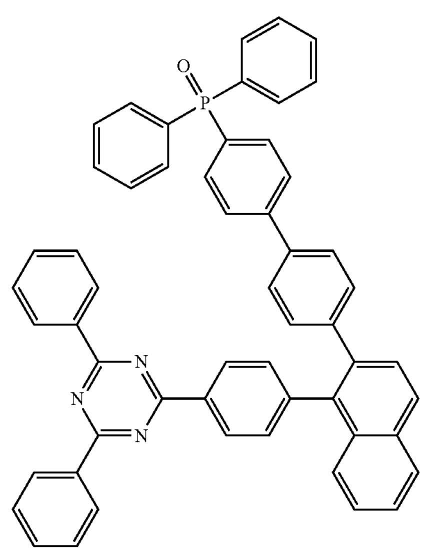

-continued
Compound 53
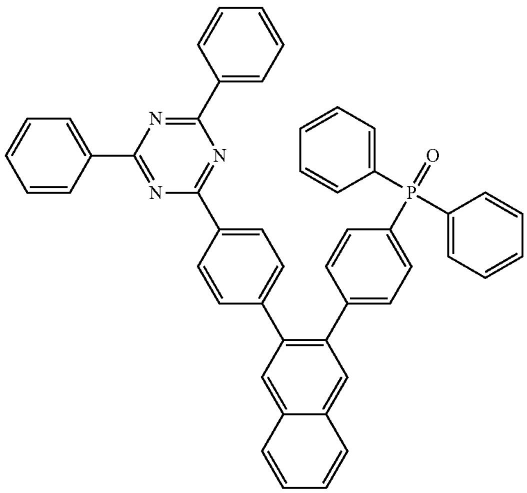
Compound 54
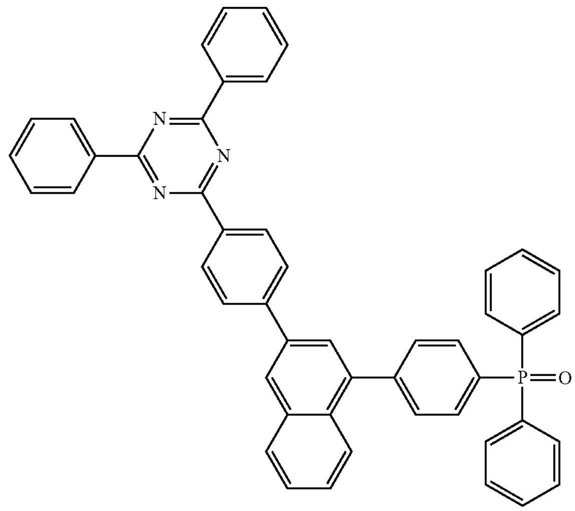
Compound 55
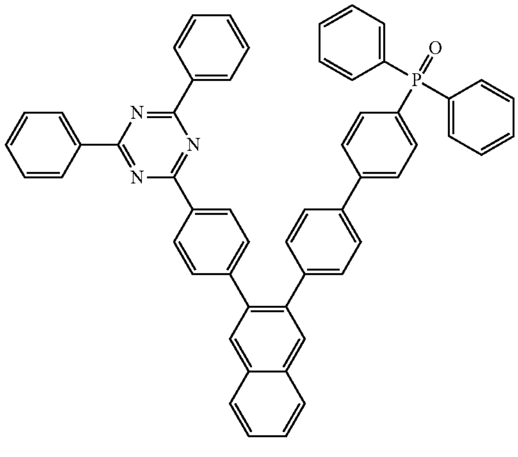
Compound 56
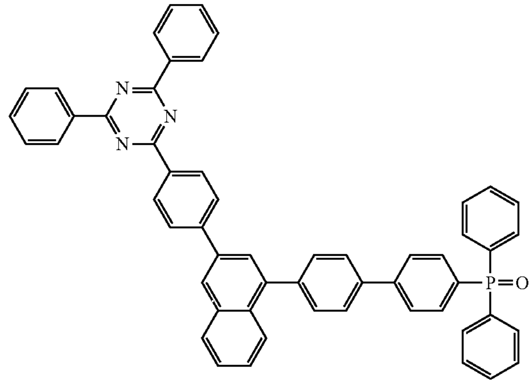

-continued
Compound 57
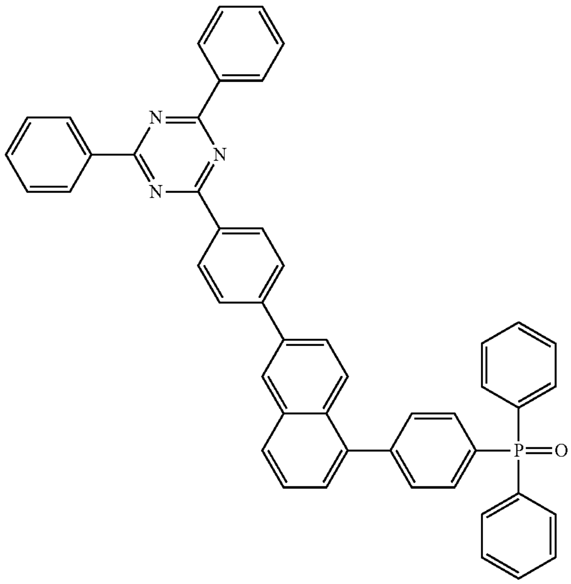
Compound 58
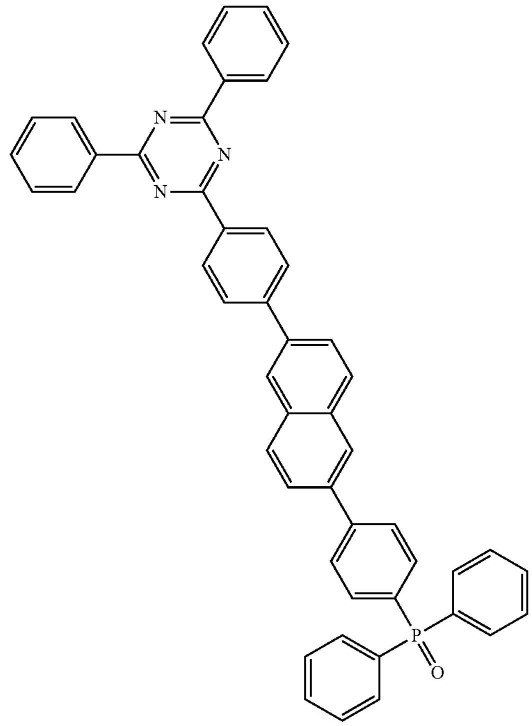
Compound 59
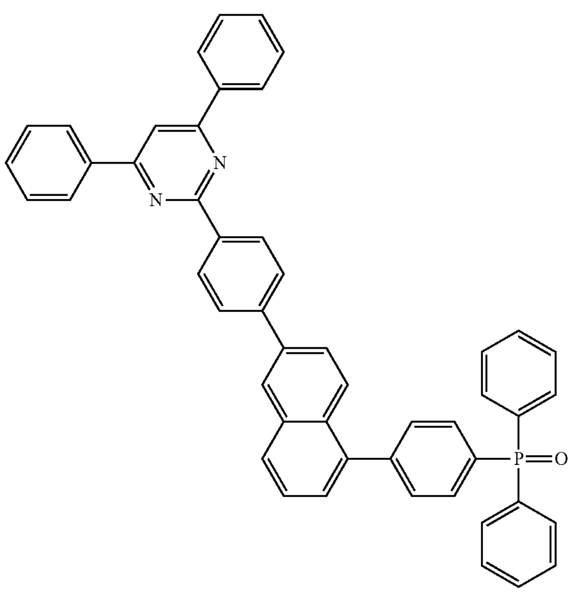
Compound 60
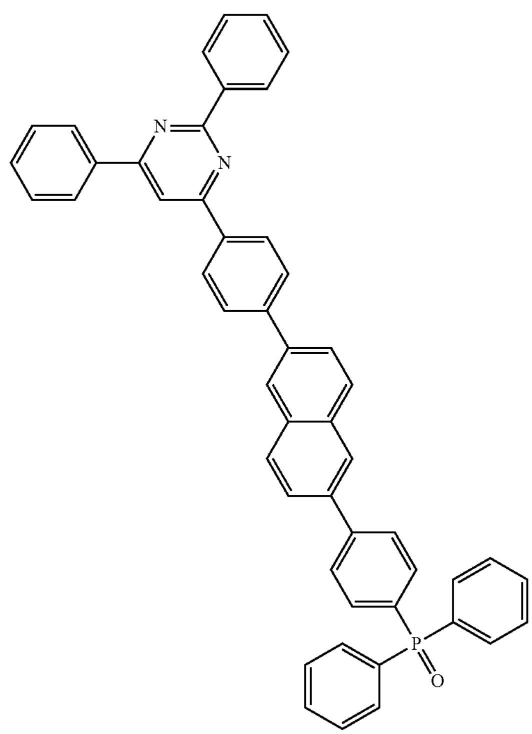

-continued
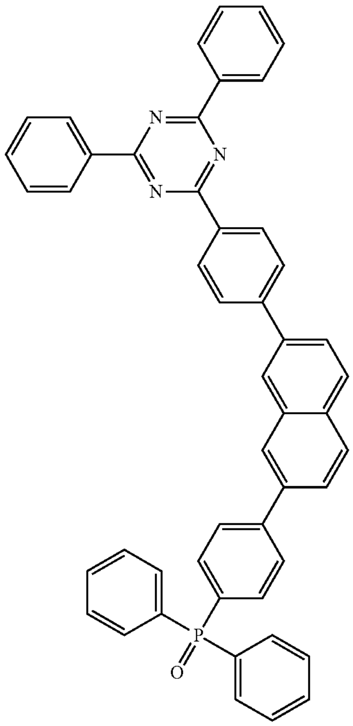
Compound 61
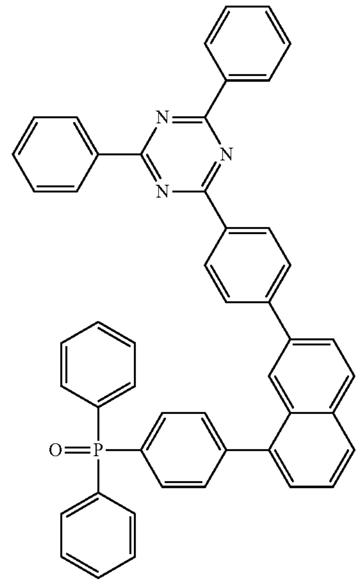
Compound 62
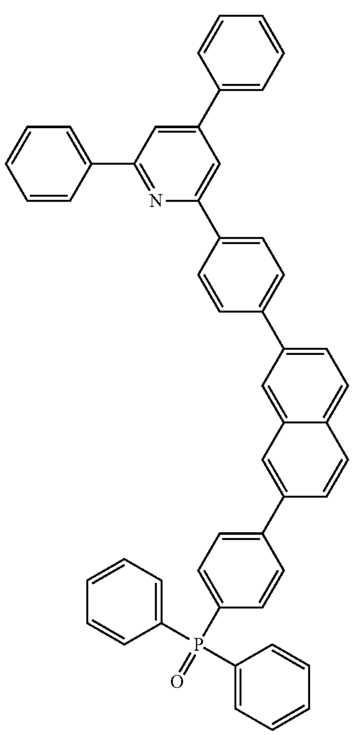
Compound 63
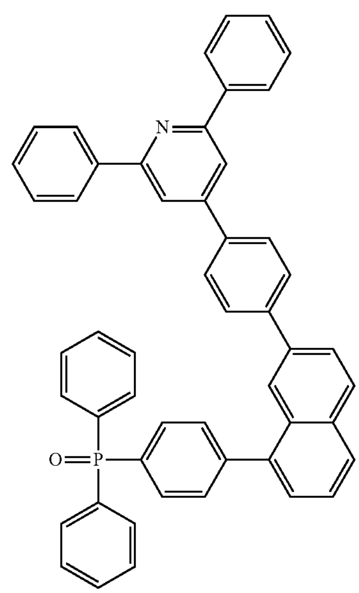
Compound 64

-continued
Compound 65
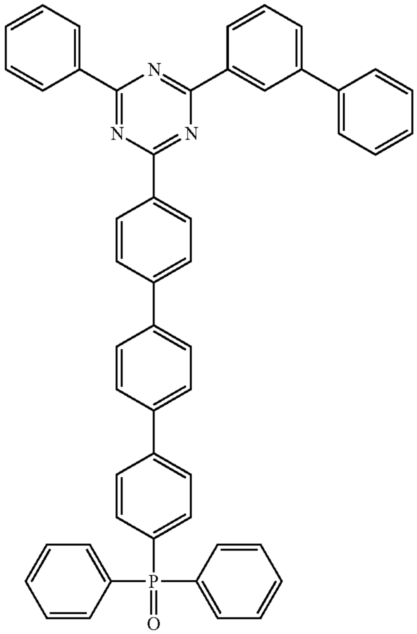
Compound 66
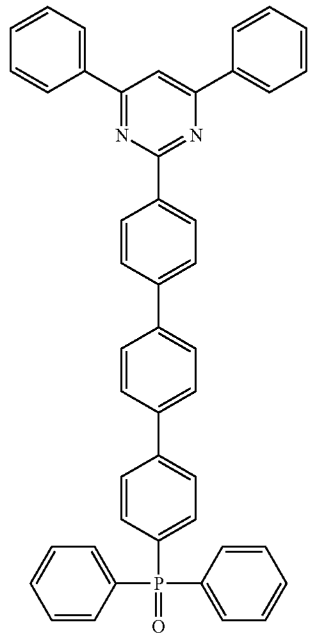
Compound 67
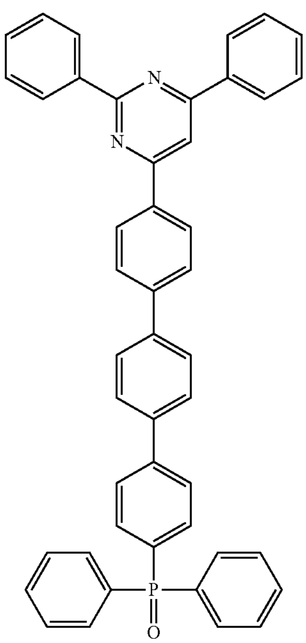
Compound 68
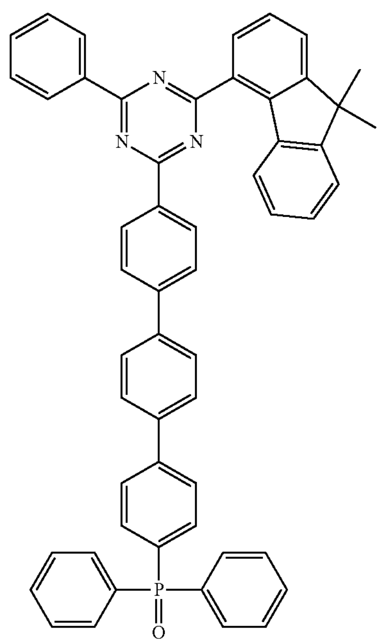

-continued
Compound 69
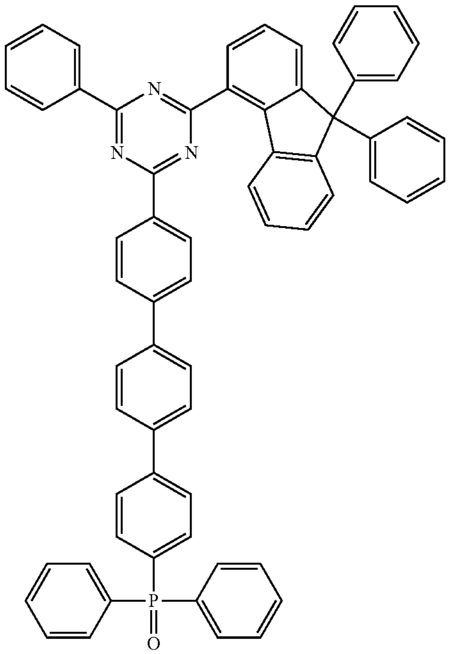
Compound 70
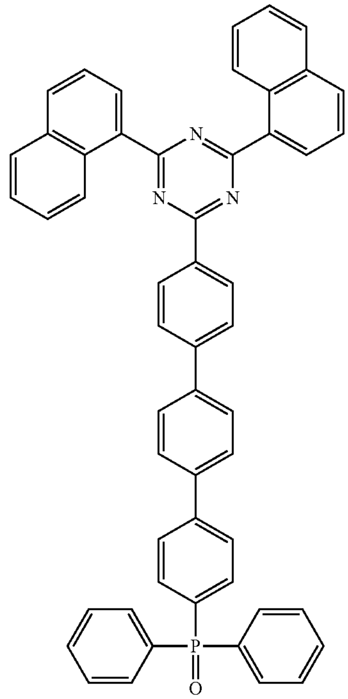
Compound 71
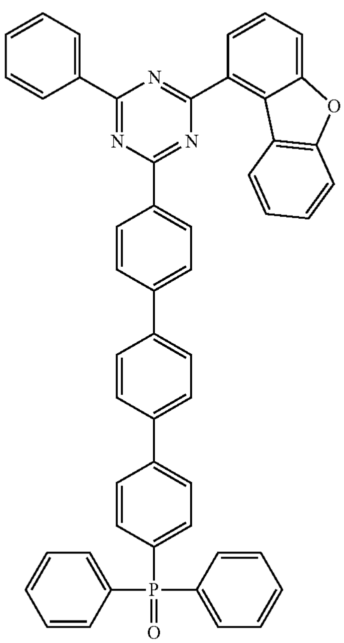
Compound 72
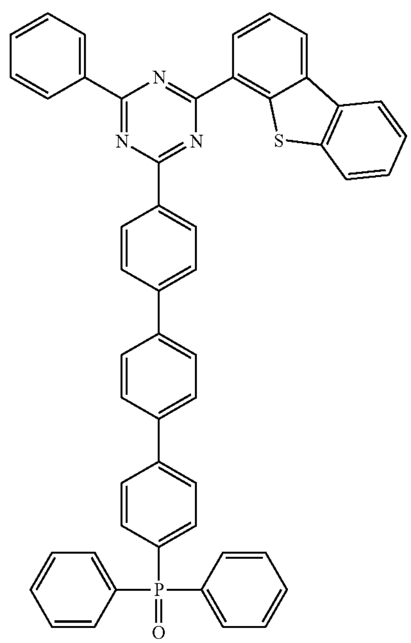

-continued

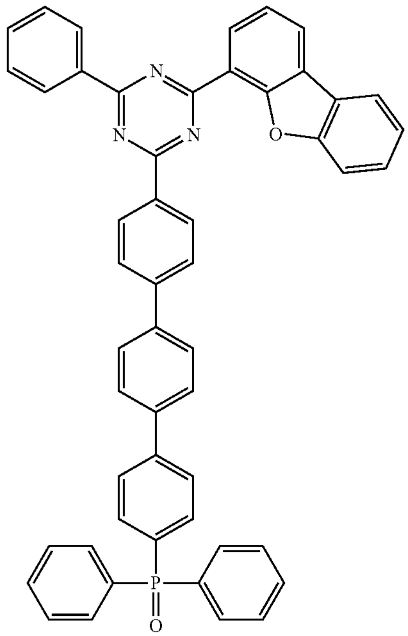

Compound 73

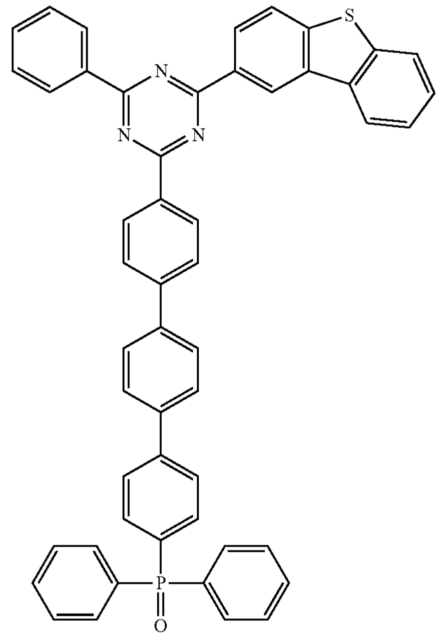

Compound 74

The conjugation length and energy bandgap of the compound are closely related with each other. Specifically, the longer the conjugation length of the compound is, the smaller the bandgap is.

In the present invention, various substituents may be introduced into the core structure as described above to synthesize compounds having various energy bandgaps. A substituent is usually introduced into a core structure having a large energy bandgap to easily adjust the energy bandgap, but when the core structure has a small energy bandgap, it is difficult to significantly adjust the energy bandgap by introducing a substituent.

Further, in the present invention, various substituents may also be introduced into the core structure to adjust the HOMO and LUMO energy levels of the compound.

In addition, various substituents may be introduced into the core structure having the structure as described above to synthesize a compound having inherent characteristics of the introduced substituent. For example, a substituent usually used for a hole injection layer material, a hole transport layer material, a light emitting layer material, and an electron transport layer material, which are used for manufacturing an organic light emitting device, may be introduced into the core structure to synthesize a material which satisfies conditions required for each organic material layer.

Furthermore, an organic light emitting device according to the present invention is an organic light emitting device including a first electrode, a second electrode, and one or more organic material layers disposed between the first electrode and the second electrode, in which one or more layers of the organic material layers include the compound.

The organic light emitting device of the present invention may be manufactured by typical preparation methods and materials of an organic light emitting device, except that the above-described compound is used to form one or more organic material layers.

The compound may be formed as an organic material layer by not only a vacuum deposition method, but also a solution application method when an organic light emitting device is manufactured. Here, the solution application method means spin coating, dip coating, inkjet printing, screen printing, a spray method, roll coating, and the like, but is not limited thereto.

The organic material layer of the organic light emitting device of the present invention may also be composed of a single-layered structure, but may be composed of a multi-layered structure in which two or more organic material layers are stacked. For example, the organic light emitting device of the present invention may have a structure including a hole injection layer, a hole transport layer, a light emitting layer, an electron transport layer, an electron injection layer, and the like as organic material layers. However, the structure of the organic light emitting device is not limited thereto, and may include a fewer number of organic material layers.

Accordingly, in the organic light emitting device of the present invention, the organic material layer may include one or more layers of a hole injection layer, an hole transport layer, and a layer which injects and transports holes simultaneously, and one or more layers of the layers may include the compound represented by Chemical Formula 1.

In another exemplary embodiment, the organic material layer includes a light emitting layer, and the light emitting layer includes the compound represented by Chemical Formula 1. As an example, the compound represented by Chemical Formula 1 may be included as a phosphorescent host material of the light emitting layer.

As another example, the organic material layer including the compound represented by Chemical Formula 1 may include the compound represented by Chemical Formula 1 as a host, and may include another organic compound, a metal or a metal compound as a dopant.

As still another example, the organic material layer including the compound represented by Chemical Formula 1 may include the compound represented by Chemical Formula 1 as a host, and may use an iridium (Ir)-based dopant together.

Further, the organic material layer may include one or more layers of an electron transport layer, an electron injection layer, and a layer which transports and injects electrons simultaneously, and one or more layers of the layers may include the compound.

In another exemplary embodiment, the organic material layer of the organic light emitting device includes a hole transport layer, and the hole transport layer includes the compound represented by Chemical Formula 1.

In an exemplary embodiment of the present application, the organic material layer includes a light emitting layer, and the light emitting layer includes a compound of the following Chemical Formula A-1.

[Chemical Formula A-1]

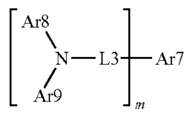

In Chemical Formula A-1, m is an integer of 1 or more,

Ar7 is a substituted or unsubstituted monovalent or more aryl group; or a substituted or unsubstituted monovalent or more heterocyclic group, L3 is a direct bond; a substituted or unsubstituted arylene group; or a substituted or unsubstituted heteroarylene group, Ar8 and Ar9 are the same as or different from each other, and are each independently a substituted or unsubstituted aryl group; a substituted or unsubstituted silyl group; a substituted or unsubstituted alkyl group; a substituted or unsubstituted arylalkyl group; or a substituted or unsubstituted heterocyclic group, or may combine with each other to form a substituted or unsubstituted ring, and when m is 2 or more, two or more structures in the parenthesis are the same as or different from each other.

According to an exemplary embodiment of the present specification, the organic material layer includes a light emitting layer, and the light emitting layer includes the compound represented by Chemical Formula A-1 as a dopant of the light emitting layer.

According to an exemplary embodiment of the present specification, L3 is a direct bond.

According to an exemplary embodiment of the present specification, m is 2.

According to an exemplary embodiment of the present specification, Ar7 is a substituted or unsubstituted monovalent or more benzofluorene group; a substituted or unsubstituted monovalent or more fluoranthene group; a substituted or unsubstituted monovalent or more pyrene group; or a substituted or unsubstituted monovalent or more chrysene group.

In an exemplary embodiment of the present specification, Ar7 is a divalent pyrene group which is unsubstituted or substituted with deuterium, a methyl group, an ethyl group, an isopropyl group, or a tert-butyl group; or a divalent chrysene group which is unsubstituted or substituted with deuterium, a methyl group, an ethyl group, or a tert-butyl group.

In an exemplary embodiment of the present specification, Ar7 is a divalent pyrene group which is unsubstituted or substituted with an alkyl group; or a divalent chrysene group which is unsubstituted or substituted with an alkyl group.

In an exemplary embodiment of the present specification, Ar7 is a divalent pyrene group which is unsubstituted or substituted with an alkyl group.

In an exemplary embodiment of the present specification, Ar7 is a divalent pyrene group.

According to an exemplary embodiment of the present specification, Ar8 and Ar9 are the same as or different from each other, and are each independently a substituted or unsubstituted aryl group having 6 to 30 carbon atoms.

According to an exemplary embodiment of the present specification, Ar8 and Ar9 are the same as or different from each other, and are each independently an aryl group which is unsubstituted or substituted with an alkyl group, a nitrile group, or a silyl group substituted with an alkyl group.

According to an exemplary embodiment of the present specification, Ar8 and Ar9 are the same as or different from each other, and are each independently an aryl group which is unsubstituted or substituted with a methyl group, an ethyl group, an isopropyl group, a tert-butyl group, a nitrile group, or a silyl group substituted with an alkyl group.

According to an exemplary embodiment of the present specification, Ar8 and Ar9 are the same as or different from each other, and are each independently an aryl group which is unsubstituted or substituted with silyl group substituted with an alkyl group.

According to an exemplary embodiment of the present specification, Ar8 and Ar9 are the same as or different from each other, and are each independently an aryl group which is unsubstituted or substituted with a trimethylsilyl group.

According to an exemplary embodiment of the present specification, Ar8 and Ar9 are the same as or different from each other, and are each independently a substituted or unsubstituted phenyl group; a substituted or unsubstituted biphenyl group; or a substituted or unsubstituted terphenyl group.

According to an exemplary embodiment of the present specification, Ar8 and Ar9 are the same as or different from each other, and are each independently a phenyl group which is unsubstituted or substituted with a methyl group, an ethyl group, an isopropyl group, a tert-butyl group, a nitrile group, or a trimethylsilyl group.

According to an exemplary embodiment of the present specification, Ar8 and Ar9 are the same as or different from each other, and are each independently a phenyl group which is unsubstituted or substituted with a trimethylsilyl group.

According to an exemplary embodiment of the present specification, Ar8 and Ar9 are the same as or different from each other, and are each independently a substituted or unsubstituted heteroaryl group having 2 to 30 carbon atoms.

According to an exemplary embodiment of the present specification, Ar8 and Ar9 are the same as or different from each other, and are each independently a heteroaryl group which is unsubstituted or substituted with a methyl group, an ethyl group, a tert-butyl group, a nitrile group, a silyl group substituted with an alkyl group, or a phenyl group.

According to an exemplary embodiment of the present specification, Ar8 and Ar9 are the same as or different from each other, and are each independently a dibenzofuran group which is unsubstituted or substituted with a methyl group, an ethyl group, a tert-butyl group, a nitrile group, a trimethylsilyl group, or a phenyl group.

According to an exemplary embodiment of the present specification, Chemical Formula A-1 is selected among the following compounds.

-continued
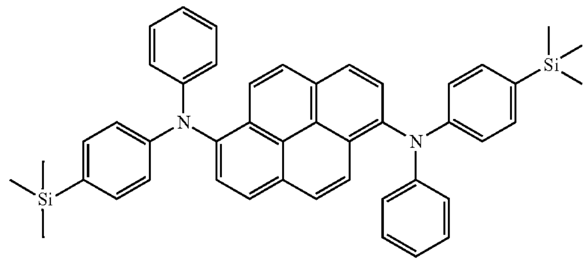
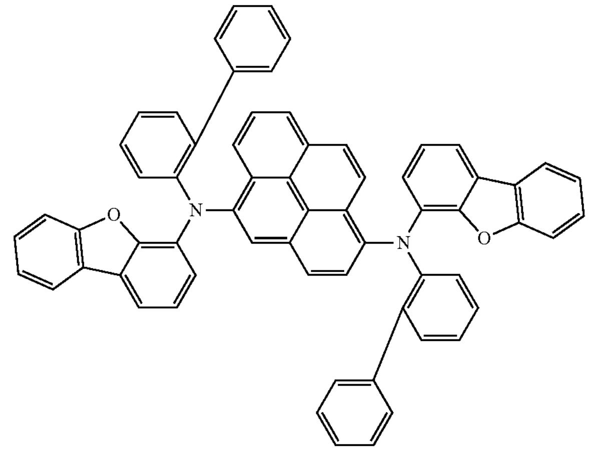
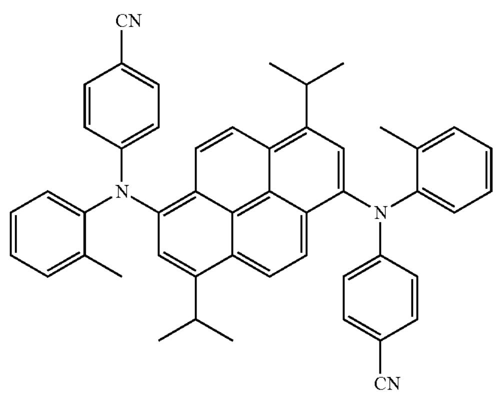
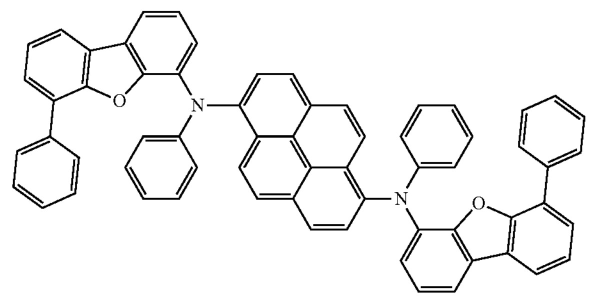
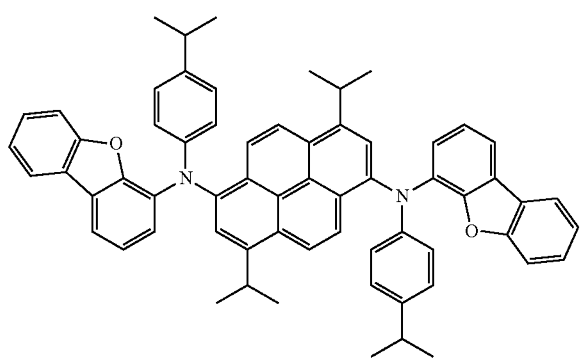
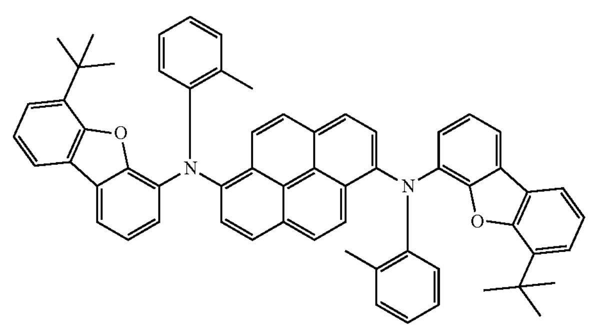
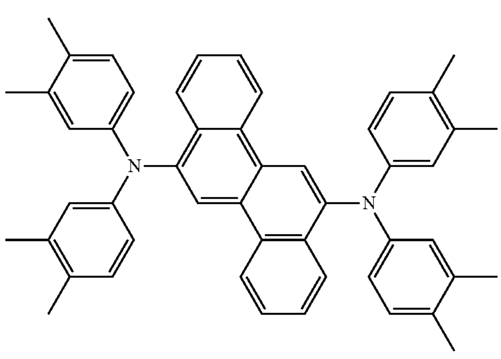
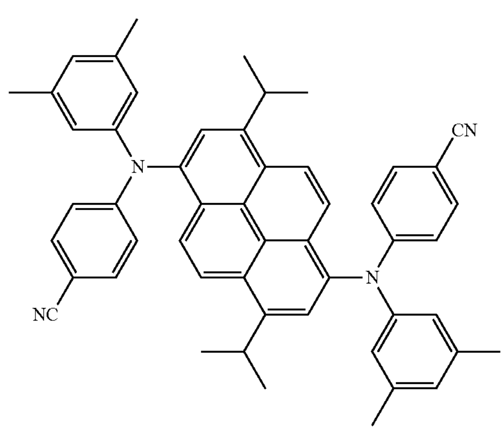

-continued

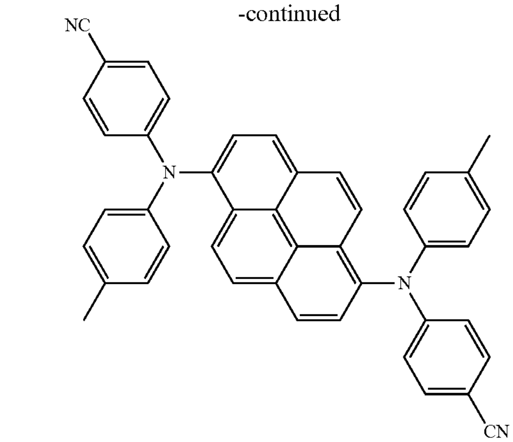

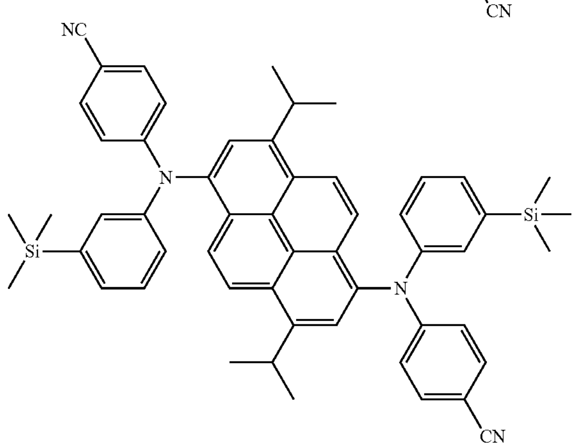

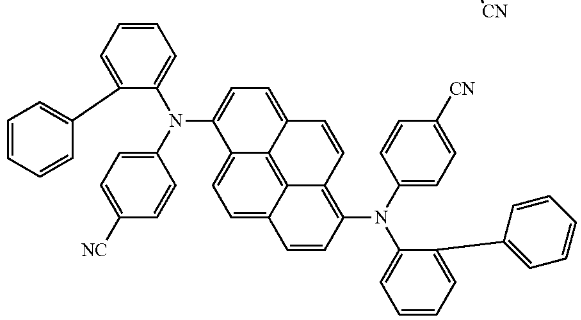

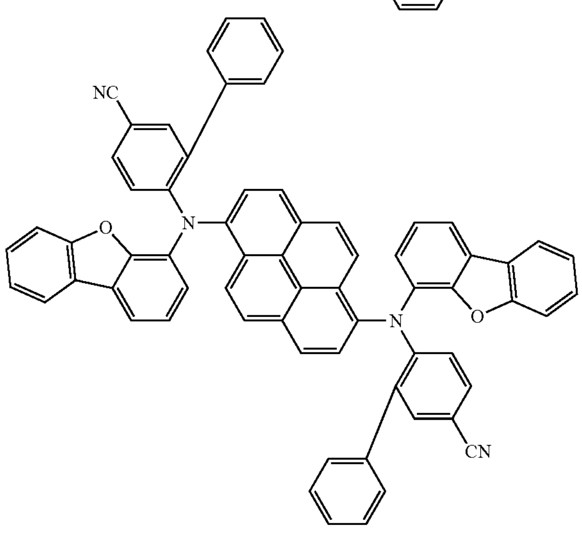

According to an exemplary embodiment of the present specification, the organic material layer includes a light emitting layer, and the light emitting layer includes a compound represented by the following Chemical Formula A-2.

[Chemical Formula A-2]

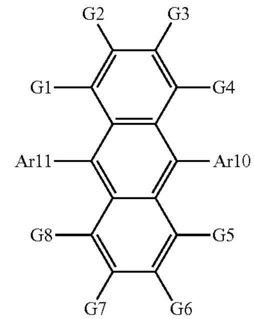

In Chemical Formula A-2,

Ar10 and Ar11 are the same as or different from each other, and are each independently a substituted or unsubstituted monocyclic aryl group; or a substituted or unsubstituted polycyclic aryl group, and G1 to G8 are the same as or different from each other, and are each independently hydrogen; a substituted or unsubstituted monocyclic aryl group; or a substituted or unsubstituted polycyclic aryl group.

According to an exemplary embodiment of the present specification, the organic material layer includes a light emitting layer, and the light emitting layer includes the compound represented by Chemical Formula A-2 as a host of the light emitting layer.

According to an exemplary embodiment of the present specification, Ar10 and Ar11 are the same as or different from each other, and are each independently a substituted or unsubstituted polycyclic aryl group.

According to an exemplary embodiment of the present specification, Ar10 and Ar11 are the same as or different from each other, and are each independently a substituted or unsubstituted polycyclic aryl group having 10 to 30 carbon atoms.

According to an exemplary embodiment of the present specification, Ar10 and Ar11 are the same as or different from each other, and are each independently a substituted or unsubstituted naphthyl group.

According to an exemplary embodiment of the present specification, Ar10 and Ar11 are the same as or different from each other, and are each independently a substituted or unsubstituted 1-naphthyl group.

According to an exemplary embodiment of the present specification, Ar10 and Ar11 are a 1-naphthyl group. According to an exemplary embodiment of the present specification, G1 to G8 are hydrogen.

According to an exemplary embodiment of the present specification, Chemical Formula A-2 is selected from the following compound.

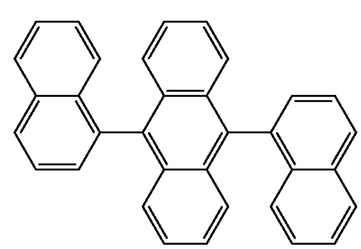 [SMILES: c1ccc2c(-c3c4ccccc4c(-c4cccc5ccccc45)c4ccccc34)cccc2c1]

According to an exemplary embodiment of the present specification, the organic material layer includes a light emitting layer, and the light emitting layer includes the compound represented by Chemical Formula A-1 as a dopant of the light emitting layer, and includes the compound represented by Chemical Formula A-2 as a host of the light emitting layer.

In an exemplary embodiment of the present specification, the organic light emitting device is an organic light emitting device including: a first electrode; a second electrode; a light emitting layer provided between the first electrode and the second electrode; and two or more organic material layers provided between the light emitting layer and the first electrode, or between the light emitting layer and the second electrode, in which at least one of the two or more organic material layers includes the compound represented by Chemical Formula 1. In one exemplary embodiment, as the two or more organic material layers, two or more may be selected from the group consisting of an electron transport layer, an electron injection layer, a layer which transports and injects electrons simultaneously, and a hole blocking layer.

In an exemplary embodiment of the present specification, the organic material layer includes two or more electron transport layers, and at least one of the two or more electron transport layers includes the compound represented by Chemical Formula 1. Specifically, in an exemplary embodiment of the present specification, the compound may also be included in one layer of the two or more electron transport layers, and may be included in each of the two or more electron transport layers.

In addition, in an exemplary embodiment of the present specification, when the compound represented by Chemical Formula 1 is included in each of the two or more electron transport layers, the other materials except for the compound represented by Chemical Formula 1 may be the same as or different from each other.

In the organic material layer having the multi-layered structure, the compound may be included in a light emitting layer, a layer which injects holes/transports holes and emits light simultaneously, a layer which transports holes and emits light simultaneously, or a layer which transports electrons and emits light simultaneously, and the like.

For example, the structure of the organic light emitting device of the present invention may have a structure as illustrated in FIGS. 1 and 2, but is not limited thereto.

FIG. 1 illustrates the structure of an organic light emitting device in which a positive electrode 2, a light emitting layer 3, and a negative electrode 4 are sequentially stacked on a substrate 1. In the structure as described above, the compound may be included in the light emitting layer 3.

FIG. 2 illustrates the structure of an organic light emitting device in which a positive electrode 2, a hole injection layer 5, a hole transport layer 6, a light emitting layer 3, an electron transport layer 7, and a negative electrode 4 are sequentially stacked on a substrate 1. In the structure as described above, the compound may be included in the hole injection layer 5, the hole transport layer 6, the light emitting layer 3, or the electron transport layer 7.

For example, the organic light emitting device according to the present invention may be manufactured by depositing a metal or a metal oxide having conductivity, or an alloy thereof on a substrate to form a positive electrode, forming an organic material layer including a hole injection layer, a hole transport layer, a light emitting layer, and an electron transport layer thereon, and then depositing a material, which may be used as a negative electrode, thereon, by using a physical vapor deposition (PVD) method such as sputtering or e-beam evaporation. In addition to the method as described above, an organic light emitting device may also be made by sequentially depositing a negative electrode material, an organic material layer, and a positive electrode material on a substrate.

The organic material layer may have a multi-layered structure including a hole injection layer, a hole transport layer, a light emitting layer, and an electron transport layer, and the like, but is not limited thereto and may be a single-layered structure. Further, the organic material layer may be manufactured with a fewer number of layers by a method such as a solvent process, for example, spin coating, dip coating, doctor blading, a screen printing, inkjet printing, or a thermal transfer method using various polymers, instead of a deposition method.

As the positive electrode material, a material having a large work function is usually preferred so as to smoothly inject holes into an organic material layer. Specific examples of the positive electrode material which may be used in the present invention include: a metal, such as vanadium, chromium, copper, zinc, and gold, or alloys thereof; a metal oxide, such as zinc oxide, indium oxide, indium tin oxide (ITO), and indium zinc oxide (IZO); a combination of metal and oxide, such as ZnO:Al or $SnO_2$:Sb; an electrically conductive polymer, such as poly(3-methyl compound), poly[3,4-(ethylene-1,2-dioxy)compound] (PEDOT), polypyrrole, and polyaniline, and the like, but are not limited thereto.

As the negative electrode material, a material having a small work function is usually preferred so as to smoothly inject electrons into an organic material layer. Specific examples of the negative electrode material include: a metal, such as magnesium, calcium, sodium, potassium, titanium, indium, yttrium, lithium, gadolinium, aluminum, silver, tin, and lead, or alloys thereof; a multi-layered structural material, such as LiF/Al or $LiO_2$/Al, and the like, but are not limited thereto.

The hole injection material is a material which may well receive holes injected from the positive electrode at low voltage, and it is preferred that the highest occupied molecular orbital (HOMO) of the hole injection material is between the work function of the positive electrode material and the HOMO of the peripheral organic material layer. Specific examples of the hole injection material include metal porphyrin, oligothiophene, an arylamine-based organic material, a hexanitrile hexaazatriphenylene-based organic material, a quinacridone-based organic material, a perylene-based organic material, anthraquinone, a polyaniline and polycompound-based electrically conductive polymer, and the like, but are not limited thereto.

The hole transport material is a material which may receive holes transported from a positive electrode or a hole injection layer and transfer the holes to a light emitting layer, and is suitably a material having a large mobility for holes. Specific examples thereof include an arylamine-based organic material, an electrically conductive polymer, a block copolymer in which a conjugate portion and a non-conjugate portion are present together, and the like, but are not limited thereto.

The light emitting material is a material which may receive holes and electrons from a hole transport layer and an electron transport layer, respectively, and combine the holes and the electrons to emit light in a visible ray region, and is preferably a material having good quantum efficiency to fluorescence or phosphorescence. Specific examples thereof include: an 8-hydroxy-quinoline aluminum complex ($Alq_3$); a carbazole-based compound; a dimerized styryl compound; BAlq; a 10-hydroxybenzoquinoline-metal compound; a benzoxazole, benzthiazole and benzimidazole-based compound; a poly(p-phenylenevinylene) (PPV)-based polymer; a spiro compound; polyfluorene, lubrene, and the like, but are not limited thereto.

The organic material layer including the compound represented by Chemical Formula 1 may include the compound represented by Chemical Formula 1 as a host, and may use an iridium (Ir)-based dopant together.

The iridium-based complex used as a dopant is as follows.

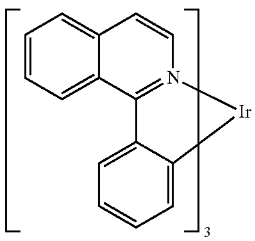

[Ir(piq)3]

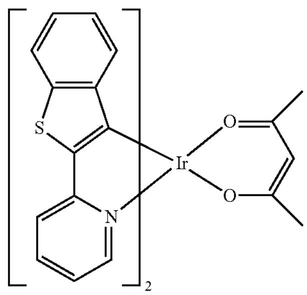

[Btp2Ir(acac)]

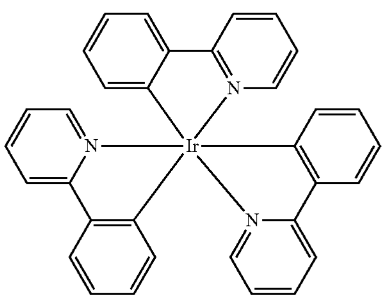

[Ir(ppy)3]

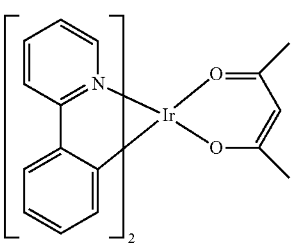

[Ir(ppy)2(acac)]

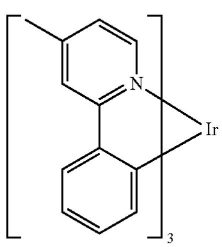

[Ir(mpyp)3]

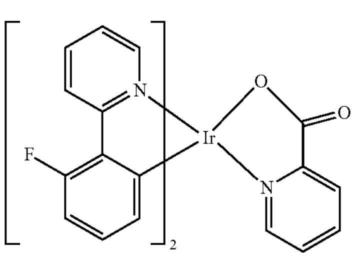

[F2Irpic]

-continued

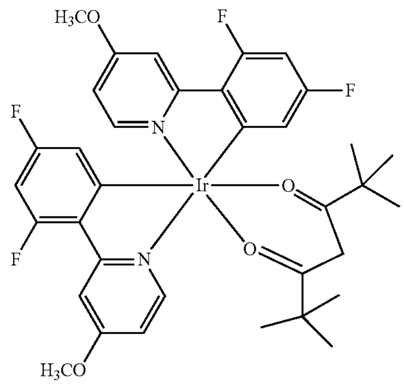

[(F2ppy)2Ir(tmd)]

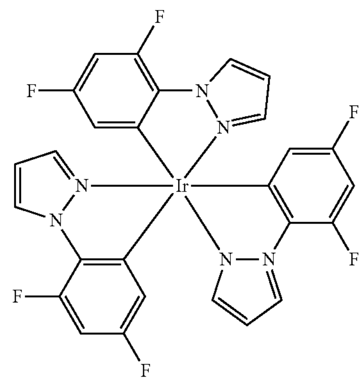

[Ir(dfppz)3]

The electron transport material is a material which may well receive electrons injected from a negative electrode and transfer the electrons to a light emitting layer, and is suitably a material having a large mobility for electrons. Specific examples thereof include: an Al complex of 8-hydroxyquinoline; a complex including $Alq_3$; an organic radical compound; a hydroxyflavone-metal complex, and the like, but are not limited thereto.

The organic light emitting device according to the present invention may be a top emission type, a bottom emission type, or a dual emission type according to the material to be used.

The compound according to the present invention may be operated by a principle which is similar to the principle applied to an organic light emitting device, even in an organic electronic device including an organic solar cell, an organic photoconductor, an organic transistor, and the like.

MODE FOR INVENTION

Hereinafter, the present specification will be described in detail with reference to Examples in order to specifically explain the present specification. However, the Examples according to the present specification may be modified in various forms, and it is not interpreted that the scope of the present specification is limited to the Examples described below in detail. The Examples of the present specification are provided to more completely explain the present specification to a person with ordinary skill in the art.

PREPARATION EXAMPLES

<Synthesis Example 1> Preparation of Compound Represented by Compound 1

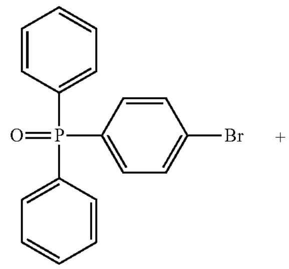

[Chemical Formula 1A]

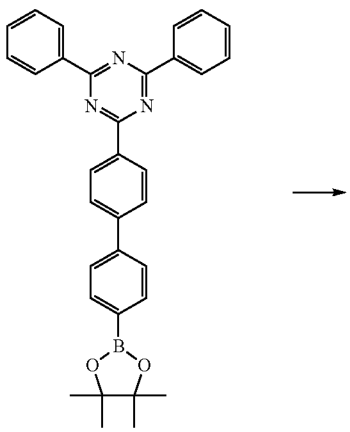

[Chemical Formula 1B]

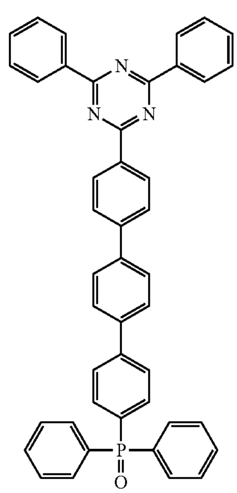

[Compound 1]

(1) Preparation of Compound 1

Chemical Formula 1A (10 g, 28 mmol), triazine boronic acid Chemical Formula 1B (14.3 g, 28 mmol), and potassium carbonate ($K_2CO_3$) (11.6 g, 84 mmol) were dissolved in tetrahydrofuran (THF) (300 mL) and $H_2O$ (100 ml), and the resulting solution was heated to 90° C. Tetrakis(triphenylphosphine) palladium ($Pd(PPh_3)_4$) (0.65 g, 0.56 mmol) was added thereto, and then the resulting mixture was refluxed for 4 hours. The mixture was cooled to normal temperature, and then the aqueous layer was removed. Magnesium sulfate ($MgSO_4$) was put into the organic layer, and then the resulting product was filtered. The filtrate was concentrated, and then purified by column chromatography to obtain Compound 1 (15 g, yield 81%).

MS: $[M+H]^+$=661

<Synthesis Example 2> Preparation of Compound Represented by Compound 2

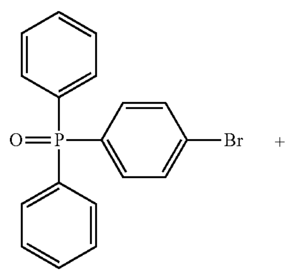

[Chemical Formula 1A]

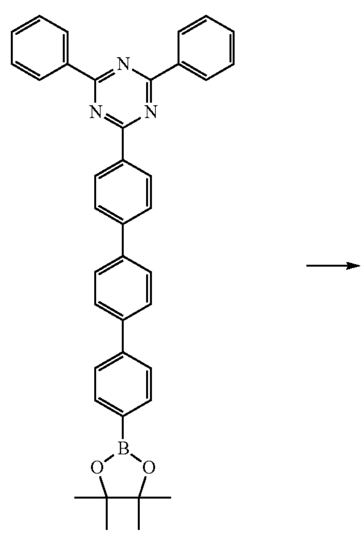

[Chemical Formula 2B]

-continued

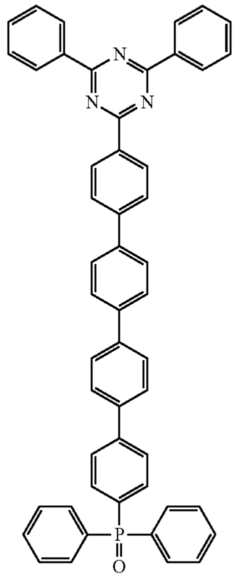

[Compound 2]

(1) Preparation of Compound 2

Chemical Formula 1A (10 g, 28 mmol), triazine boronic acid Chemical Formula 2B (16.4 g, 28 mmol), and potassium carbonate ($K_2CO_3$) (11.6 g, 84 mmol) were dissolved in tetrahydrofuran (THF) (300 mL) and $H_2O$ (100 ml), and the resulting solution was heated to 90° C. Tetrakis(triphenylphosphine) palladium ($Pd(PPh_3)_4$) (0.65 g, 0.56 mmol) was added thereto, and then the resulting mixture was refluxed for 4 hours. The mixture was cooled to normal temperature, and then the aqueous layer was removed. Magnesium sulfate ($MgSO_4$) was put into the organic layer, and then the resulting product was filtered. The filtrate was concentrated, and then purified by column chromatography to obtain Compound 2 (18 g, yield 87%).

MS: $[M+H]^+$=737

<Synthesis Example 3> Preparation of Compound Represented by Compound 3

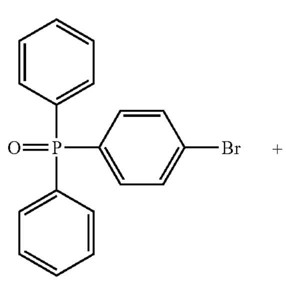

[Chemical Formula 1A]

-continued

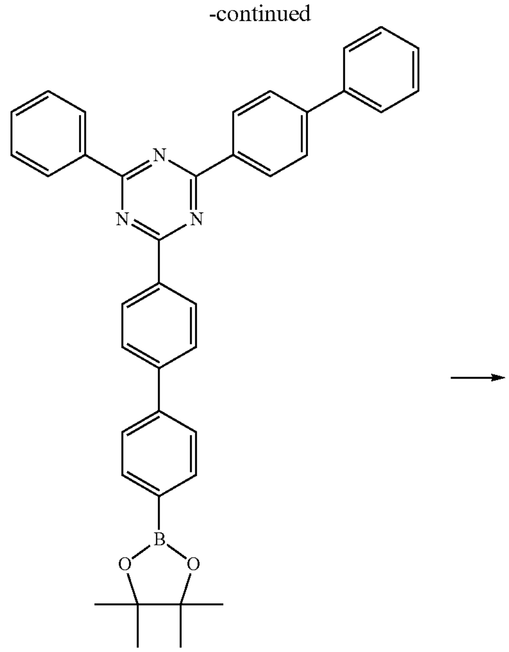

[Chemical Formula 3B]

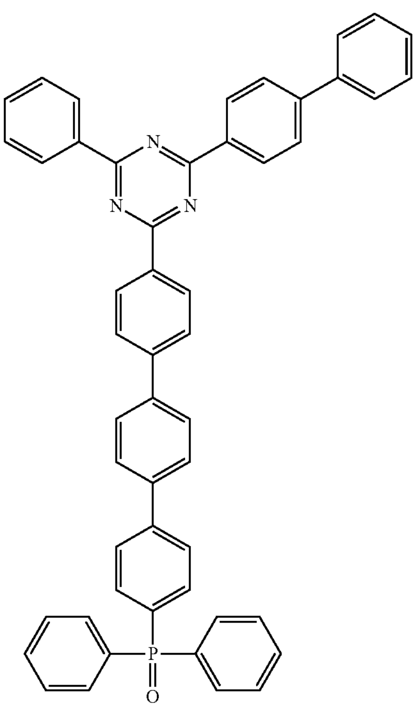

[Compound 3]

(1) Preparation of Compound 3

Compound 3 (17 g, yield 83%) was obtained by preparing the compound in the same manner as in the preparation of Compound 1 in Synthesis Example 1, except that Chemical Formula 3B was used instead of triazine boronic acid Chemical Formula 1B.

MS: $[M+H]^+$=737

<Synthesis Example 4> Preparation of Compound Represented by Compound 14

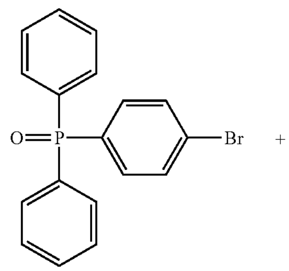

[Chemical Formula 1A]

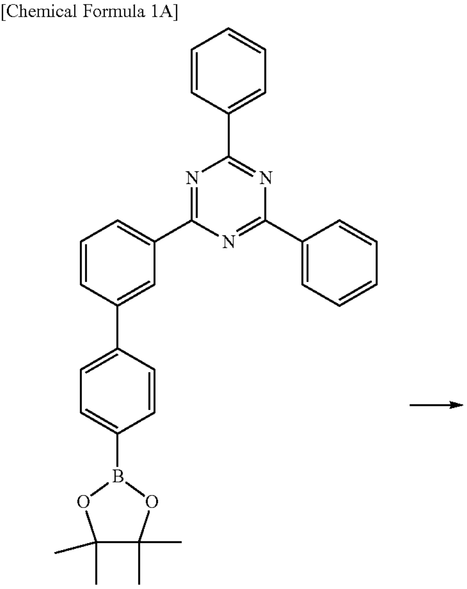

[Chemical Formula 14B]

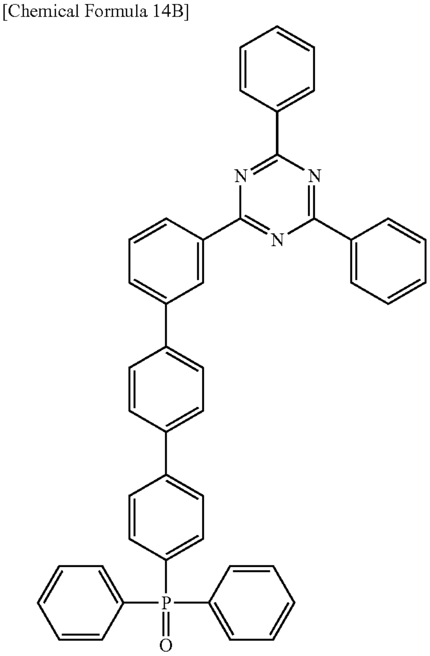

[Compound 14]

(1) Preparation of Compound 14

Compound 14 (13 g, yield 70%) was obtained by preparing the compound in the same manner as in the preparation of Compound 1 in Synthesis Example 1, except that Chemical Formula 14B was used instead of triazine boronic acid Chemical Formula 1B.

MS: $[M+H]^+=661$

<Synthesis Example 5> Preparation of Compound Represented by Compound 34

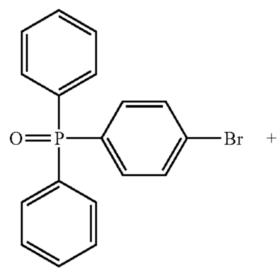

[Chemical Formula 1A]

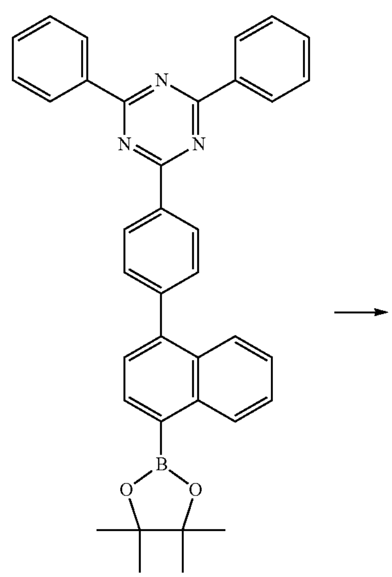

[Chemical Formula 34B]

-continued

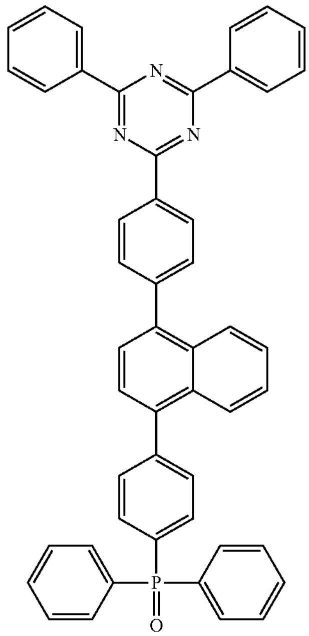

[Compound 34]

(1) Preparation of Compound 34

Compound 34 (14 g, yield 70%) was obtained by preparing the compound in the same manner as in the preparation of Compound 1 in Synthesis Example 1, except that Chemical Formula 34B was used instead of triazine boronic acid Chemical Formula 1B.

MS: $[M+H]^+$=711

<Synthesis Example 6> Preparation of Compound Represented by Compound 41

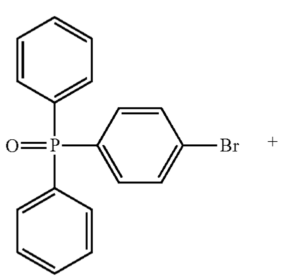

[Chemical Formula 1A]

-continued

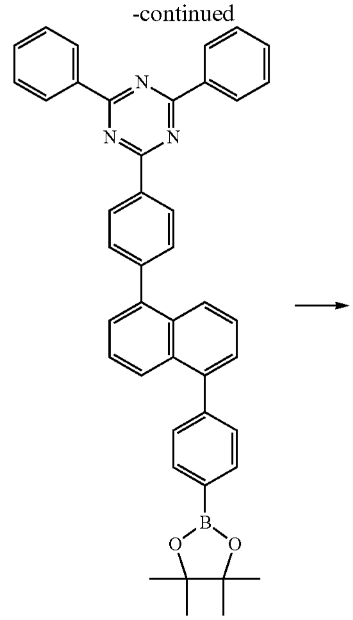

[Chemical Formula 41B]

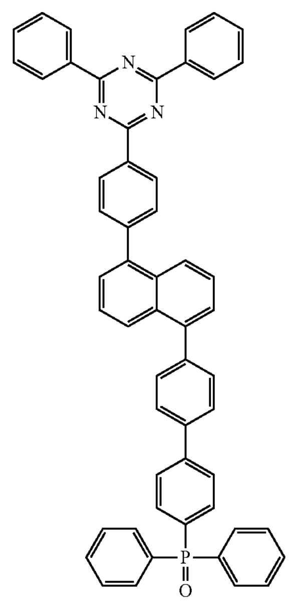

[Compound 41]

(1) Preparation of Compound 41

Compound 41 (16 g, yield 73%) was obtained by preparing the compound in the same manner as in the preparation of Compound 1 in Synthesis Example 1, except that Chemical Formula 41B was used instead of triazine boronic acid Chemical Formula 1B.

MS: $[M+H]^+$=787

<Synthesis Example 7> Preparation of Compound Represented by Compound 47

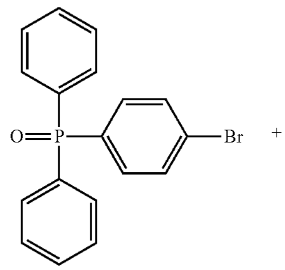

[Chemical Formula 1A]

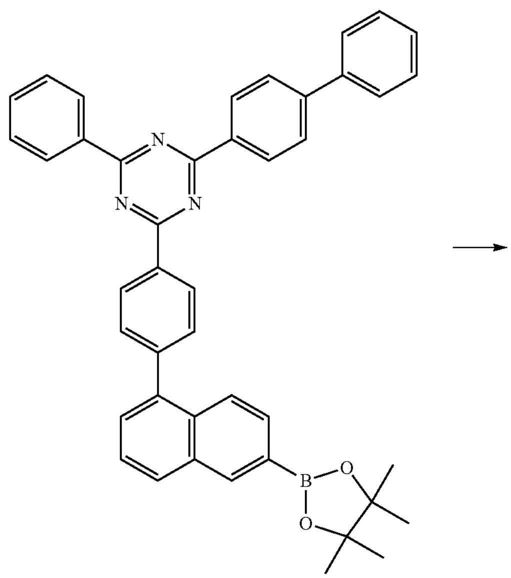

[Chemical Formula 47B]

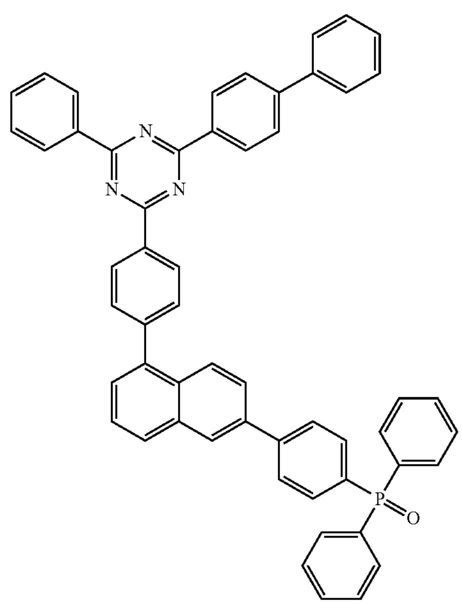

[Compound 47]

(1) Preparation of Compound 47

Compound 47 (20 g, yield 83%) was obtained by preparing the compound in the same manner as in the preparation of Compound 1 in Synthesis Example 1, except that Chemical Formula 47B was used instead of triazine boronic acid Chemical Formula 1B.

MS: $[M+H]^+=863$

<Synthesis Example 8> Preparation of Compound Represented by Compound 55

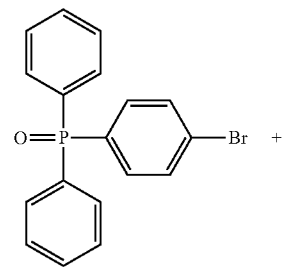

[Chemical Formula 1A]

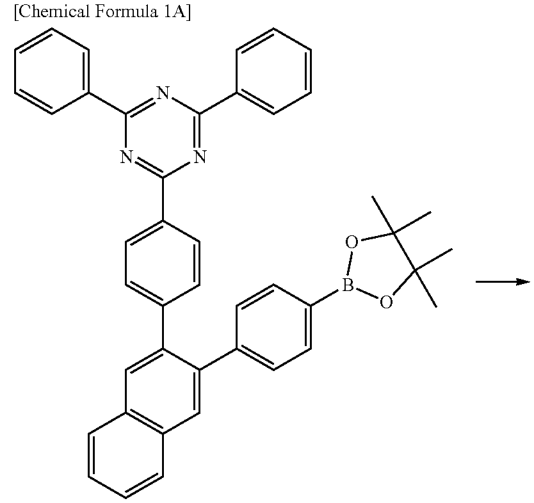

[Chemical Formula 55B]

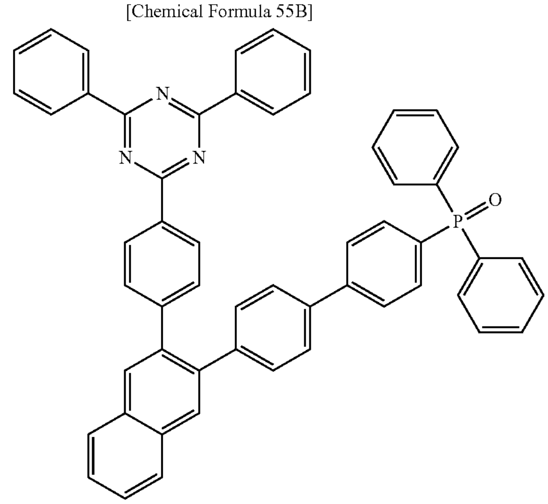

[Chemical Formula 55]

(1) Preparation of Compound 55

Compound 55 (14 g, yield 64%) was obtained by preparing the compound in the same manner as in the preparation of Compound 1 in Synthesis Example 1, except that Chemical Formula 55B was used instead of triazine boronic acid Chemical Formula 1B.

MS: [M+H]+=787

<Synthesis Example 9> Preparation of Compound Represented by Compound 7

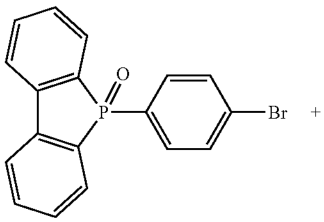

[Chemical Formula 7A]

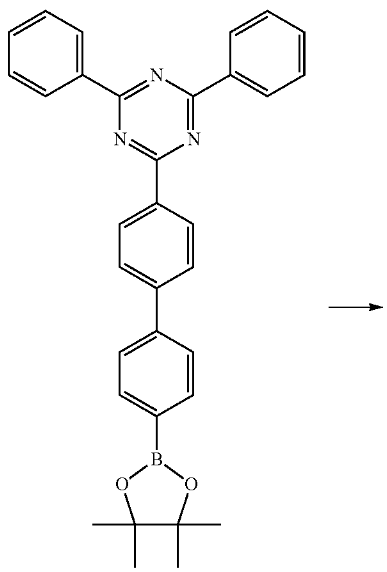

[Chemical Formula 1B]

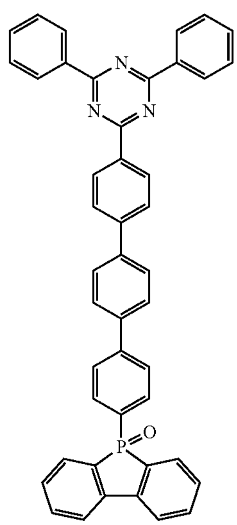

[Compound 7]

(1) Preparation of Compound 7

Compound 7 (15 g, yield 81%) was obtained by preparing the compound in the same manner as in the preparation of Compound 1 in Synthesis Example 1, except that Chemical Formula 7A was used instead of Chemical Formula 1A.

MS: [M+H]+=659

<Synthesis Example 10> Preparation of Compound Represented by Compound 9

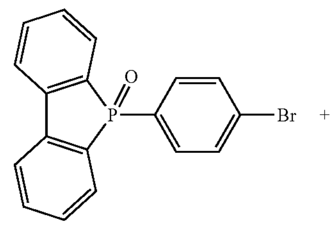

[Chemical Formula 7A]

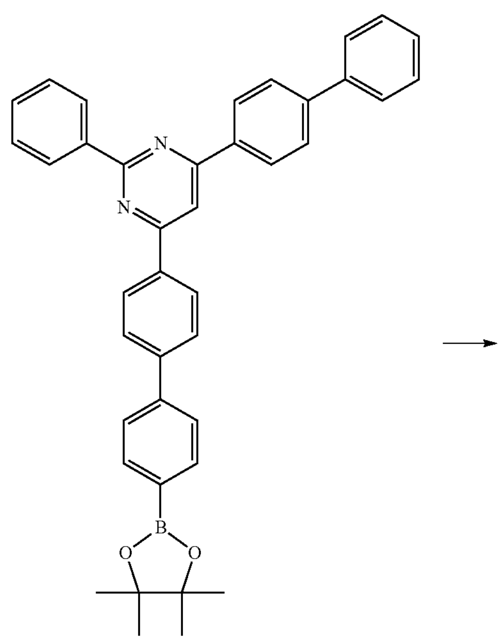

[Chemical Formula 9B]

-continued

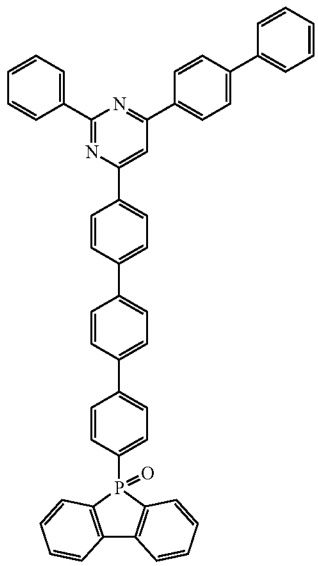

[Compound 9]

(1) Preparation of Compound 9

Compound 9 (17 g, yield 83%) was obtained by preparing the compound in the same manner as in the preparation of Compound 7 in Synthesis Example 9, except that Chemical Formula 9B was used instead of Chemical Formula 1B.

MS: $[M+H]^+=734$

<Synthesis Example 11> Preparation of Compound Represented by Compound 10

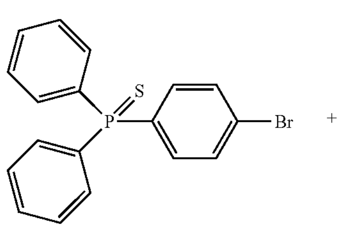

[Chemical Formula 10A]

-continued

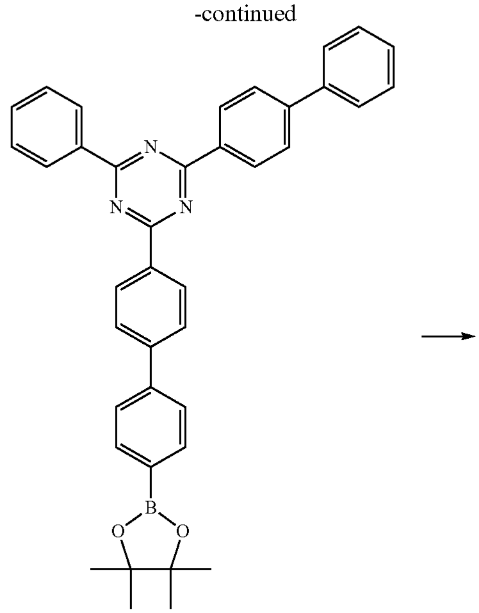

[Chemical Formula 3B]

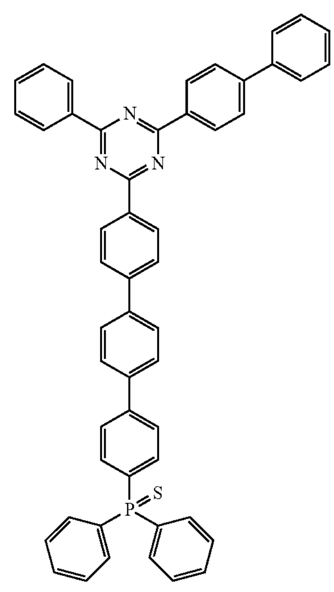

[Compound 10]

(1) Preparation of Compound 10

Compound 10 (12 g, yield 60%) was obtained by preparing the compound in the same manner as in the preparation of Compound 3 in Synthesis Example 3, except that Chemical Formula 10A was used instead of Chemical Formula 1A.

MS: $[M+H]^+=753$

<Synthesis Example 12> Preparation of Compound Represented by Compound 20

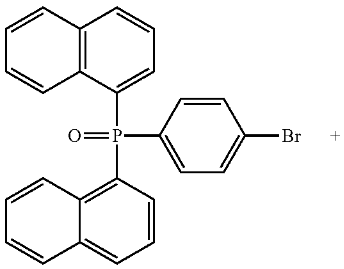

[Chemical Formula 20A]

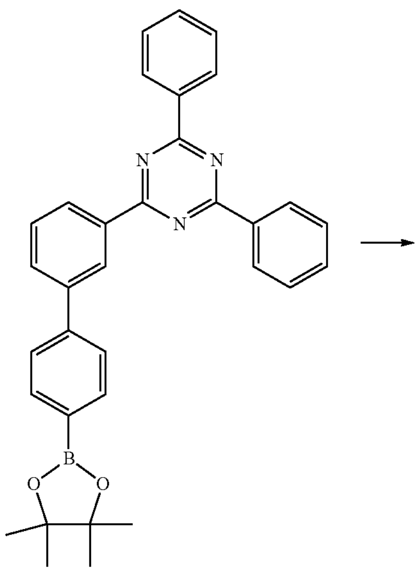

[Chemical Formula 14B]

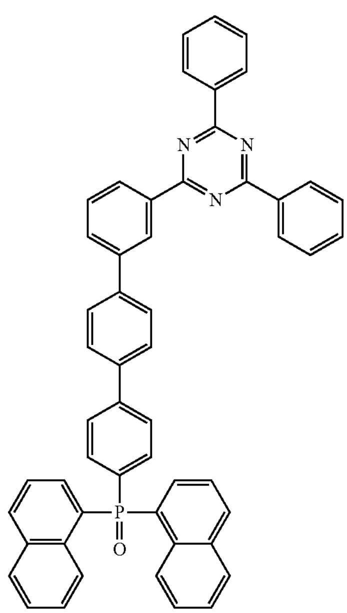

[Compound 20]

(1) Preparation of Compound 20

Compound 20 (12 g, yield 73%) was obtained by preparing the compound in the same manner as in the preparation of Compound 14 in Synthesis Example 4, except that Chemical Formula 20A was used instead of Chemical Formula 1A.

MS: $[M+H]^{+}$=751

<Synthesis Example 13> Preparation of Compound Represented by Compound 70

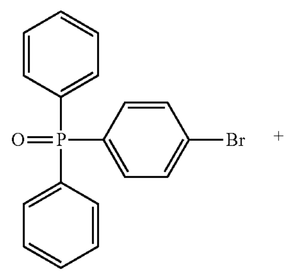

[Chemical Formula 1A]

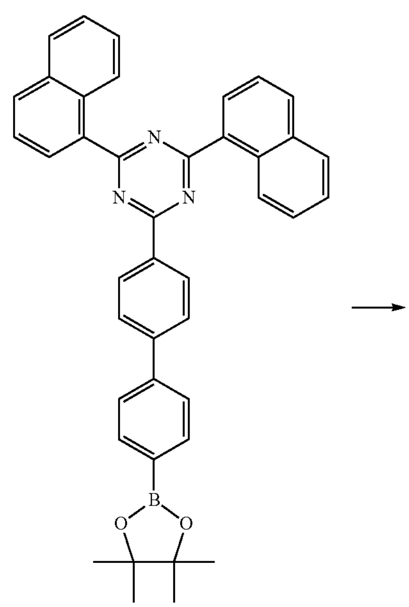

[Chemical Formula 70B]

-continued

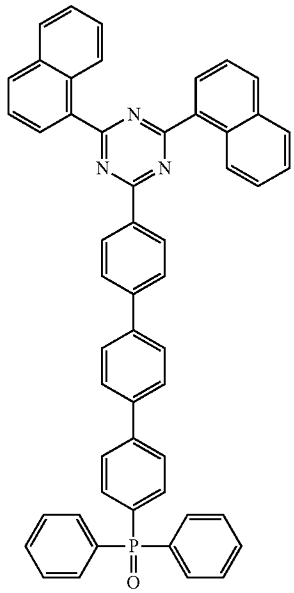

[Compound 70]

(1) Preparation of Compound 70

Compound 70 (19 g, yield 89%) was obtained by preparing the compound in the same manner as in the preparation of Compound 1 in Synthesis Example 1, except that Chemical Formula 70B was used instead of Chemical Formula 1B.

MS: $[M+H]^+$=761

<Synthesis Example 14> Preparation of Compound Represented by Compound 69

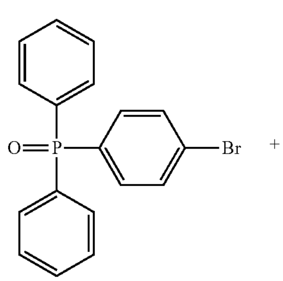

[Chemical Formula 1A]

-continued

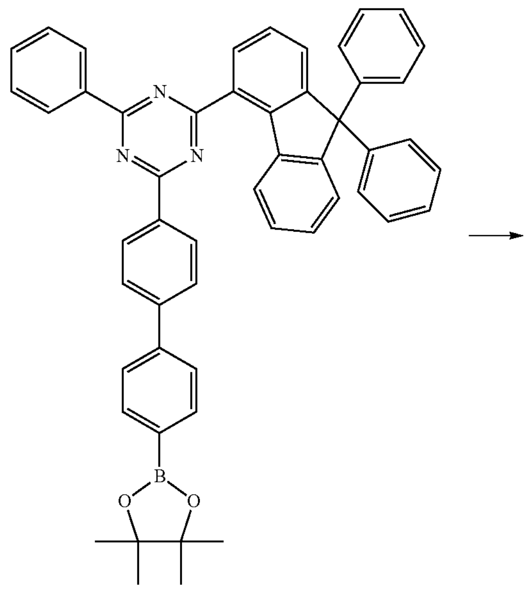

[Chemical Formula 69B]

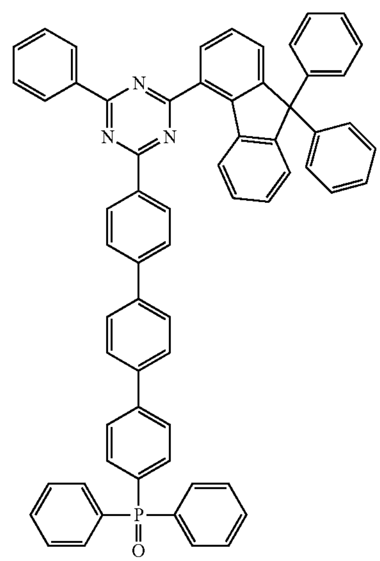

[Compound 69]

(1) Preparation of Compound 69

Compound 69 (21 g, yield 83%) was obtained by preparing the compound in the same manner as in the preparation of Compound 1 in Synthesis Example 1, except that Chemical Formula 69B was used instead of Chemical Formula 1B.

MS: $[M+H]^+$=901

<Synthesis Example 15> Preparation of Compound Represented by Compound 71

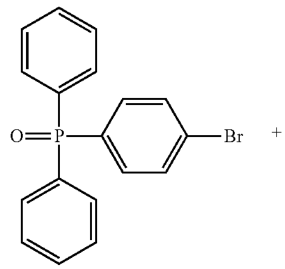

[Chemical Formula 1A]

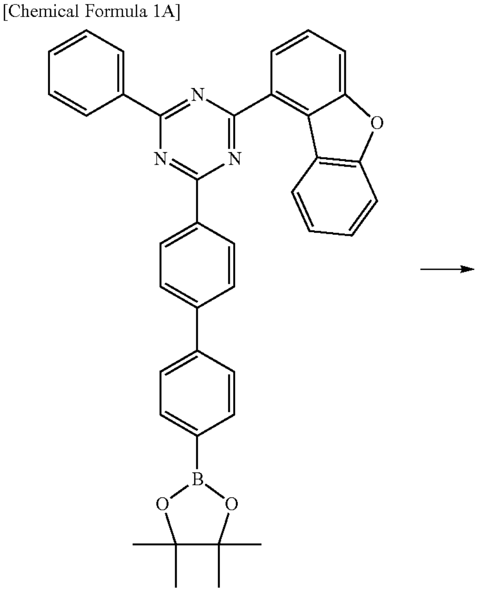

[Chemical Formula 71B]

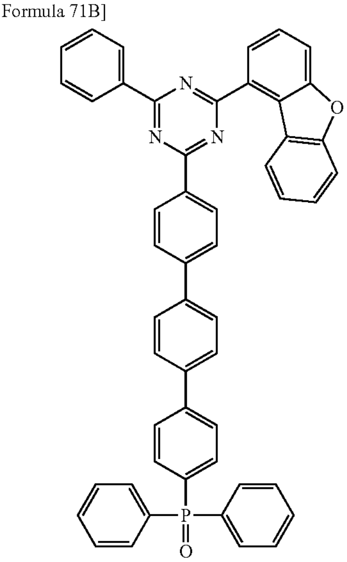

[Compound 71]

(1) Preparation of Compound 71

Compound 71 (16 g, yield 76%) was obtained by preparing the compound in the same manner as in the preparation of Compound 1 in Synthesis Example 1, except that Chemical Formula 71B was used instead of Chemical Formula 1B.

MS: $[M+H]^+=751$

Example 1

A glass substrate (Corning 7059 glass) thinly coated with ITO (indium tin oxide) to have a thickness of 1,000 Å was put into distilled water in which a dispersant was dissolved, and ultrasonically washed. A product manufactured by Fischer Co., was used as the detergent, and distilled water twice filtered using a filter manufactured by Millipore Co., was used as the distilled water. After the ITO was washed for 30 minutes, ultrasonic washing was conducted twice repeatedly using distilled water for 10 minutes. After the washing using distilled water was completed, ultrasonic washing was conducted using isopropyl alcohol, acetone, and methanol solvents in this order, and drying was then conducted.

Hexanitrile hexaazatriphenylene was thermally vacuum deposited to have a thickness of 500 Å on a transparent ITO electrode, which was thus prepared, thereby forming a hole injection layer. HT1 (400 Å), which is a material transporting holes, was vacuum deposited thereon, and then compounds of a host $H_1$ and a dopant D1 were vacuum deposited as a light emitting layer to have a thickness of 300 Å. Compound 1 prepared in Synthesis Example 1 and LiQ (lithium quinolate) were vacuum deposited at a weight ratio of 1:1 on the light emitting layer, thereby forming an electron injection and transport layer having a thickness of 350 Å. Lithium fluoride (LiF) and aluminum were sequentially deposited to have a thickness of 12 Å and 2,000 Å, respectively, on the electron injection and transport layer, thereby forming a negative electrode. An organic light emitting device was manufactured.

In the aforementioned procedure, the deposition rate of the organic material was maintained at 0.4 to 0.7 Å/sec, the deposition rates of lithium fluoride and aluminum of the negative electrode were maintained at 0.3 Å/sec and at 2 Å/sec, respectively, and the degree of vacuum during the deposition was maintained at $2\times10^{-7}$ to $5\times10^{-6}$ torr, thereby manufacturing an organic light emitting device.

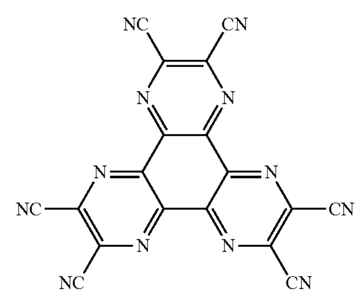

[Hexanitrile hexaazatriphenylene]

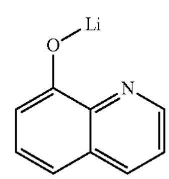

[LiQ]

[HT1]

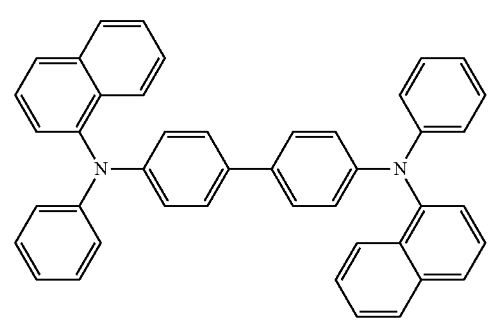

-continued

[H1]

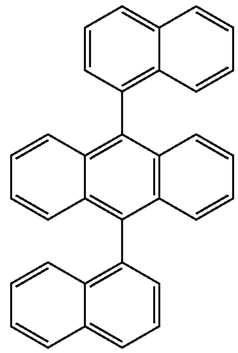

[D1]

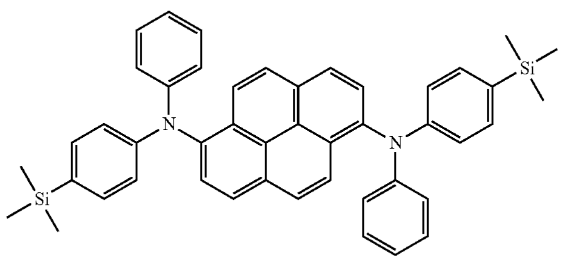

Example 2

An experiment was performed in the same manner as in Example 1, except that as the electron transport layer, Compound 2 was used instead of Compound 1.

Example 3

An experiment was performed in the same manner as in Example 1, except that as the electron transport layer, Compound 3 was used instead of Compound 1.

Example 4

An experiment was performed in the same manner as in Example 1, except that as the electron transport layer, Compound 14 was used instead of Compound 1.

Example 5

An experiment was performed in the same manner as in Example 1, except that as the electron transport layer, Compound 34 was used instead of Compound 1.

Example 6

An experiment was performed in the same manner as in Example 1, except that as the electron transport layer, Compound 41 was used instead of Compound 1.

Example 7

An experiment was performed in the same manner as in Example 1, except that as the electron transport layer, Compound 47 was used instead of Compound 1.

Example 8

An experiment was performed in the same manner as in Example 1, except that as the electron transport layer, Compound 55 was used instead of Compound 1.

Example 9

An experiment was performed in the same manner as in Example 1, except that as the electron transport layer, Compound 7 was used instead of Compound 1.

Example 10

An experiment was performed in the same manner as in Example 1, except that as the electron transport layer, Compound 9 was used instead of Compound 1.

Example 11

An experiment was performed in the same manner as in Example 1, except that as the electron transport layer, Compound 10 was used instead of Compound 1.

Example 12

An experiment was performed in the same manner as in Example 1, except that as the electron transport layer, Compound 20 was used instead of Compound 1.

Example 13

An experiment was performed in the same manner as in Example 1, except that as the electron transport layer, Compound 70 was used instead of Compound 1.

Example 14

An experiment was performed in the same manner as in Example 1, except that as the electron transport layer, Compound 69 was used instead of Compound 1.

Example 15

An experiment was performed in the same manner as in Example 1, except that as the electron transport layer, Compound 71 was used instead of Compound 1.

Comparative Example 1

An organic light emitting device was manufactured in the same manner as in Example 1, except that a compound of the following ET1 was used instead of Compound 1 in Example 1.

[ET1]

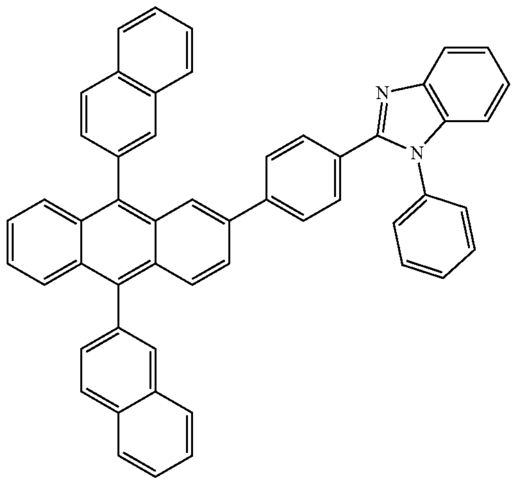

Comparative Example 2

An organic light emitting device was manufactured in the same manner as in Example 1, except that a compound of the following ET2 was used instead of Compound 1 in Example 1.

[ET2]

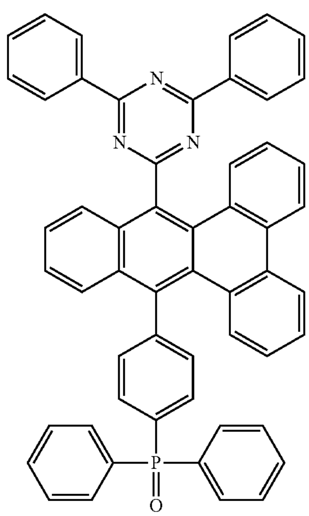

Comparative Example 3

An organic light emitting device was manufactured in the same manner as in Example 1, except that a compound of the following ET3 was used instead of Compound 1 in Example 1.

[ET3]

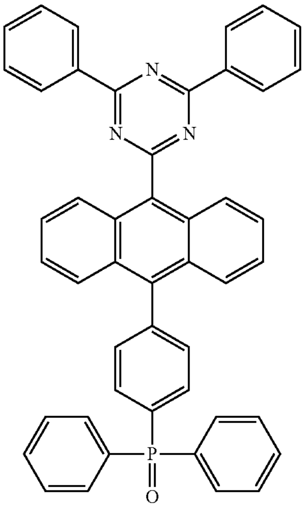

Comparative Example 4

An organic light emitting device was manufactured in the same manner as in Example 1, except that a compound of the following ET4 was used instead of Compound 1 in Example 1.

[ET4]

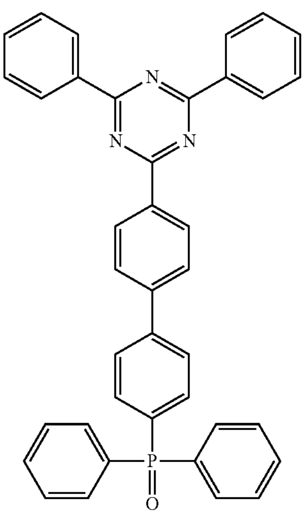

Comparative Example 5

An organic light emitting device was manufactured in the same manner as in Example 1, except that a compound of the following ET5 was used instead of Compound 1 in Example 1.

[ET5]

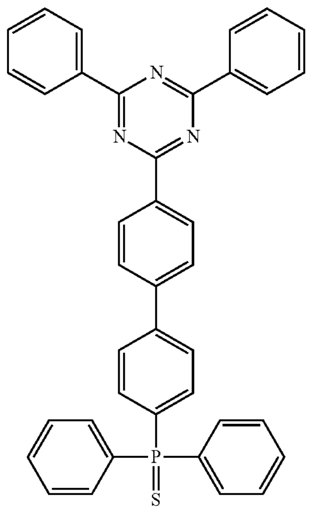

Comparative Example 6

An organic light emitting device was manufactured in the same manner as in Example 1, except that a compound of the following ET6 was used instead of Compound 1 in Example 1.

[ET6]

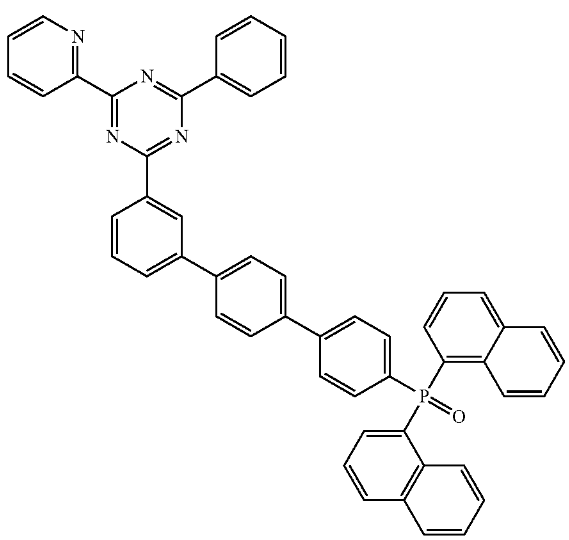

For the organic light emitting devices manufactured by using each compound as the electron transport layer material as in Examples 1 to 15 and Comparative Examples 1 to 6, the driving voltage and the light emitting efficiency were measured at a current density of 10 mA/cm$^2$, and a time (LT98) for reaching a 98% value compared to the initial luminance was measured at a current density of 20 mA/cm$^2$. The results are shown in the following Table 1.

TABLE 1

| Experimental Example 10 mA/cm$^2$ | Compound | Voltage (V) | Current efficiency (cd/A) | Color coordinate (x, y) | Life Time 98 at 20 mA/cm$^2$ |
|---|---|---|---|---|---|
| Example 1 | Compound 1 | 4.10 | 5.11 | (0.137, 0.124) | 70 |
| Example 2 | Compound 2 | 4.10 | 5.10 | (0.139, 0.124) | 79 |
| Example 3 | Compound 3 | 4.05 | 5.11 | (0.138, 0.127) | 78 |
| Example 4 | Compound 14 | 3.89 | 5.35 | (0.138, 0.129) | 61 |
| Example 5 | Compound 34 | 3.91 | 5.32 | (0.137, 0.126) | 65 |
| Example 6 | Compound 41 | 3.88 | 5.30 | (0.137, 0.124) | 63 |
| Example 7 | Compound 47 | 3.98 | 5.24 | (0.137, 0.126) | 59 |
| Example 8 | Compound 55 | 4.01 | 5.45 | (0.137, 0.126) | 51 |
| Example 9 | Compound 7 | 4.02 | 5.21 | (0.137, 0.124) | 68 |
| Example 10 | Compound 9 | 3.99 | 5.18 | (0.137, 0.126) | 51 |
| Example 11 | Compound 10 | 4.11 | 5.05 | (0.137, 0.126) | 48 |
| Example 12 | Compound 20 | 3.82 | 5.39 | (0.138, 0.129) | 60 |
| Example 13 | Compound 70 | 4.12 | 5.07 | (0.137, 0.124) | 75 |
| Example 14 | Compound 69 | 4.10 | 5.10 | (0.137, 0.126) | 79 |
| Example 15 | Compound 71 | 4.10 | 5.09 | (0.137, 0.126) | 82 |
| Comparative Example 1 | ET1 | 4.02 | 5.05 | (0.140, 0.129) | 32 |
| Comparative Example 2 | ET2 | 4.55 | 4.32 | (0.140, 0.129) | 41 |
| Comparative Example 3 | ET3 | 4.21 | 4.90 | (0.139, 0.129) | 36 |
| Comparative Example 4 | ET4 | 4.17 | 4.7 | (0.137, 0.126) | 44 |
| Comparative Example 5 | ET5 | 4.19 | 4.89 | (0.140, 0.126) | 41 |
| Comparative Example 6 | ET6 | 4.05 | 4.77 | (0.139, 0.127) | 33 |

From the results of Table 1, it can be confirmed that the compound represented by Chemical Formula 1 according to an exemplary embodiment of the present specification may be used for an organic material layer of an organic light emitting device which may simultaneously inject and transport electrons.

Further, through Examples 1 to 15 and Comparative Examples 1 to 6, it can be confirmed that when the heterocyclic compound according to an exemplary embodiment of the present specification is used, an organic light emitting device with high efficiency and a long lifetime may be provided.

The invention claimed is:

1. A compound represented by the following Chemical Formula 1:

[Chemical Formula 1]

$$(HAr)_a\text{—}(L_1\text{—}Ar_1\text{—}L_2\text{—}(R)_b)_c$$

in Chemical Formula 1, $L_1$ and $L_2$ are the same as or different from each other, and are each independently a substituted or unsubstituted arylene group, $Ar_1$ is a single bond; or a substituted or unsubstituted arylene group, a to c are the same as or different from each other, and are each independently an integer of 1 to 3, when a is 2 or more, c is 1 and HAr's are the same as or different from each other, when b is 2 or more, R's are the same as or different from each other, when c is 2 or more, a is 1 and structures in the parenthesis are the same as or different from each other, HAr is any one selected from the following structures of (a) to (e), (a)

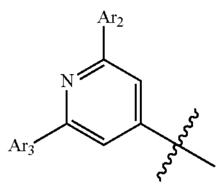

(b)

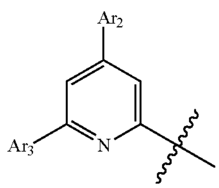

(c)

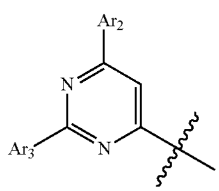

(d)

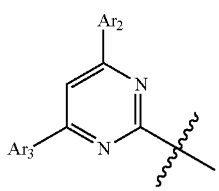

(e)

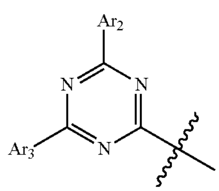

$Ar_2$ and $Ar_3$ are the same as or different from each other, and are each independently a substituted or unsubstituted aryl group, when c is 2, at least one of $Ar_2$ and $Ar_3$ is represented by

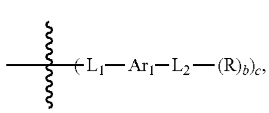

when c is 3, $Ar_2$ and $Ar_3$ are the same as or different from each other, and are each independently represented by

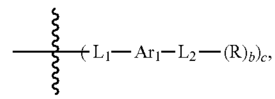

R is represented by the following Chemical Formula 2,

[Chemical Formula 2]

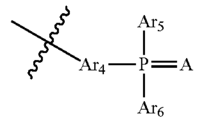

in Chemical Formula 2,

A is O; S; or Se, $Ar_4$ is a substituted or unsubstituted arylene group, and $Ar_5$ and $Ar_6$ are the same as or different from each other, and are each independently a substituted or unsubstituted aryl group, or adjacent groups optionally combine with each other to form a ring.

2. The compound of claim 1, wherein R is any one selected from the following structures:

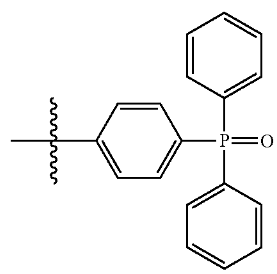

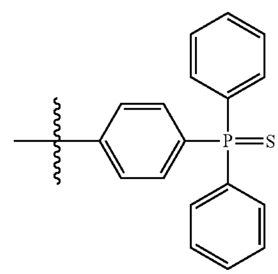

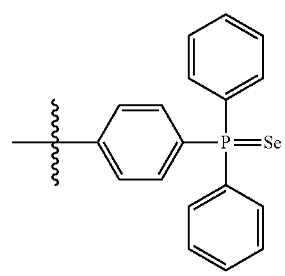

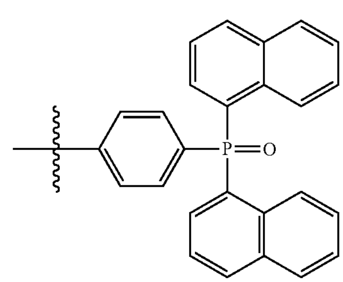

-continued

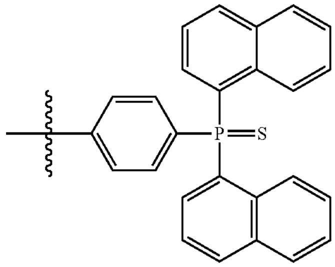

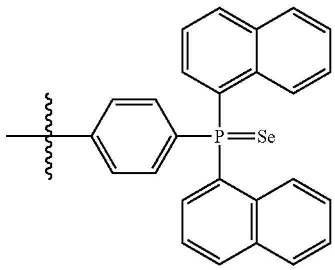

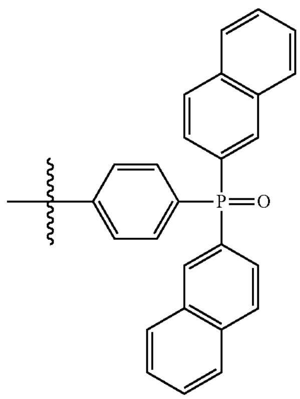

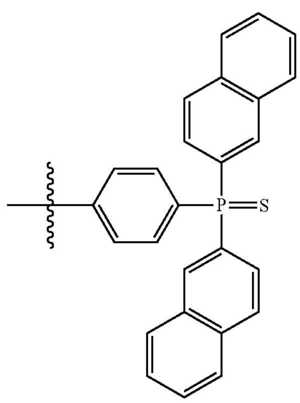

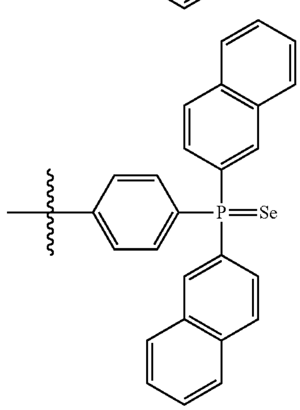

-continued

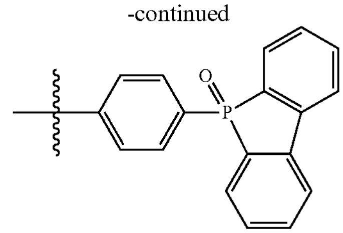

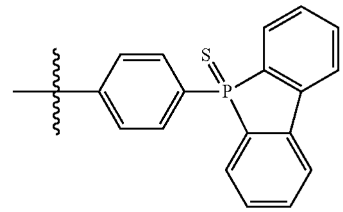

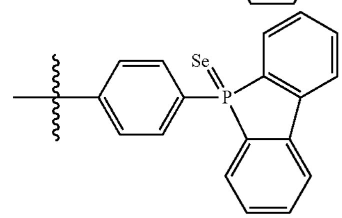

3. The compound of claim 1, wherein the compound of Chemical Formula 1 is represented by any one of the following Chemical Formulae 3 to 5:

[Chemical Formula 3]

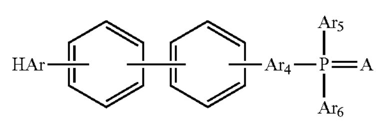

[Chemical Formula 4]

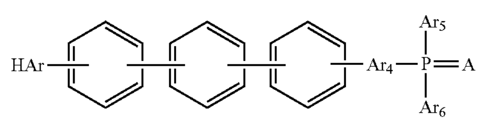

[Chemical Formula 5]

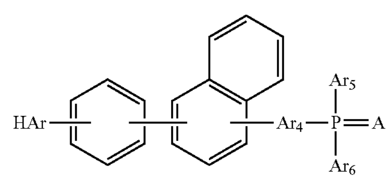

in Chemical Formulae 3 to 5, a definition of HAr is the same as that in Chemical Formula 1, and definitions of $Ar_4$ to $Ar_6$ and A are the same as those in Chemical Formula 2.

4. The compound of claim 1, wherein Are and Ara are the same as or different from each other, and are each independently a substituted or unsubstituted phenyl group; a substituted or unsubstituted biphenyl group; a substituted or unsubstituted naphthyl group; a substituted or unsubstituted anthracenyl group; a substituted or unsubstituted chrysenyl group; a substituted or unsubstituted phenanthrenyl group; a substituted or unsubstituted triphenylenyl group; a substituted or unsubstituted pyrenyl group; a substituted or unsubstituted tetracenyl group; or a substituted or unsubstituted fluorenyl group.

5. A compound selected from the following structures:
Compound 1
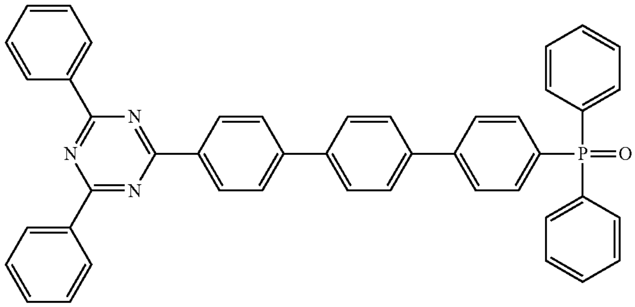
Compound 2
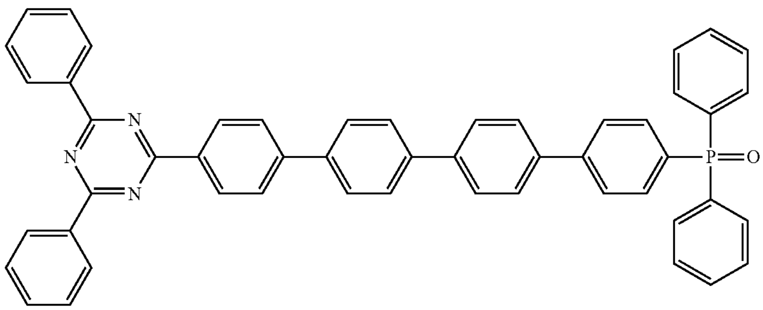
Compound 3
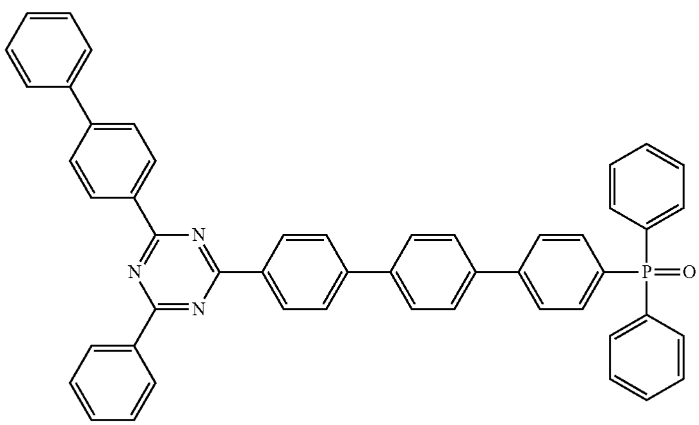
Compound 4
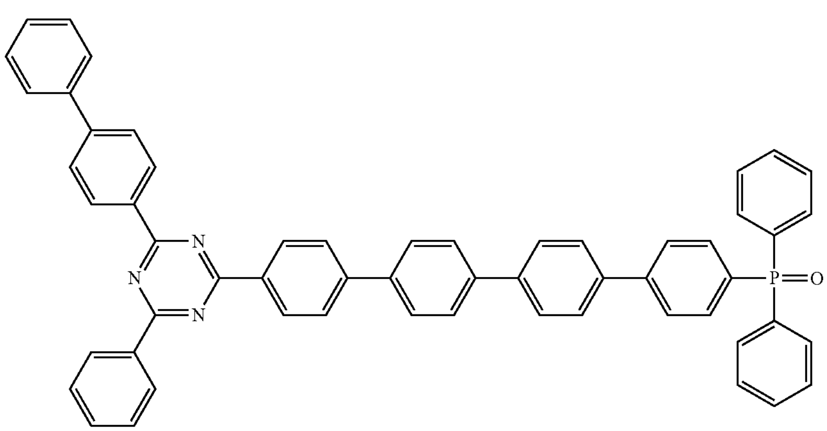

-continued
Compound 5
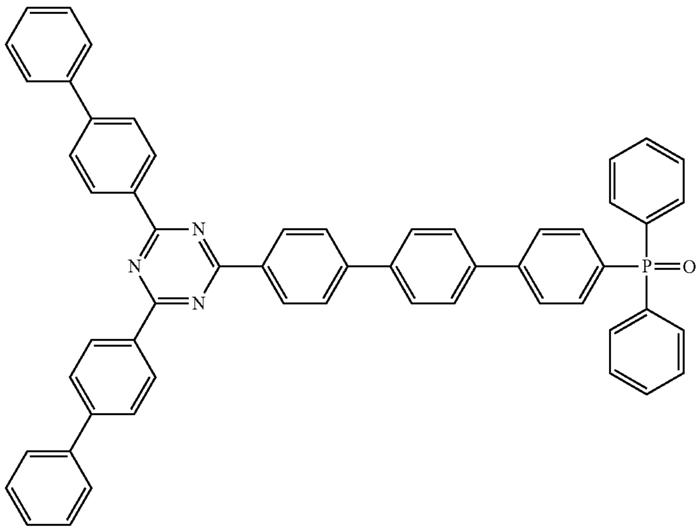
Compound 6
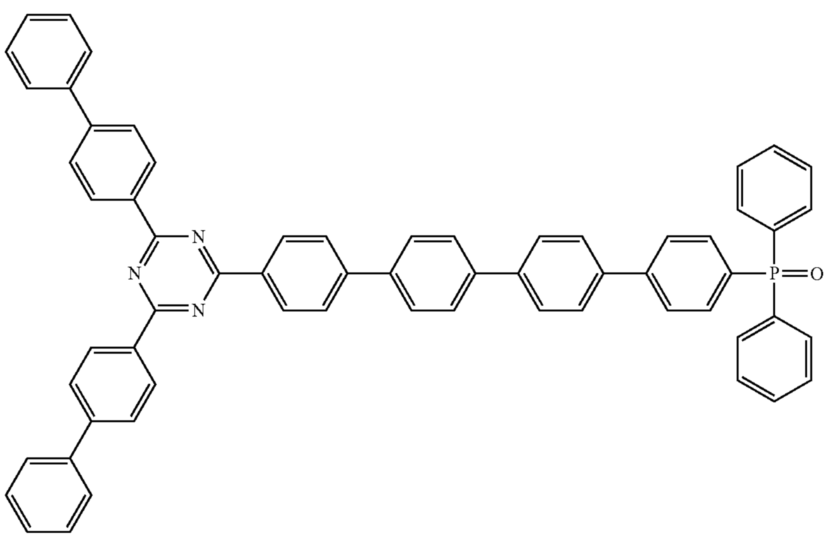
Compound 7
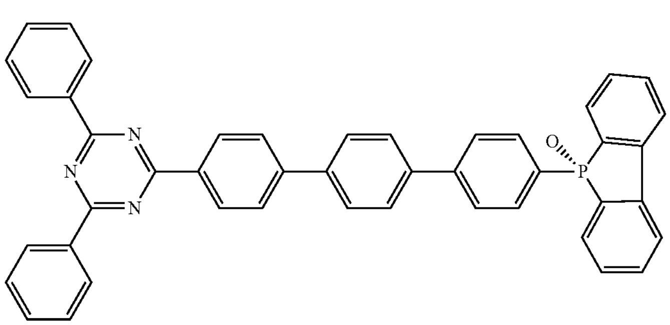

-continued
Compound 8
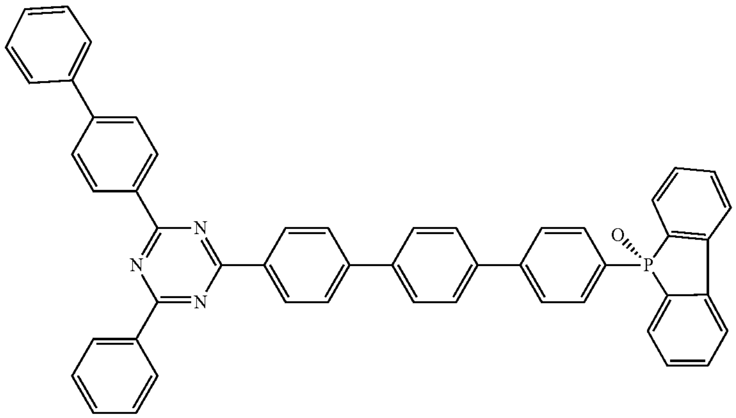
Compound 9
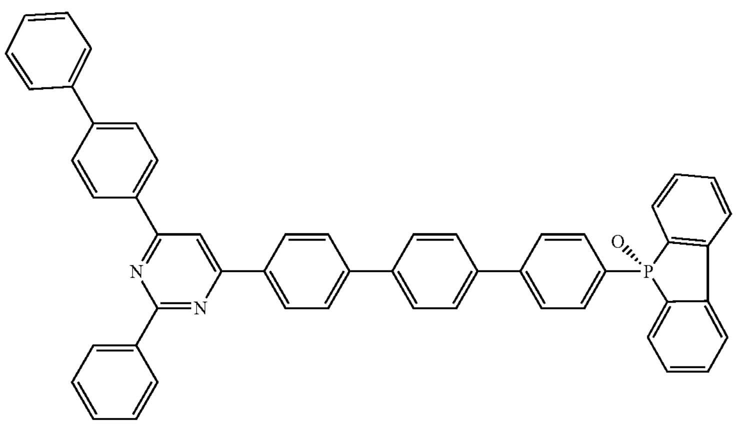
Compound 10
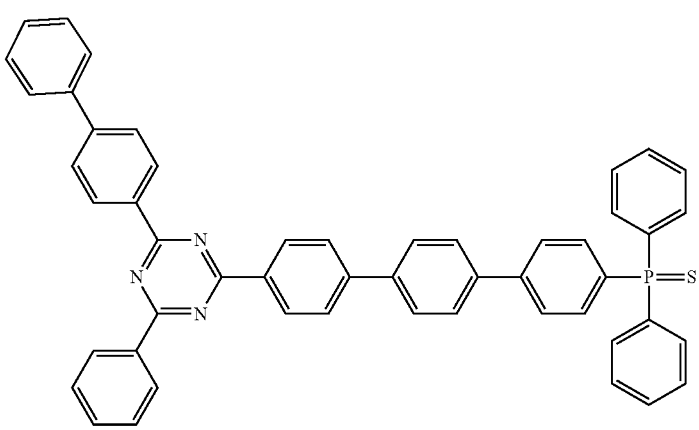

-continued
Compound 11
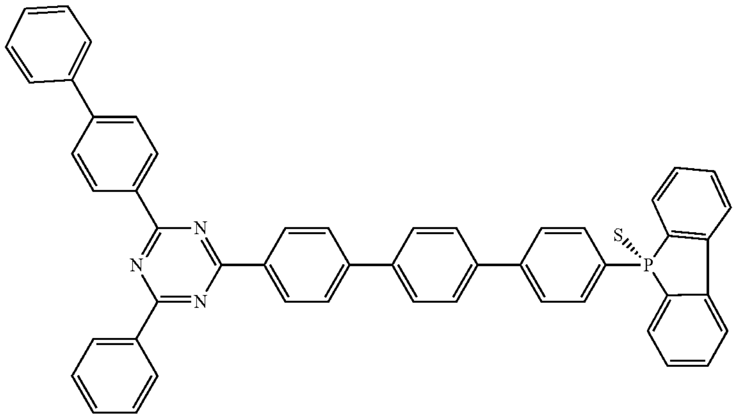
Compound 12
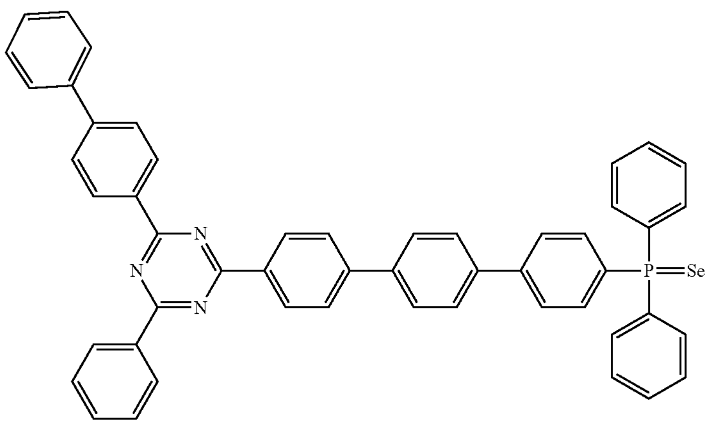
Compound 13
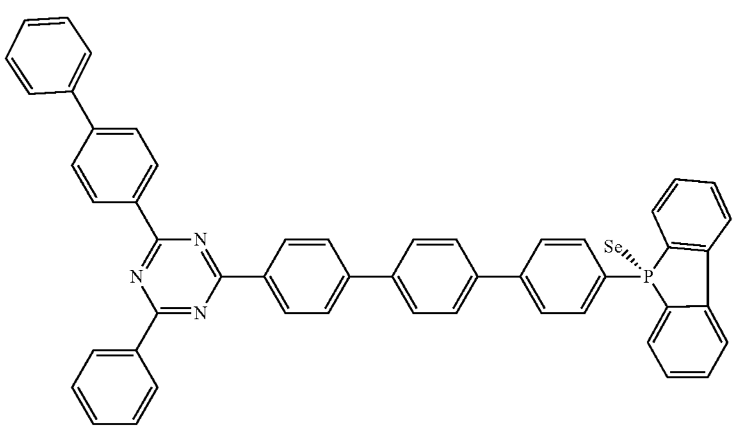

-continued
Compound 14
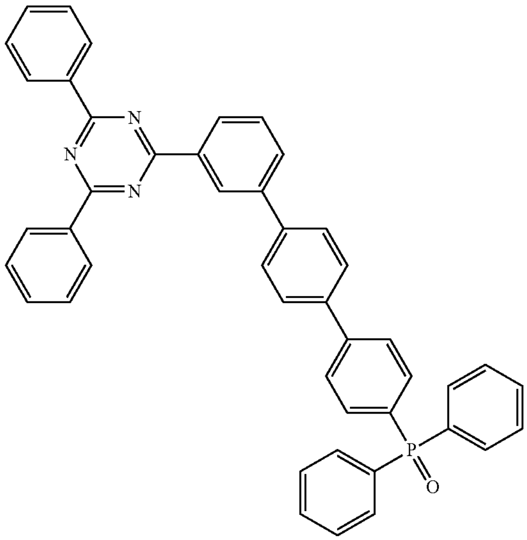
Compound 15
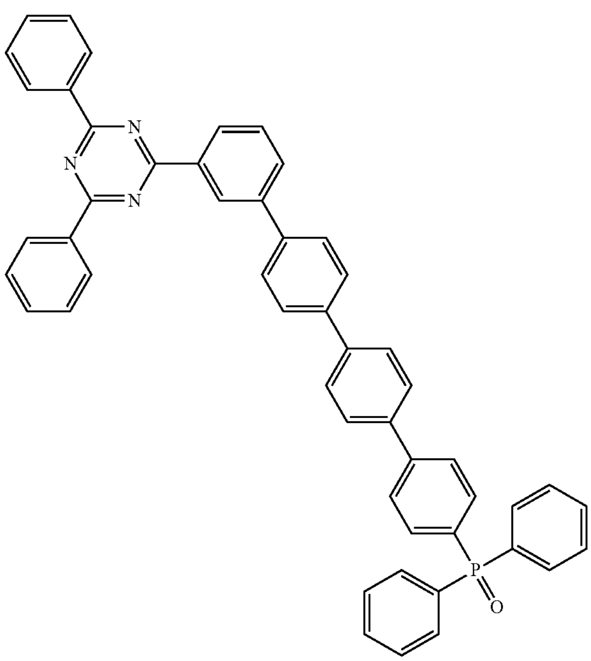

-continued
Compound 16
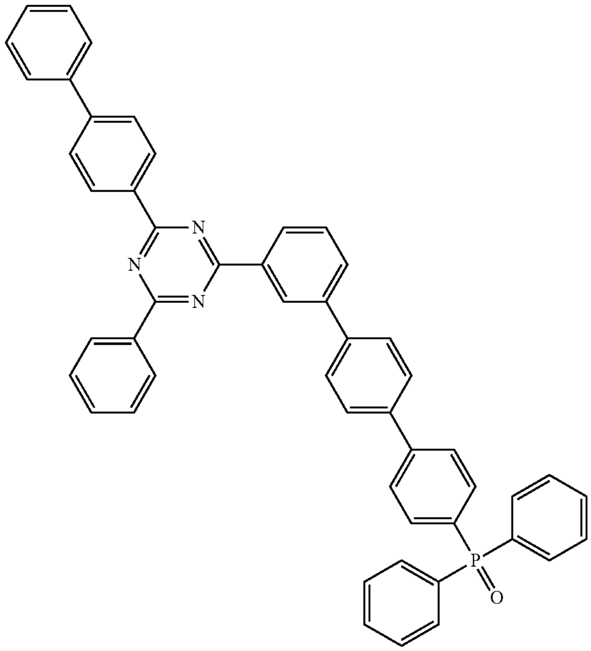
Compound 17
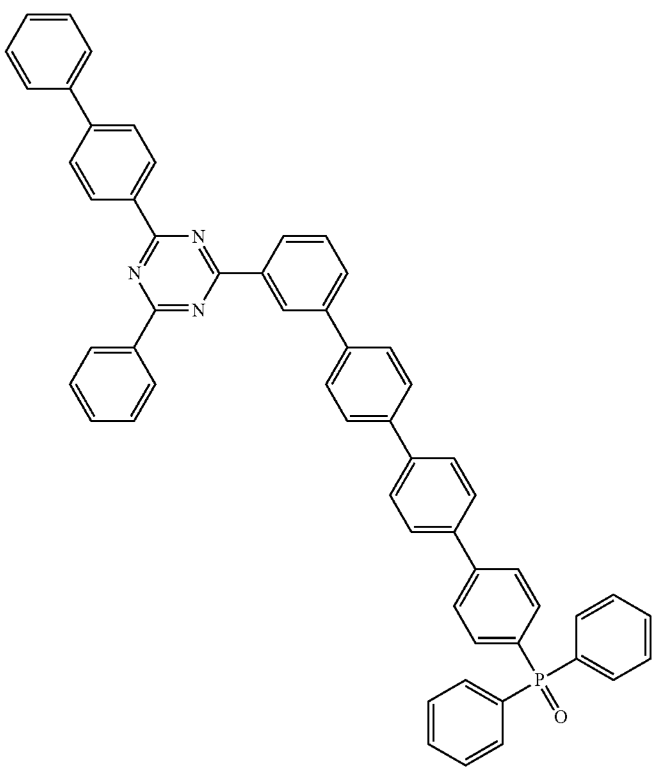

-continued
Compound 18
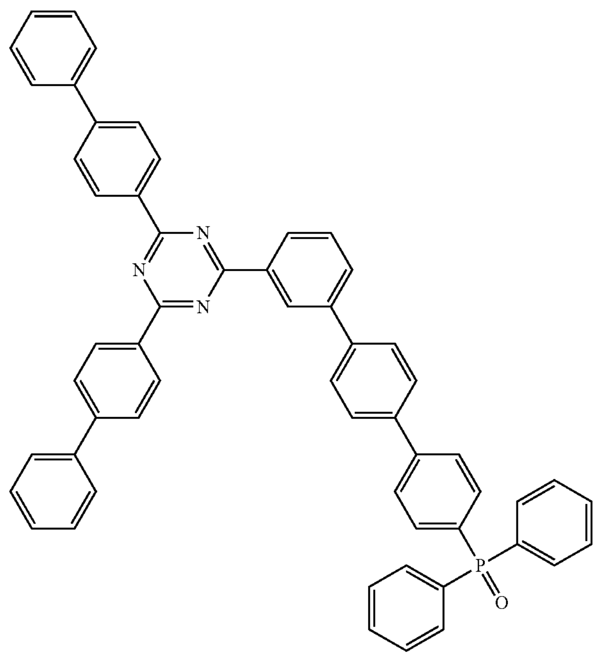
Compound 19
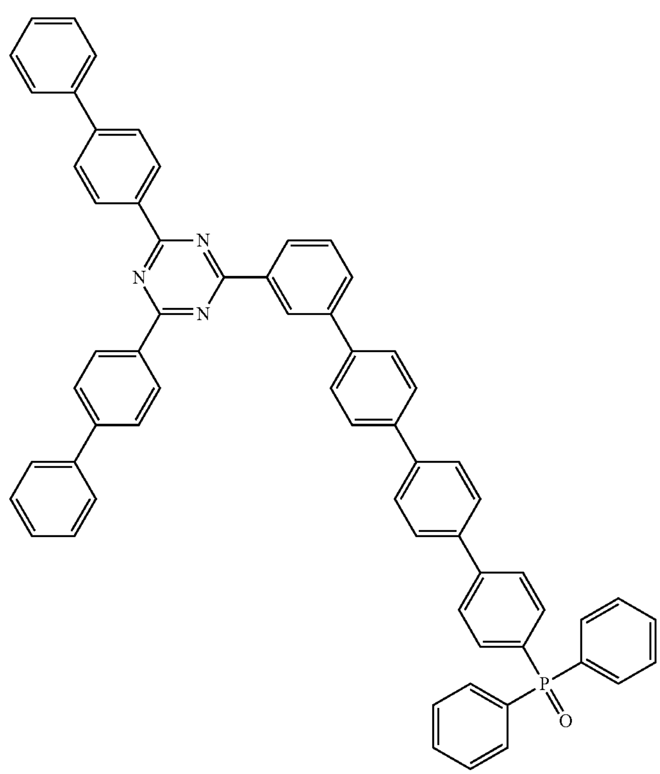

-continued
Compound 20
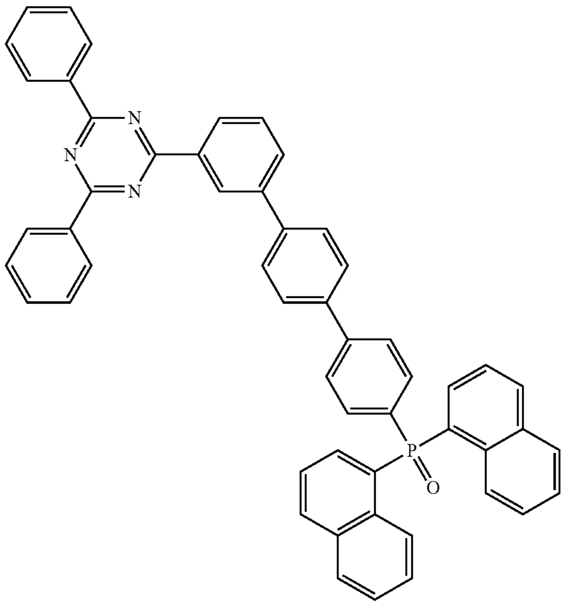
Compound 21
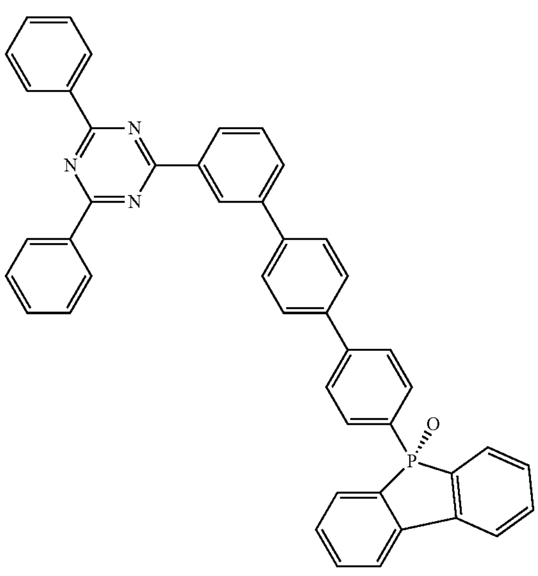

-continued
Compound 22
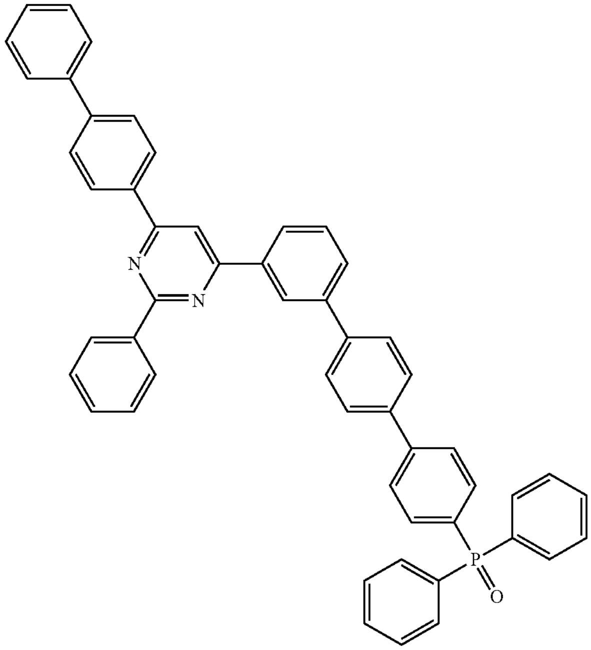
Compound 23
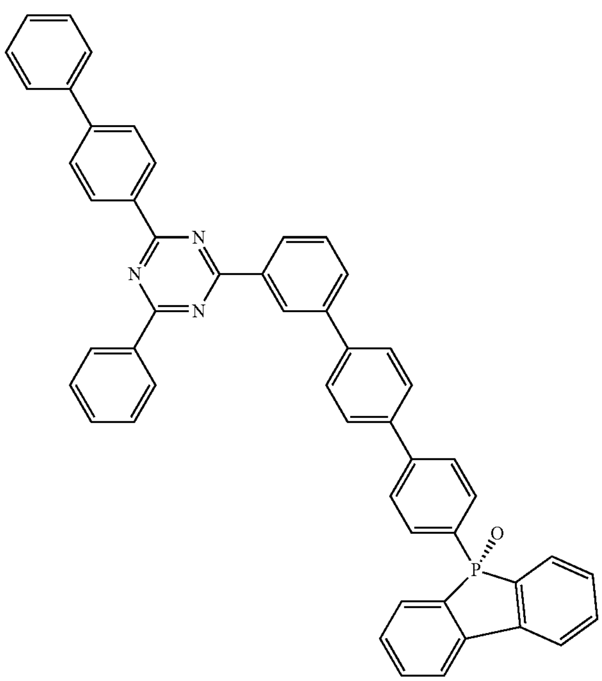

-continued
Compound 24
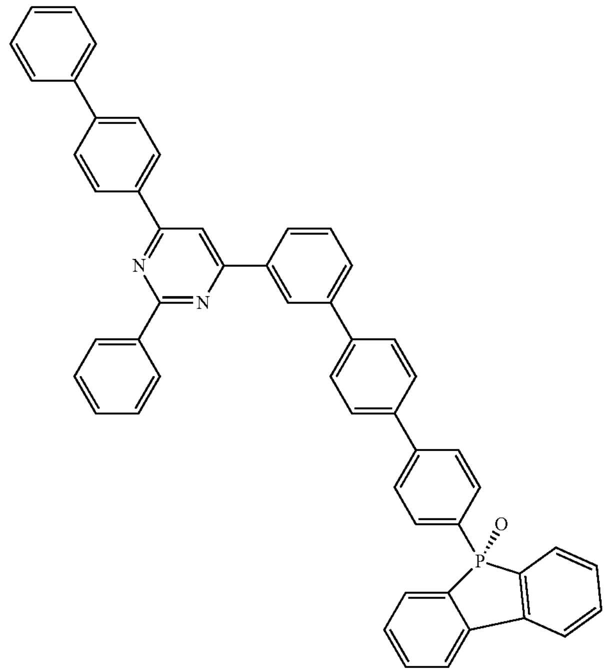
Compound 25
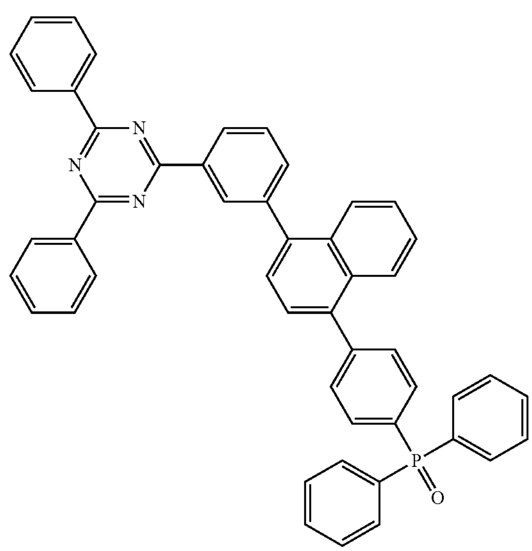

-continued
Compound 26
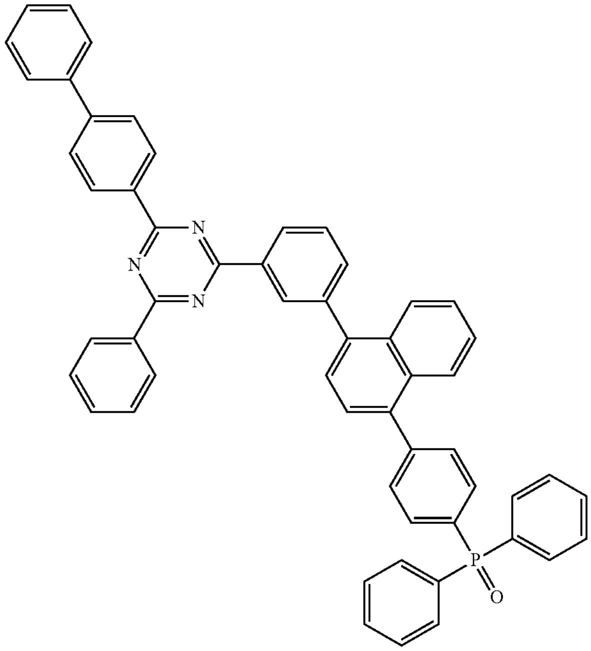
Compound 27
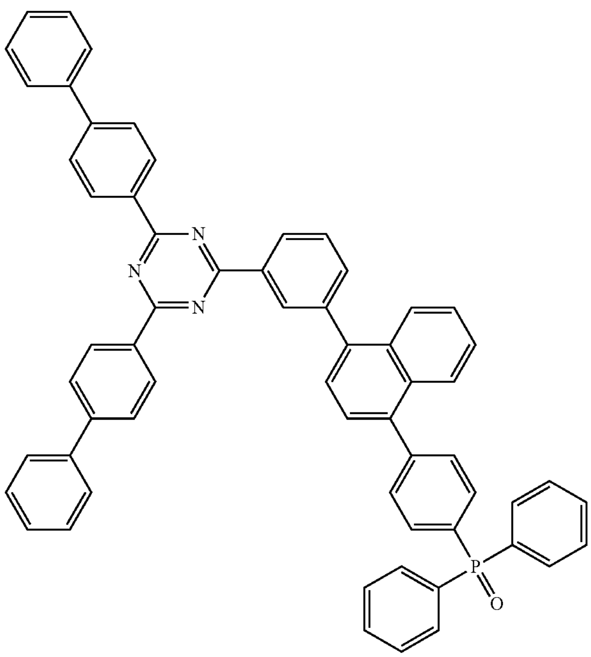
Compound 28
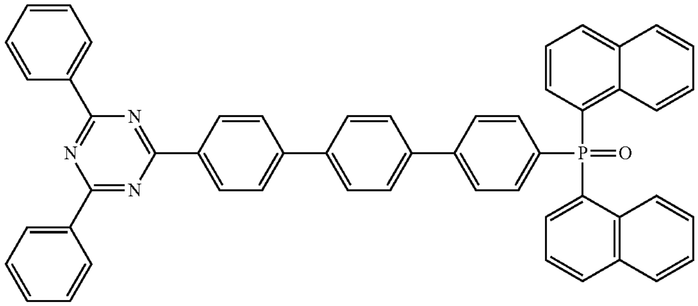

-continued
Compound 29
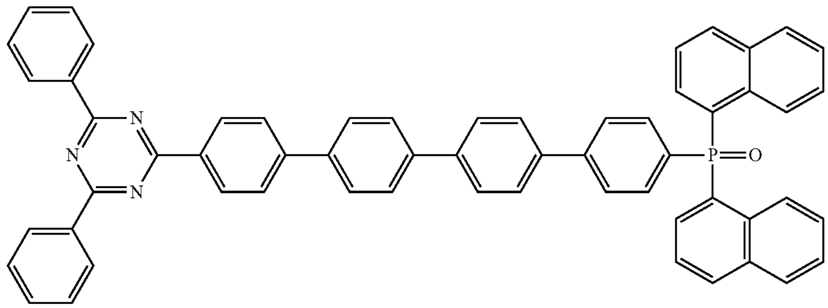
Compound 30
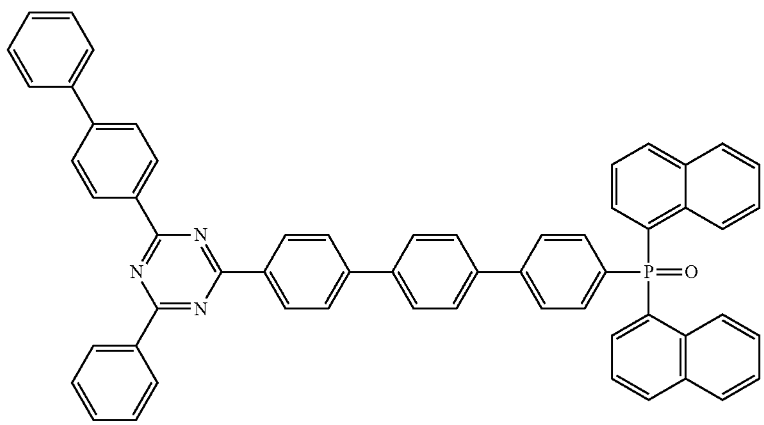
Compound 31
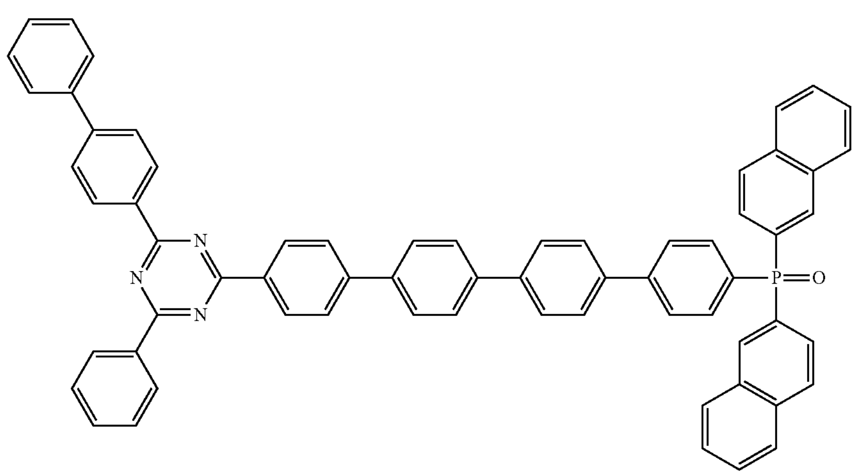

-continued
Compound 32
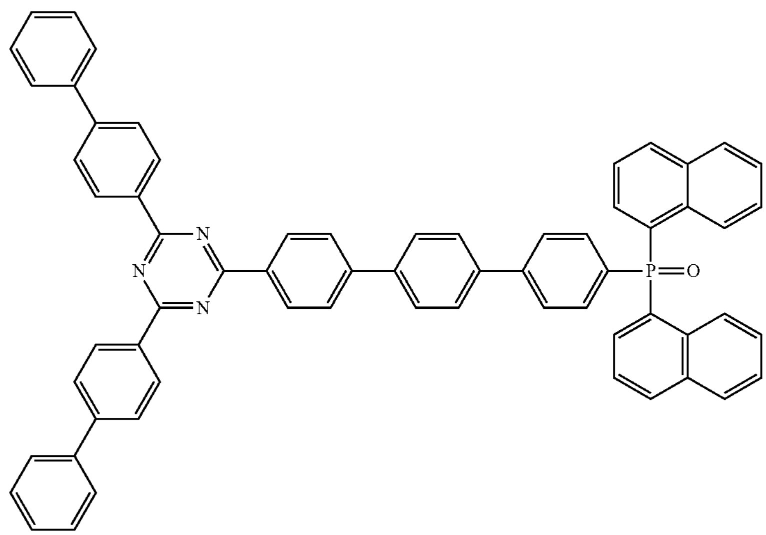
Compound 33
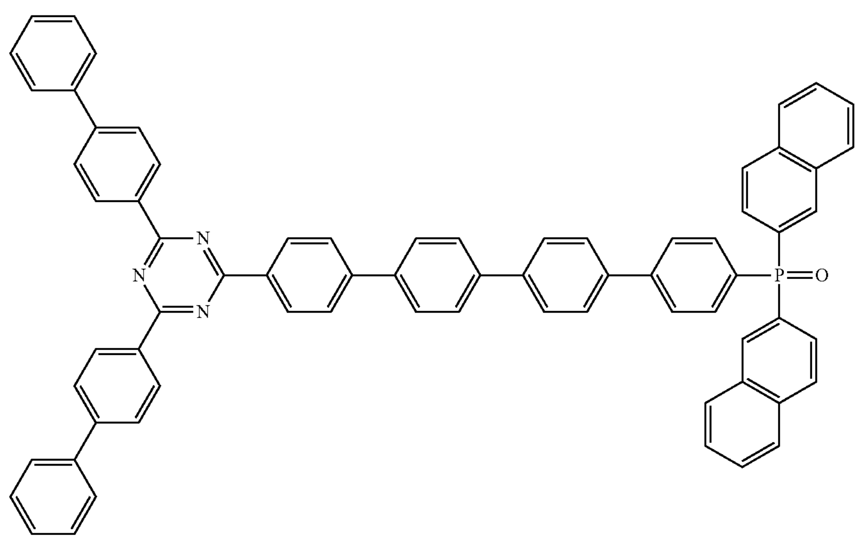
Compound 34
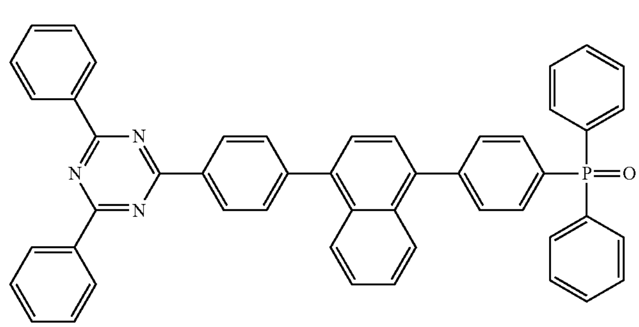

-continued
Compound 35
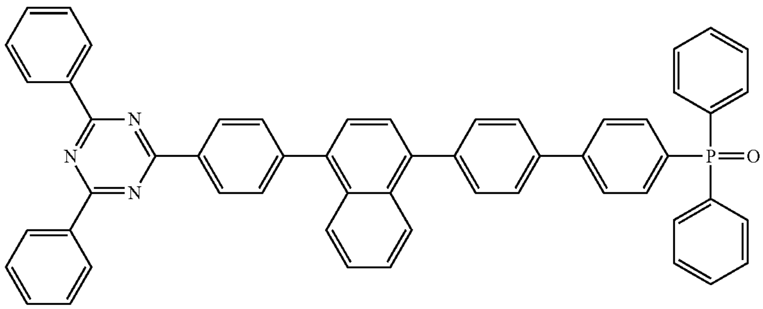
Compound 36
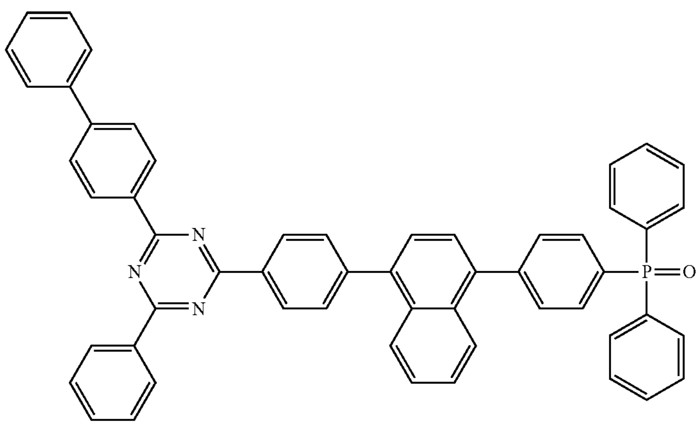
Compound 37
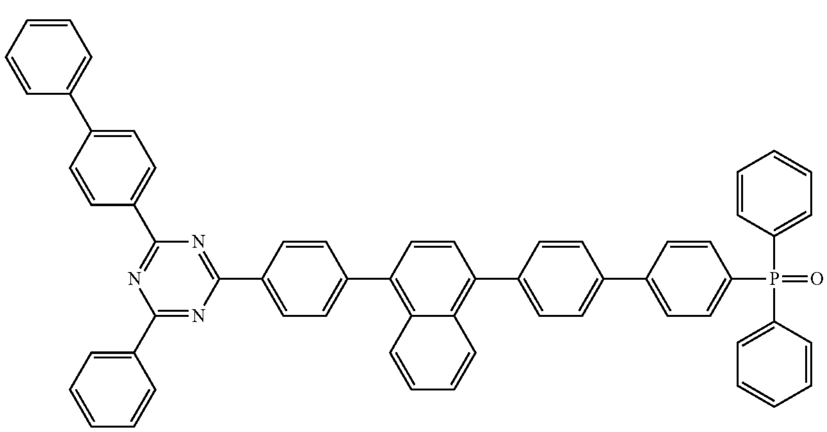

-continued
Compound 38
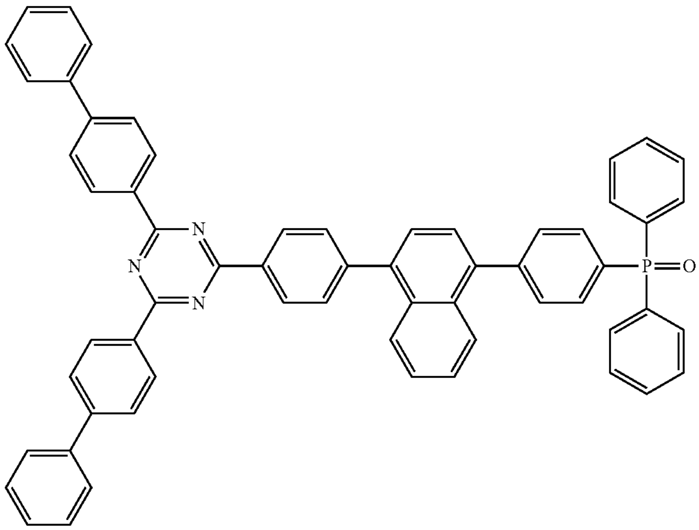
Compound 39
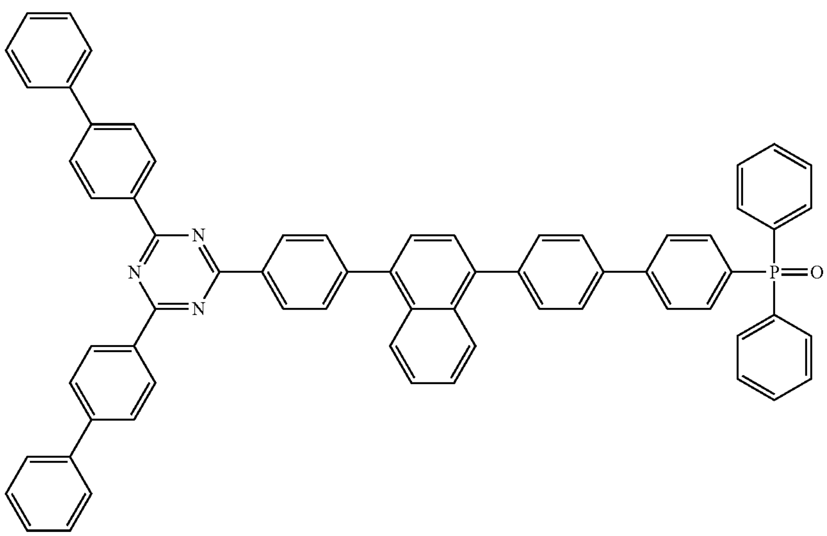
Compound 40
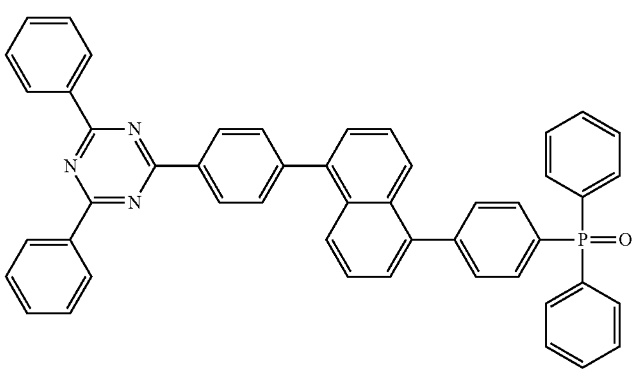

-continued
Compound 41
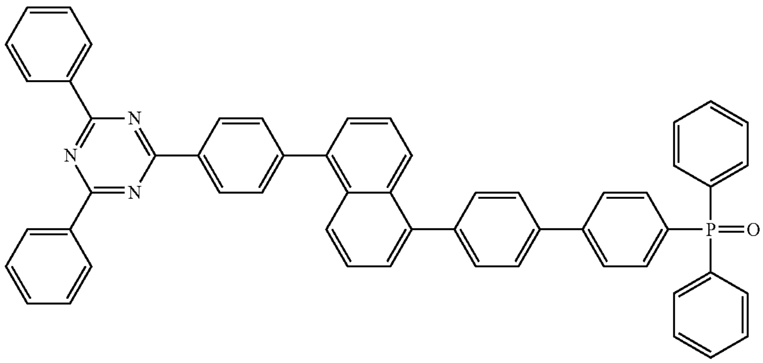
Compound 42
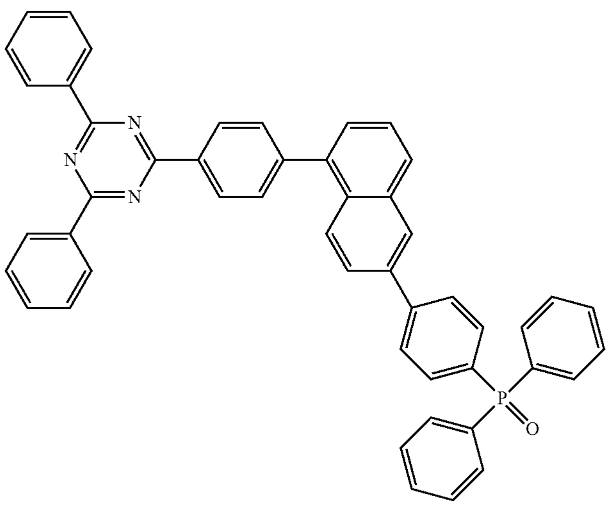
Compound 43
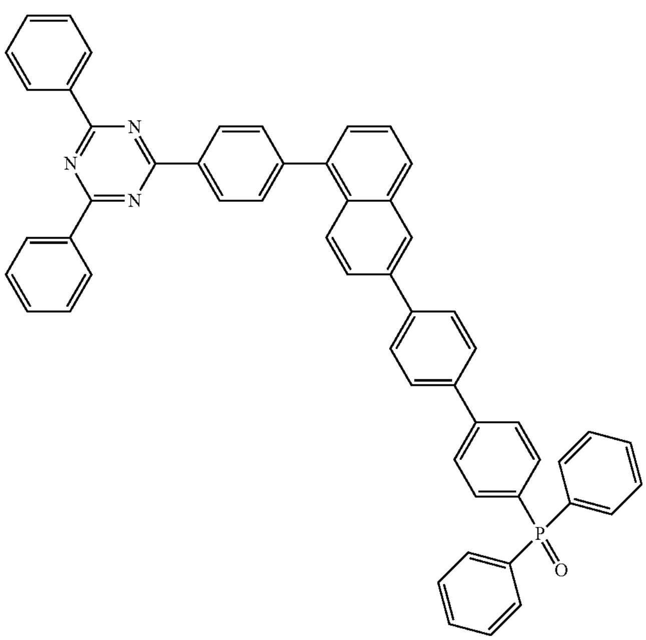

-continued
Compound 44
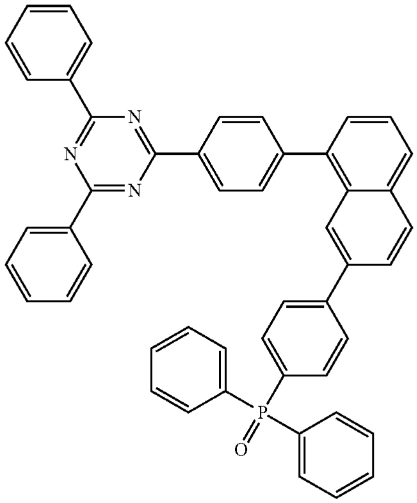
Compound 45
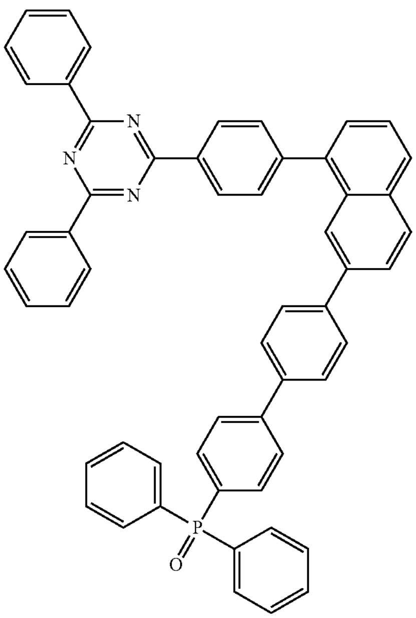
Compound 46
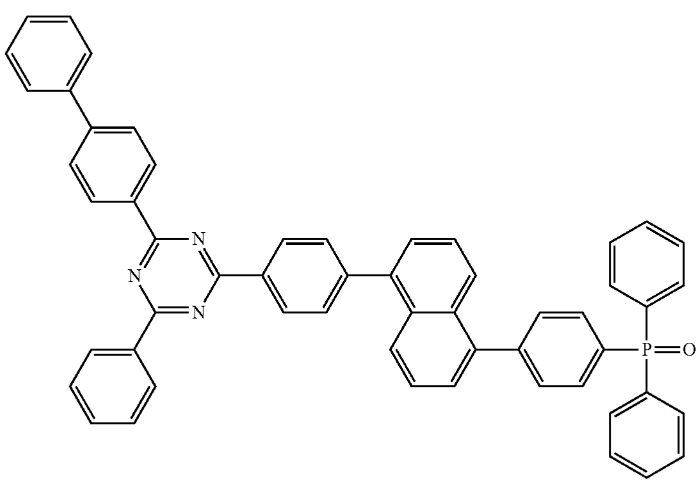

-continued
Compound 47
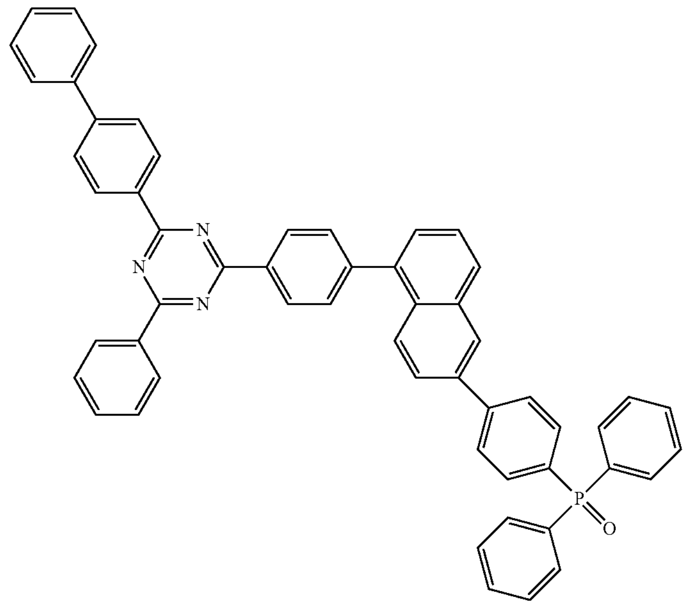
Compound 48
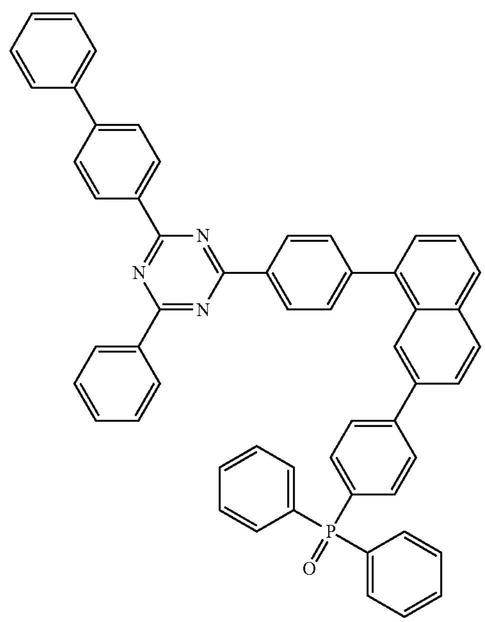
Compound 49
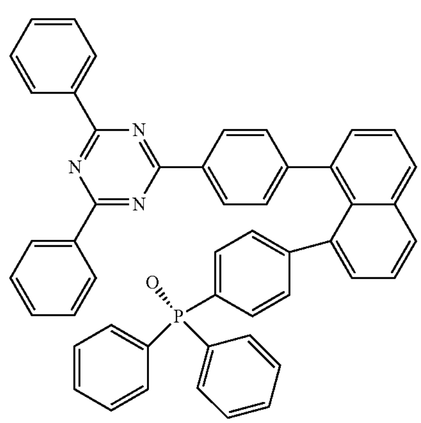

-continued
Compound 50
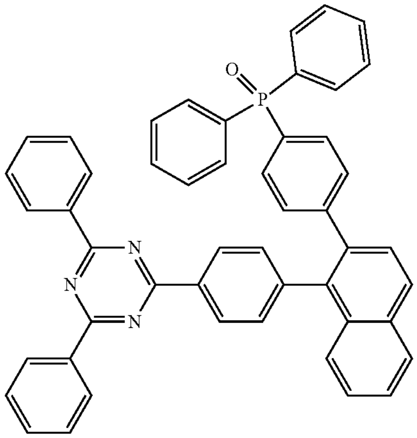
Compound 51
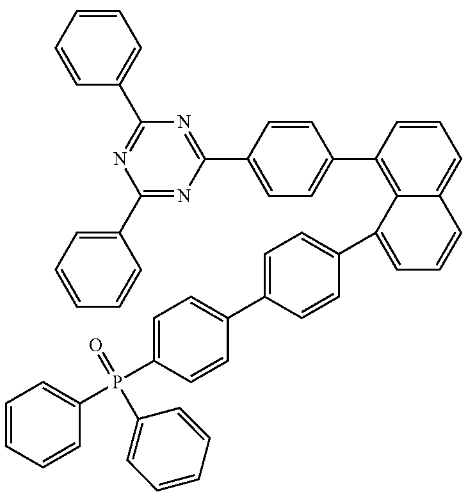
Compound 52
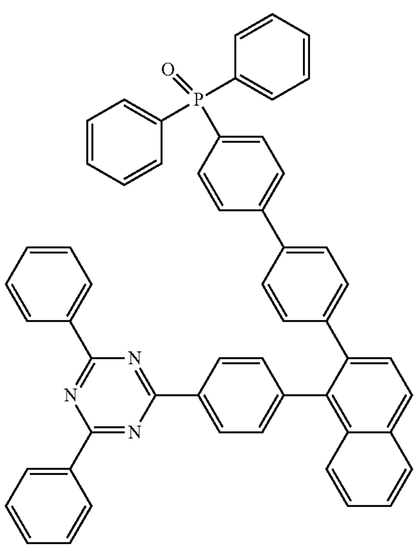

-continued
Compound 53
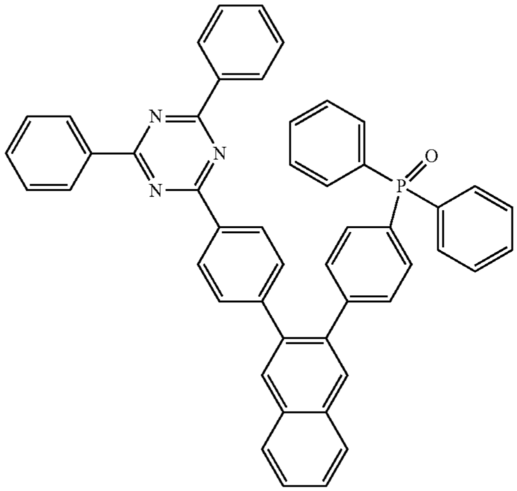
Compound 54
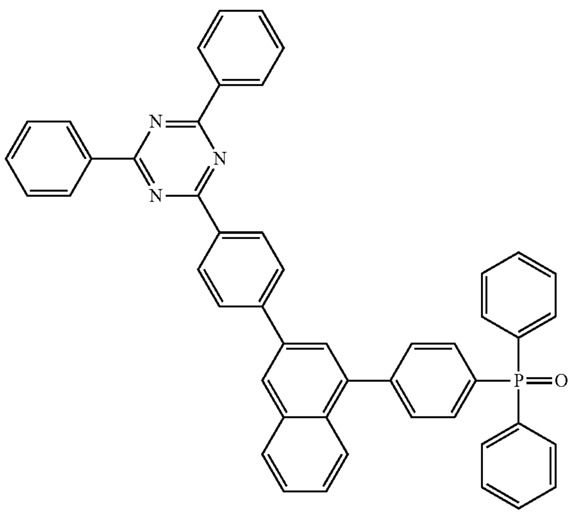
Compound 55
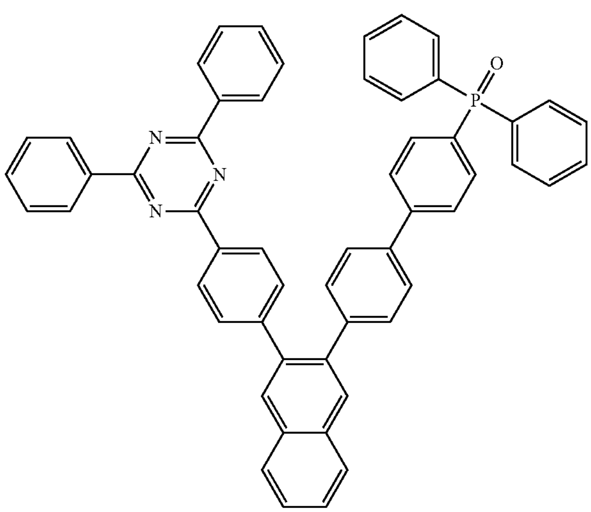

-continued
Compound 56
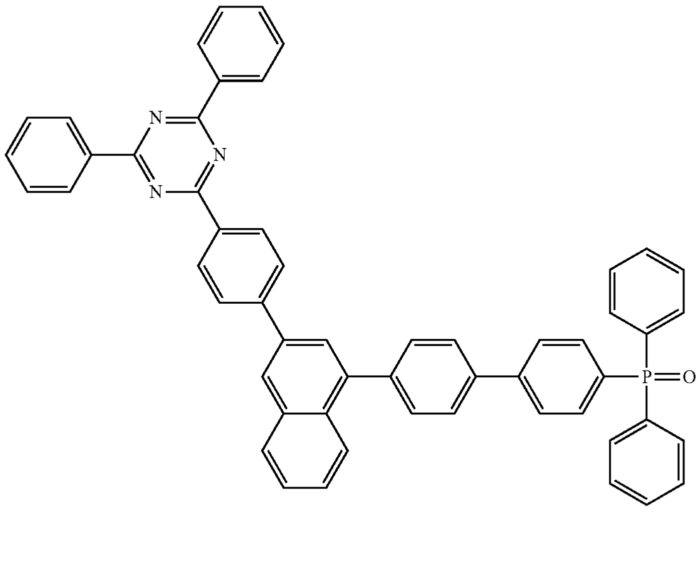
Compound 57
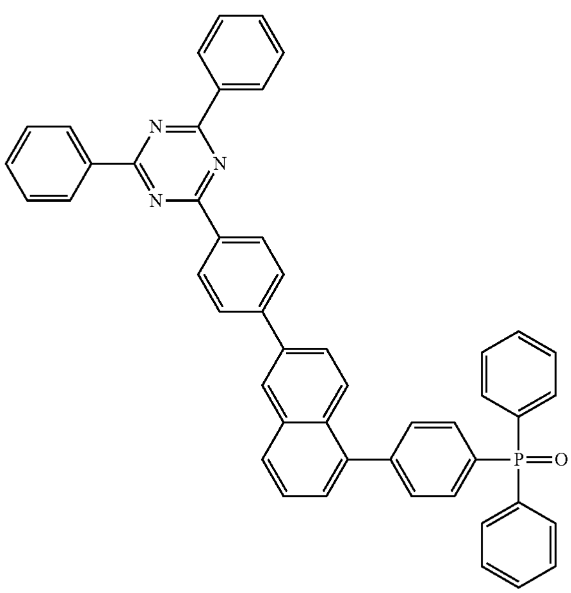

-continued
Compound 58
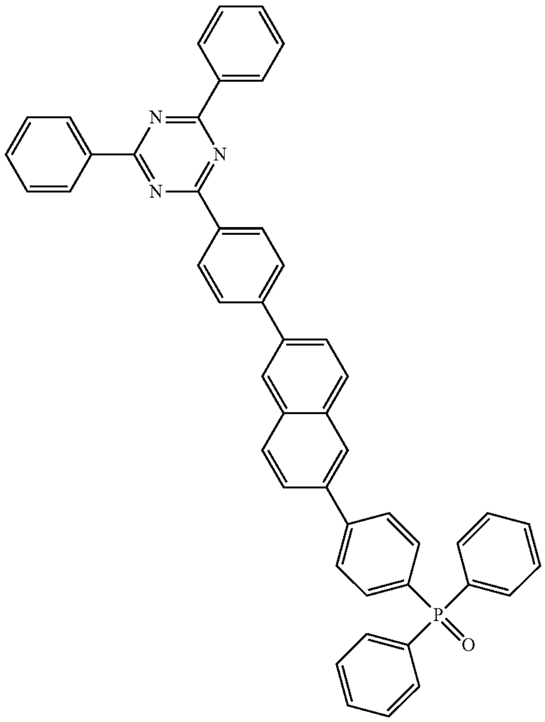
Compound 59
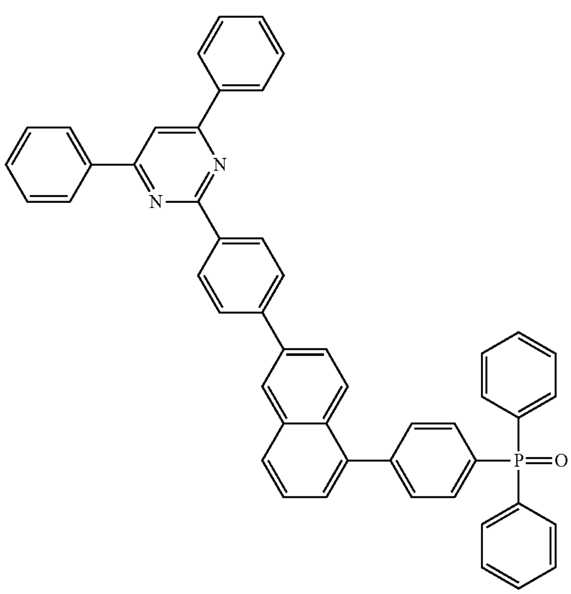

-continued
Compound 60
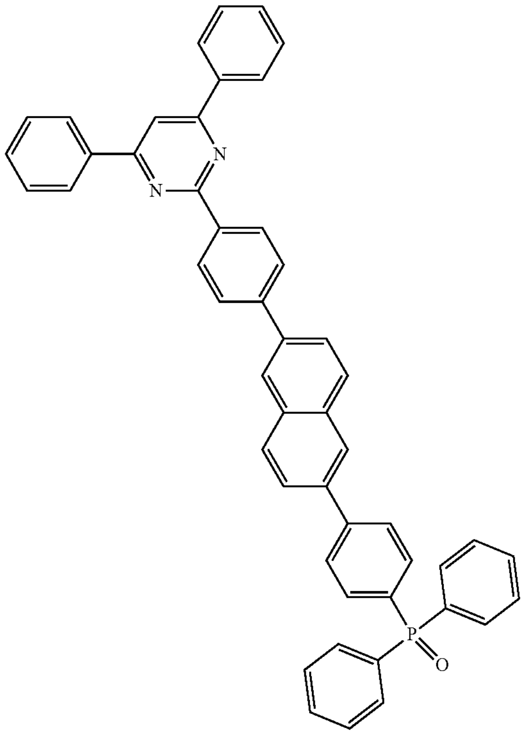
Compound 61
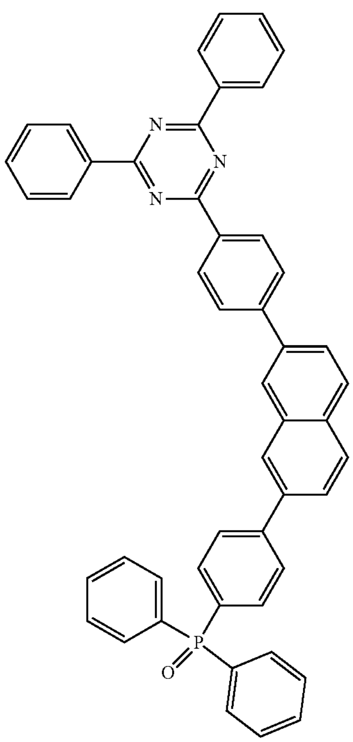

-continued
Compound 62
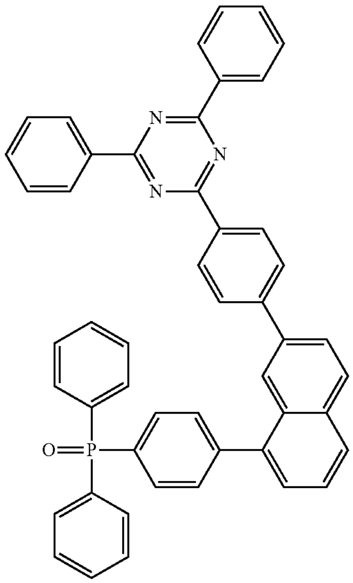
Compound 63
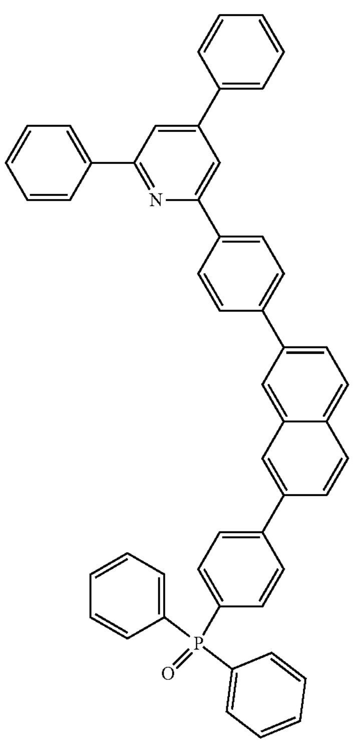

-continued
Compound 64
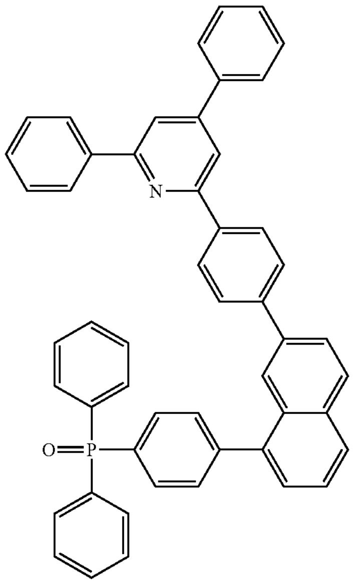
Compound 1
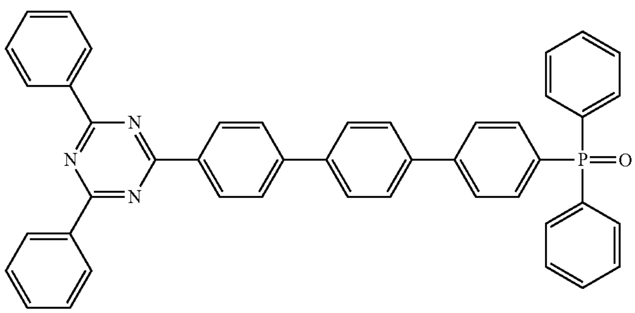
Compound 2
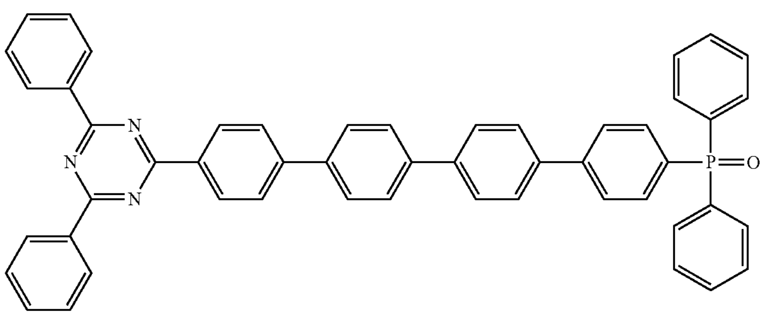
Compound 3
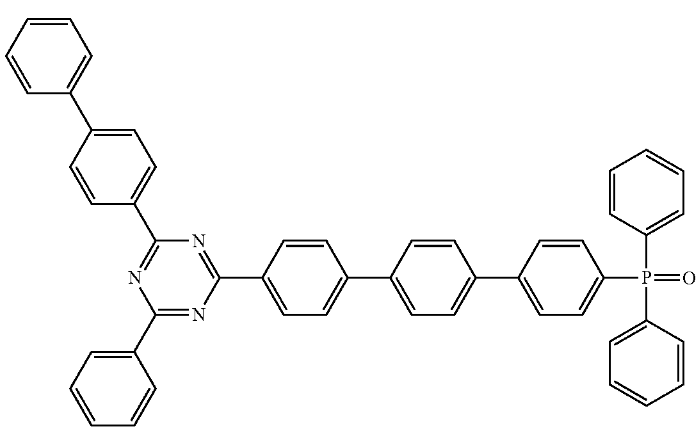

-continued
Compound 4
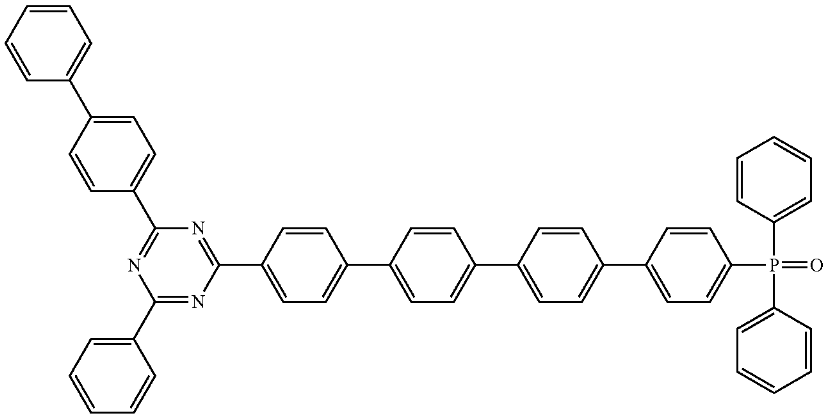
Compound 5
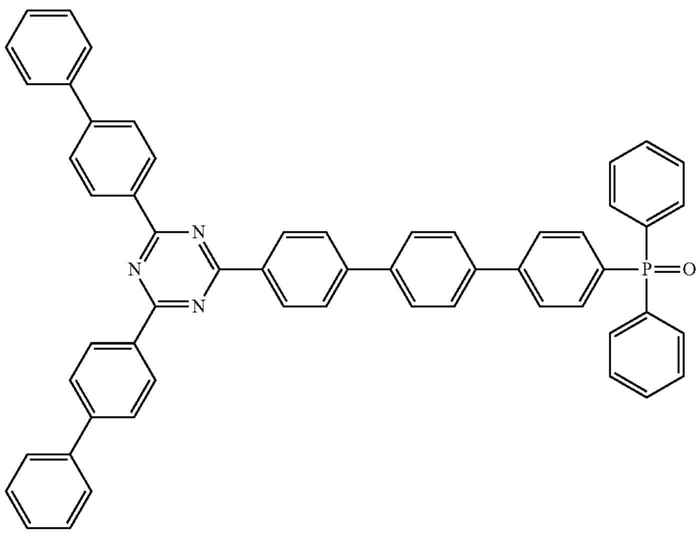
Compound 6
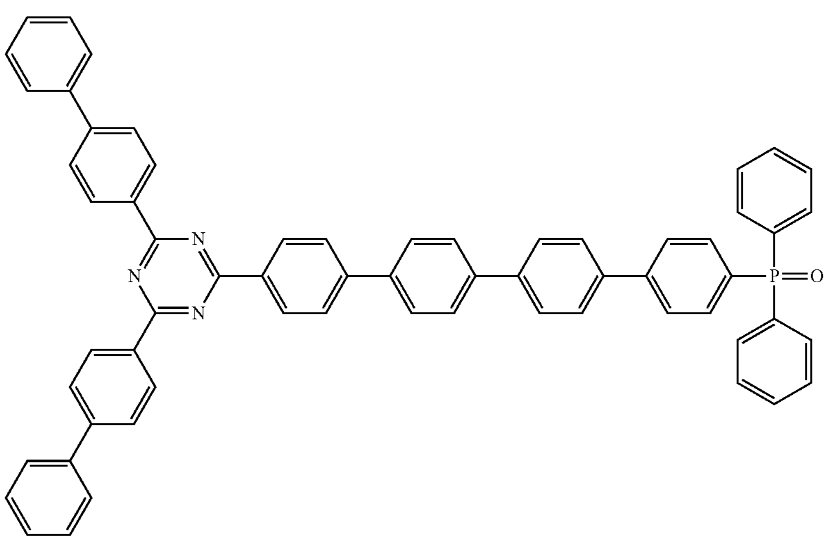

-continued
Compound 7
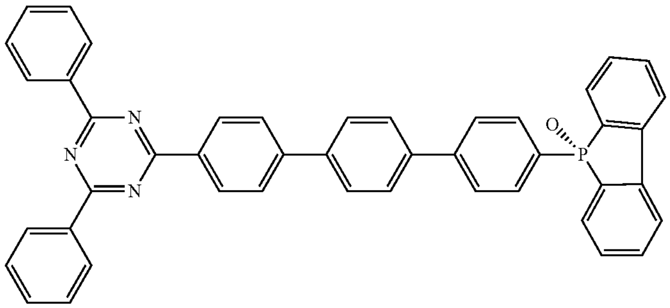
Compound 8
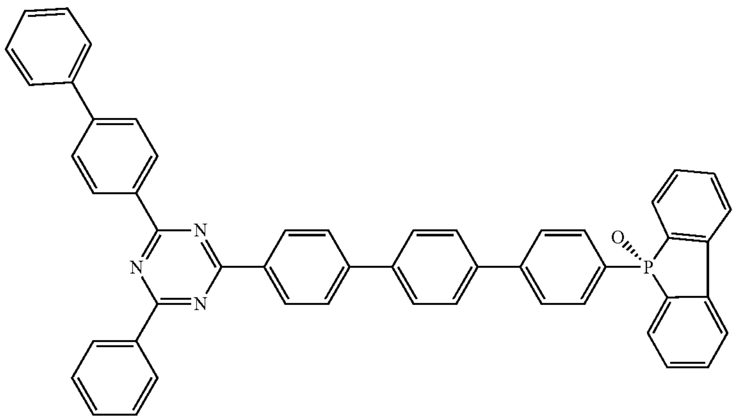
Compound 9
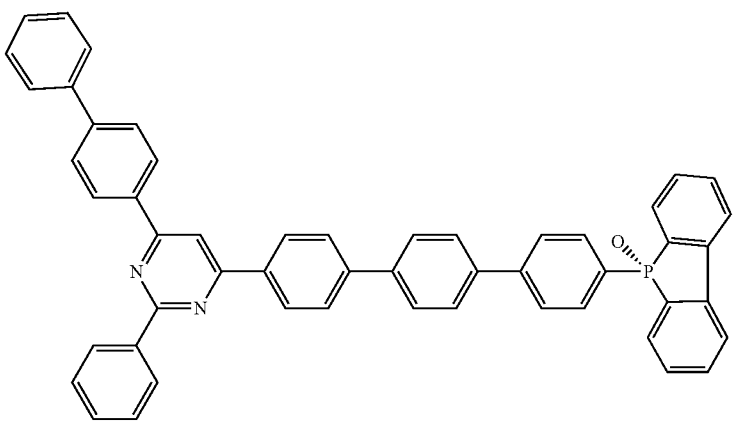
Compound 10
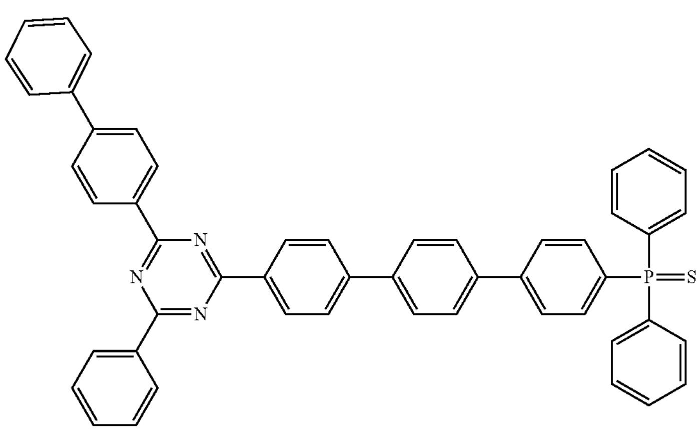

-continued
Compound 11
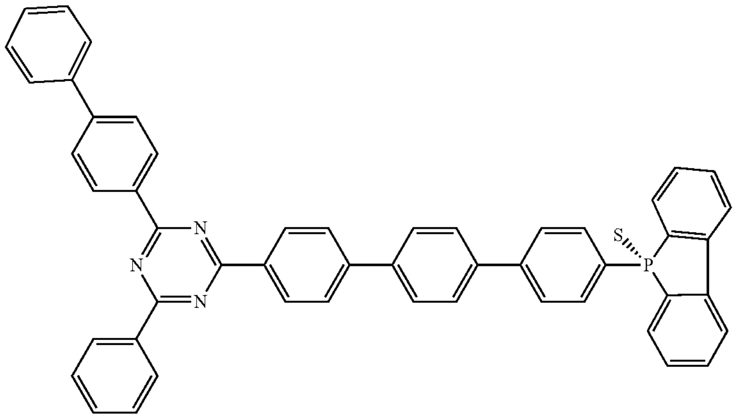
Compound 12
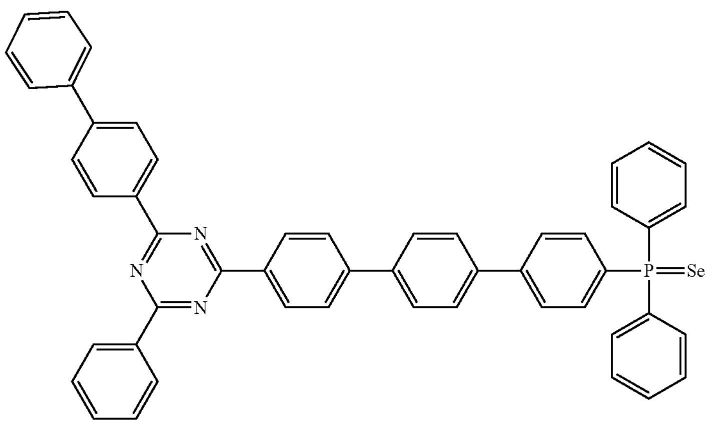
Compound 13
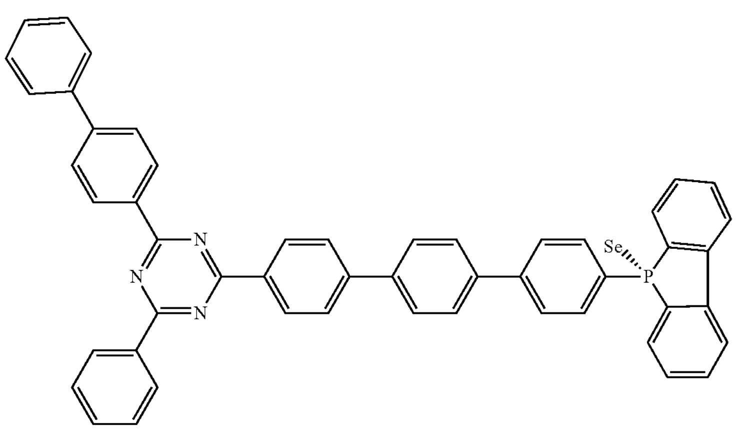

-continued
Compound 14
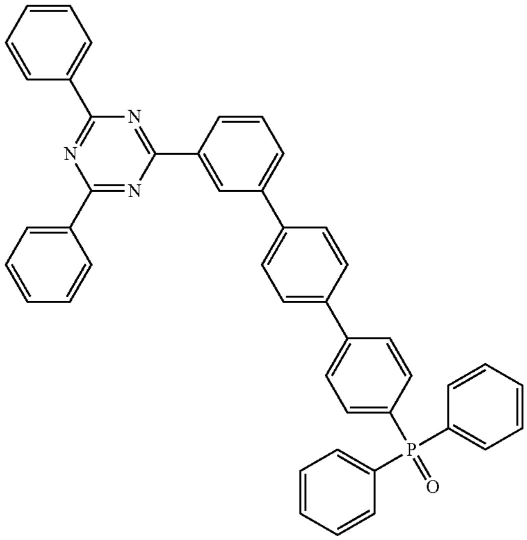
Compound 15
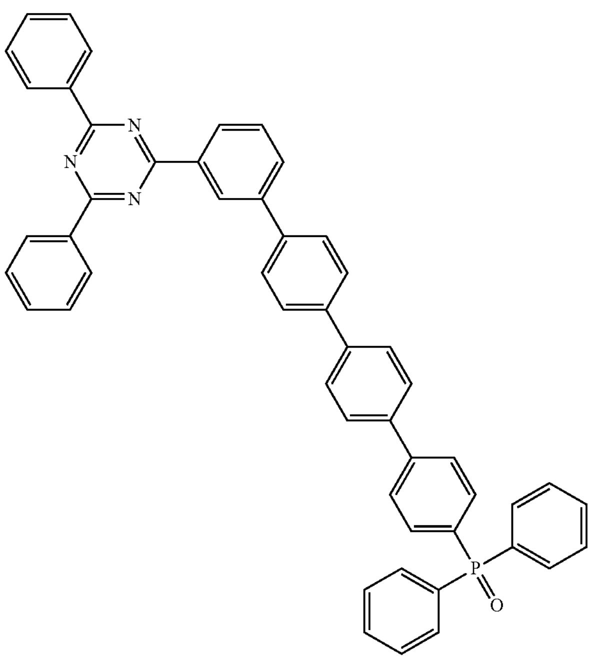

-continued
Compound 16
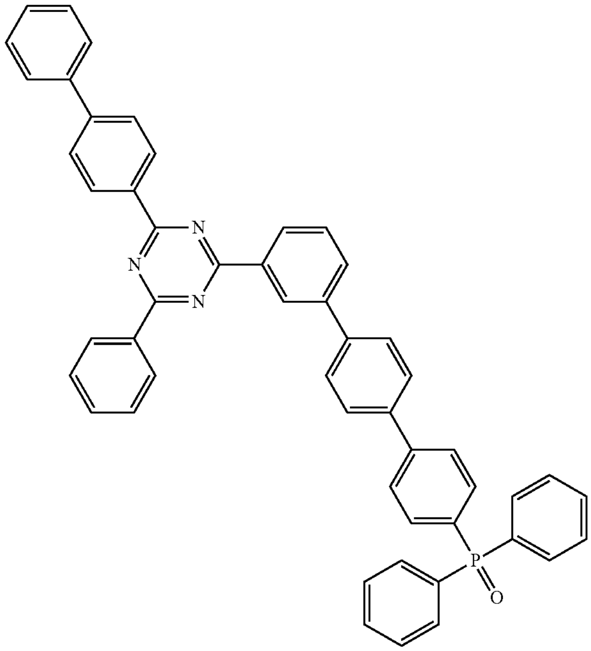
Compound 17
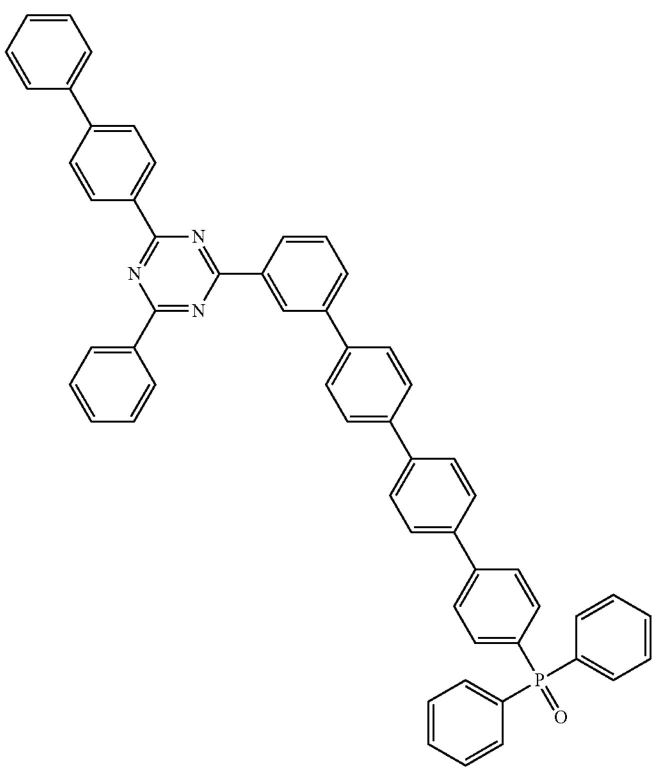

-continued
Compound 18
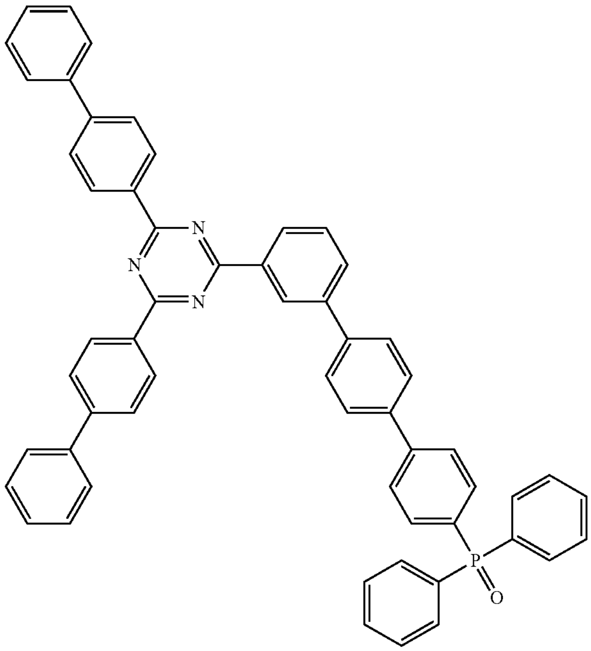
Compound 19
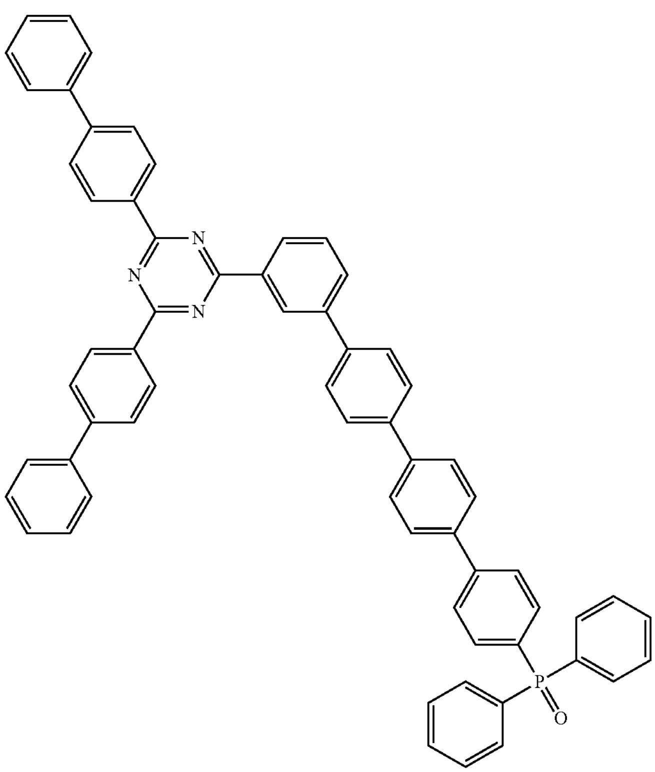

-continued
Compound 20
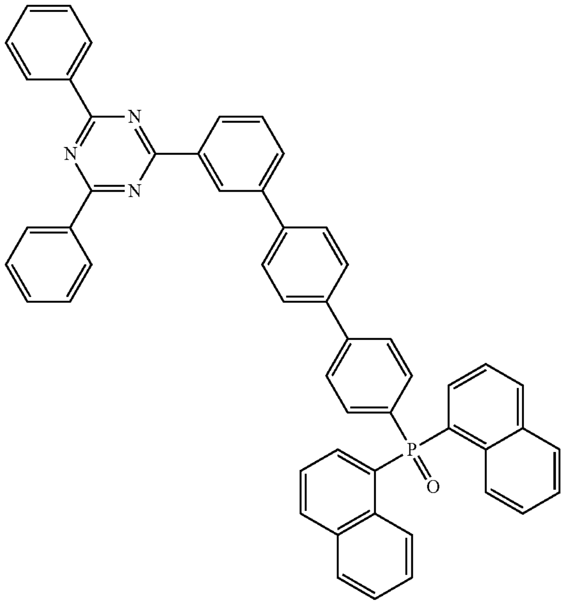
Compound 21
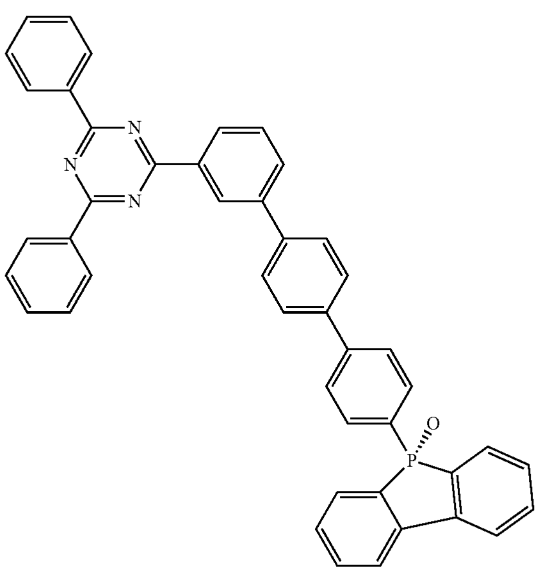

-continued
Compound 22
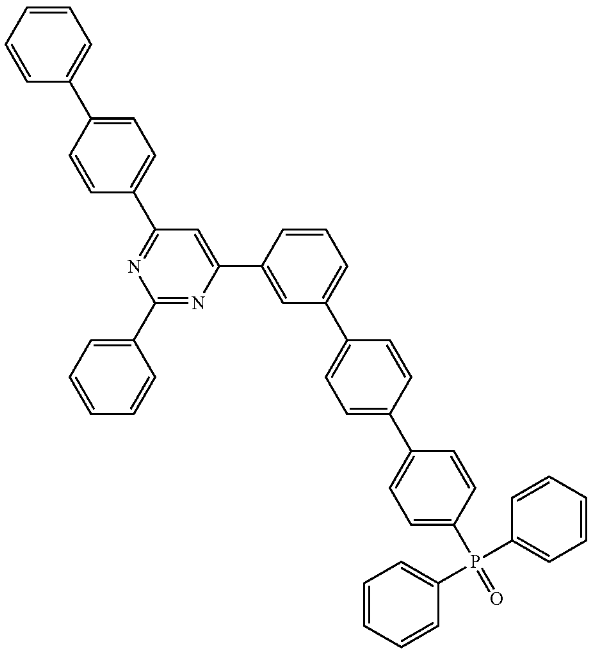
Compound 23
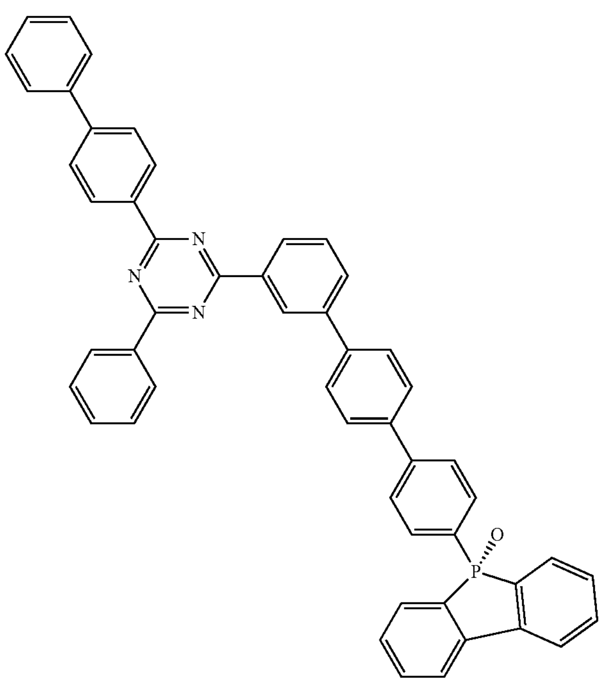

-continued
Compound 24
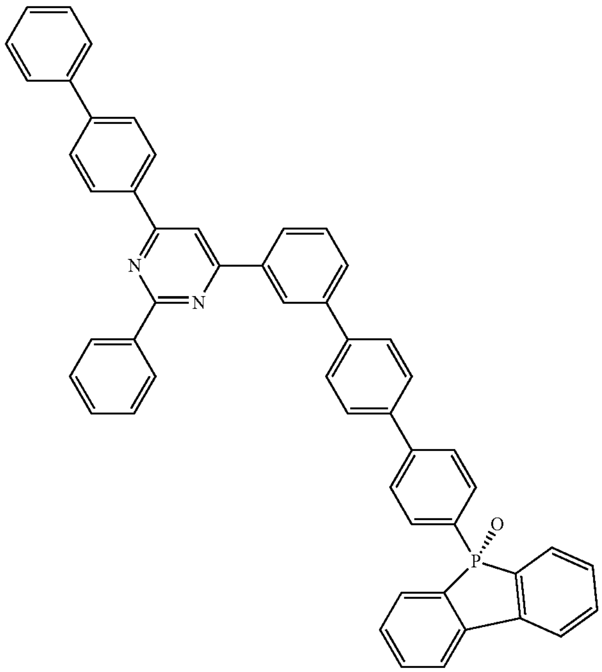
Compound 25
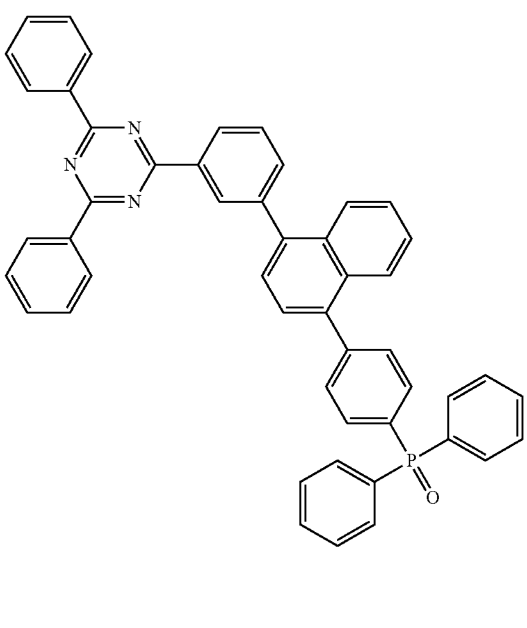

-continued
Compound 26
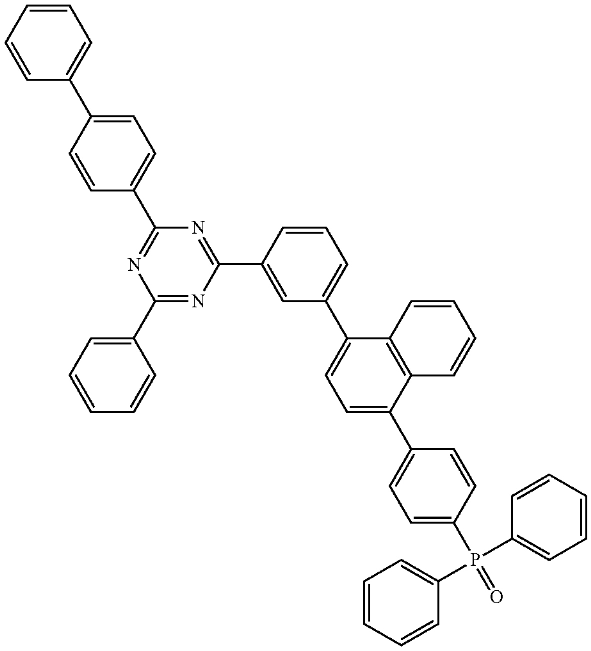
Compound 27
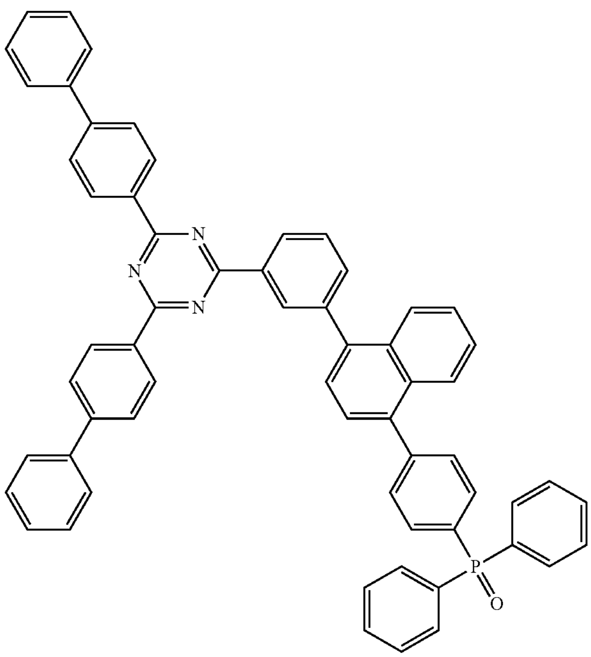
Compound 28
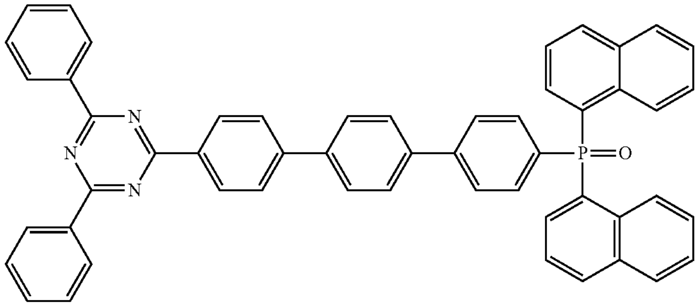

-continued
Compound 29
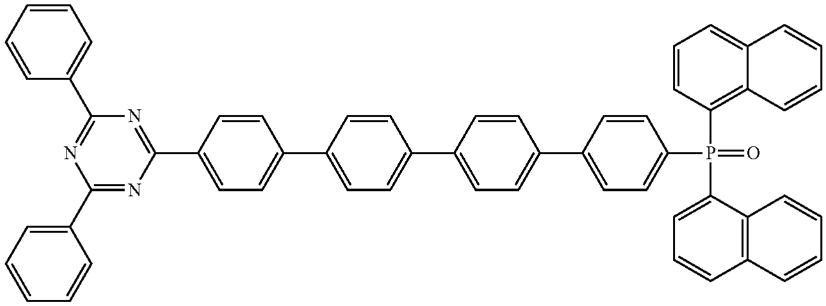
Compound 30
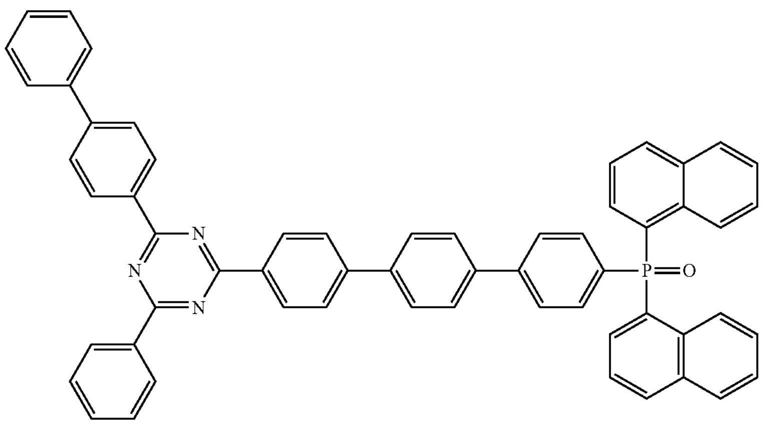
Compound 31
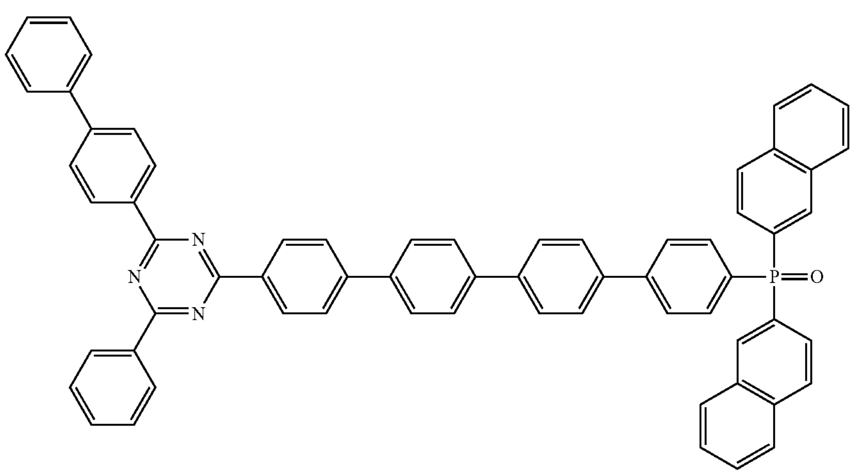

-continued
Compound 32
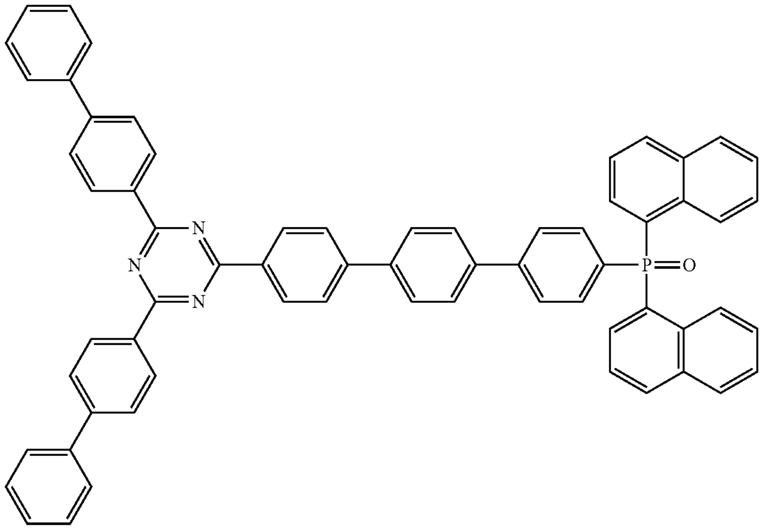
Compound 33
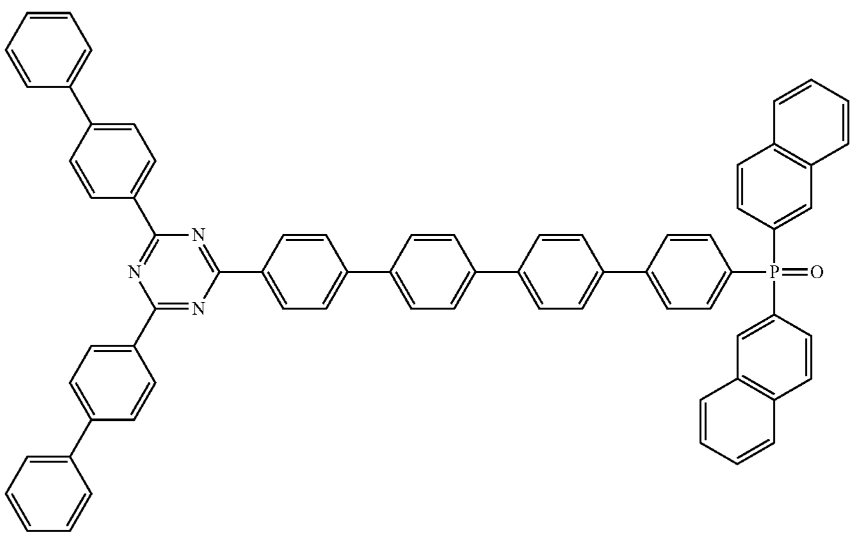
Compound 34
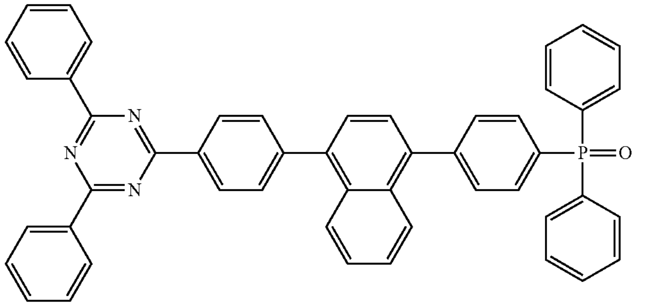

-continued
Compound 35
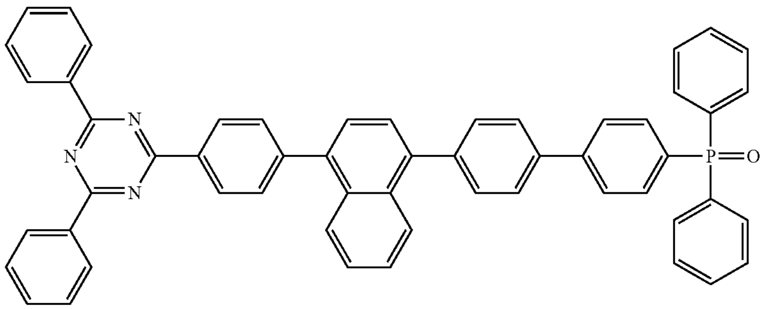
Compound 36
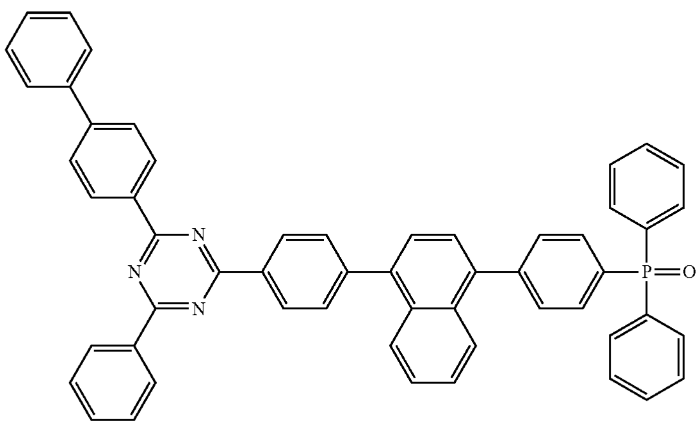
Compound 37
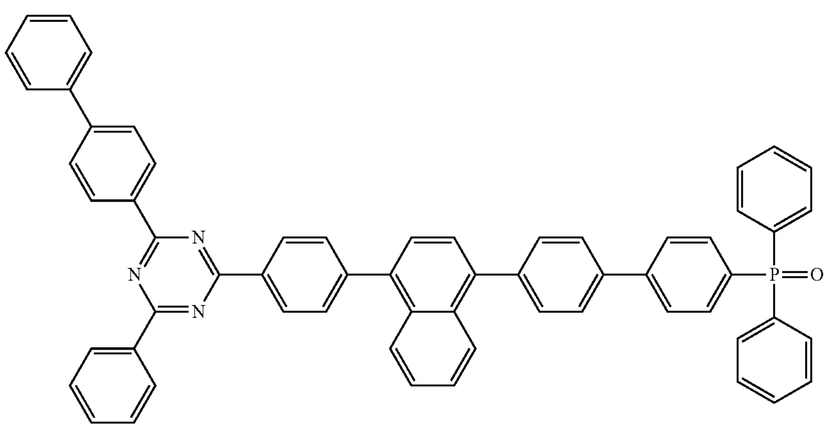

-continued
Compound 38
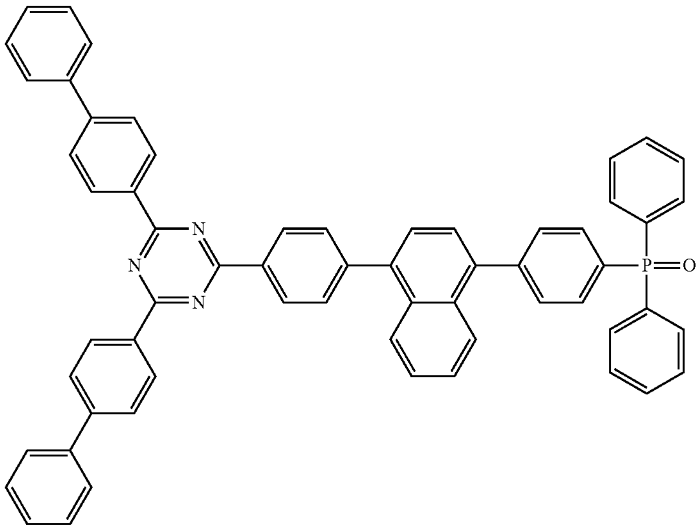
Compound 39
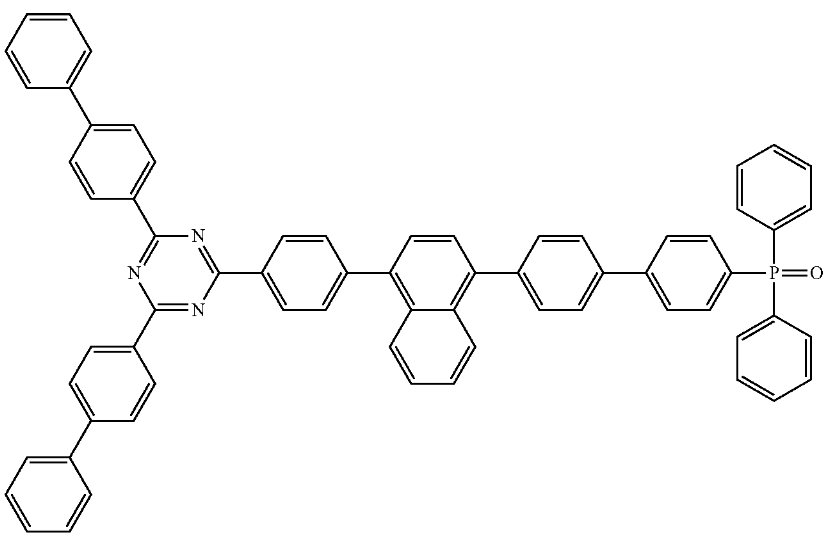
Compound 40
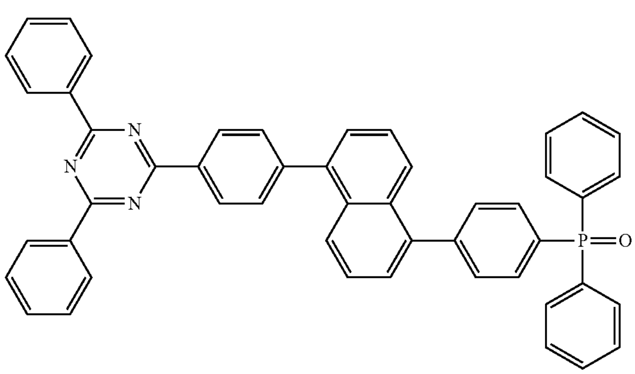

-continued
Compound 41
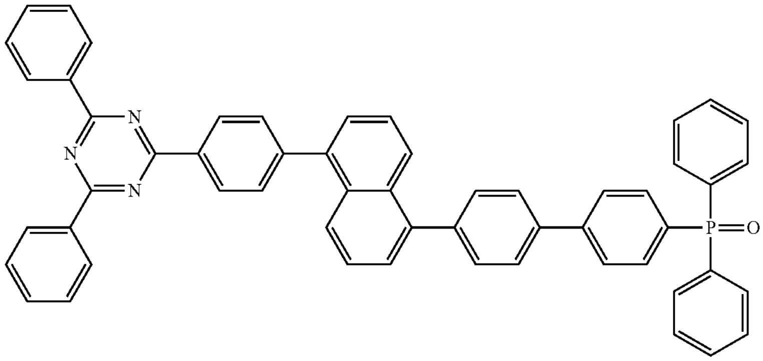
Compound 42
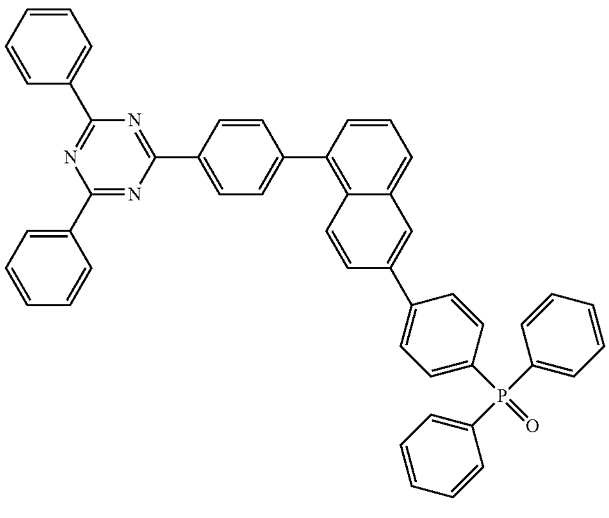
Compound 43
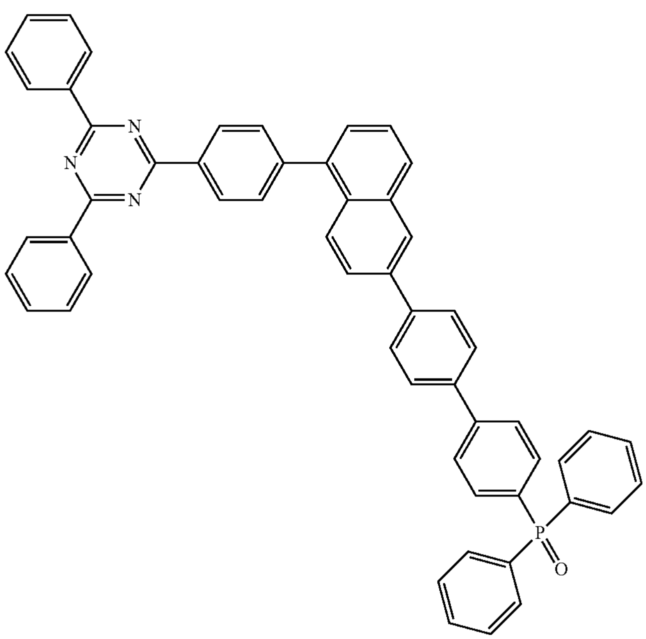

-continued
Compound 44
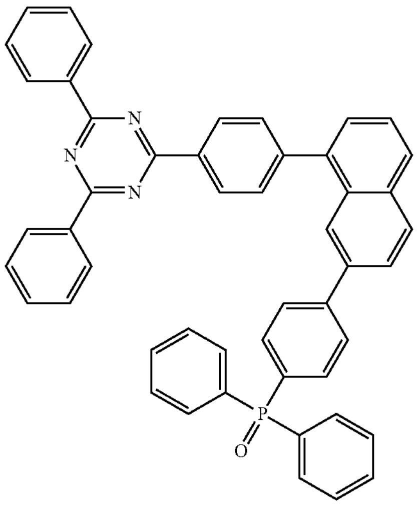
Compound 45
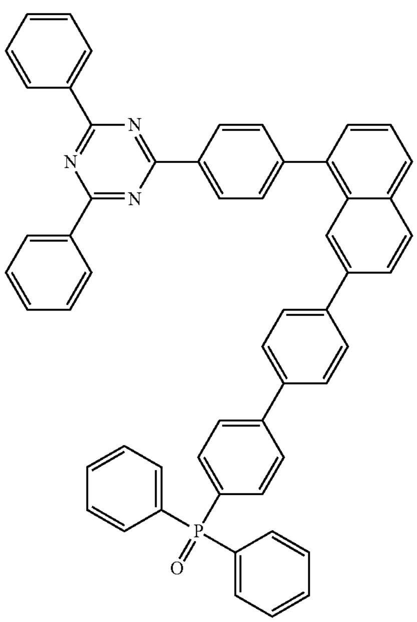
Compound 46
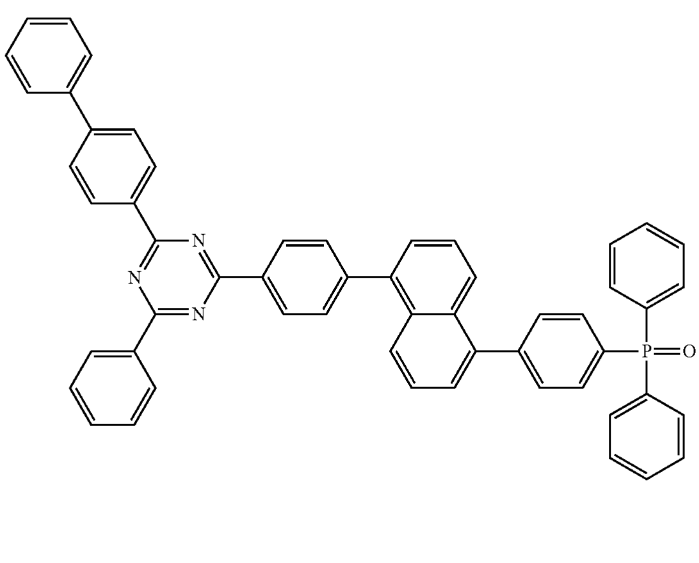

-continued
Compound 47
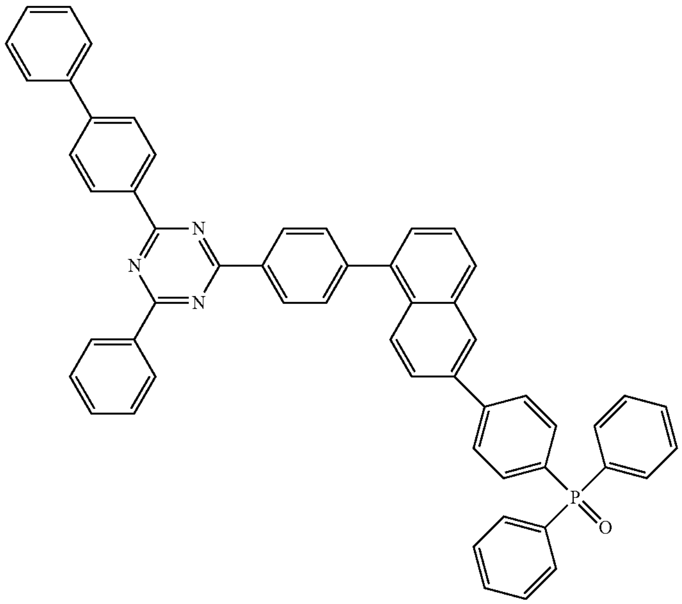
Compound 48
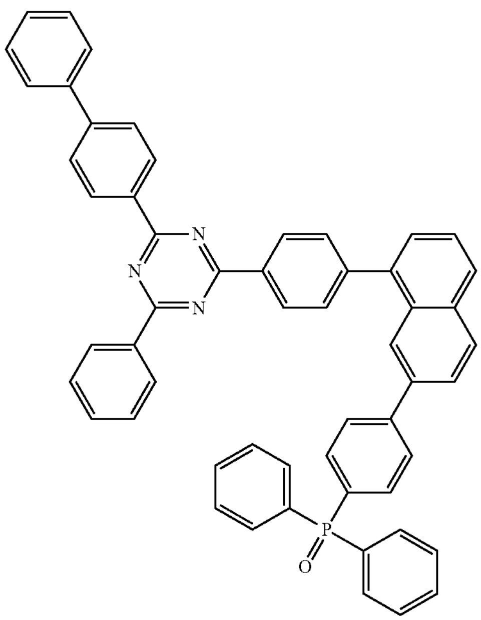
Compound 49
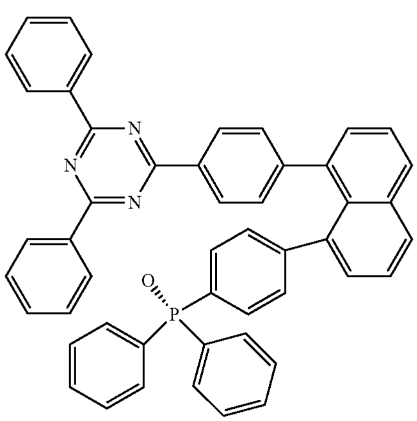

-continued
Compound 50
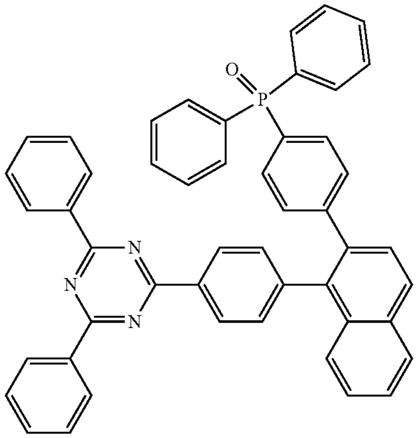
Compound 51
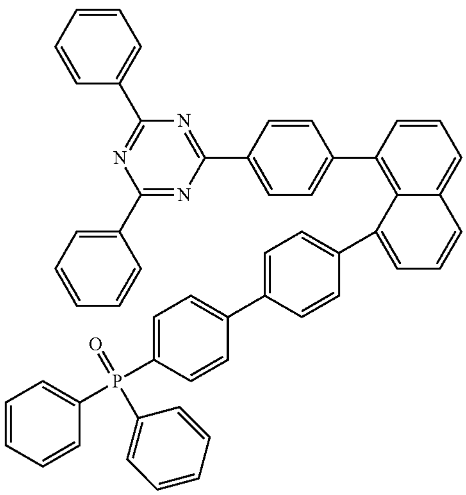
Compound 52
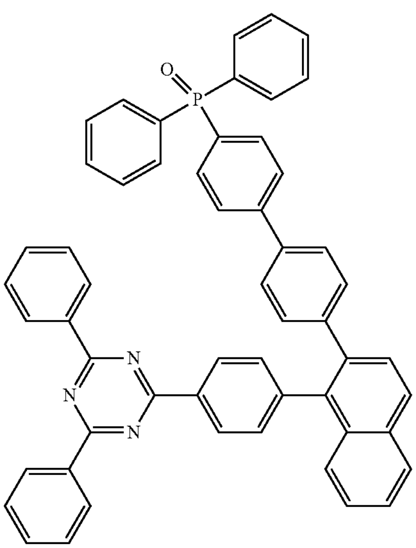

-continued
Compound 53
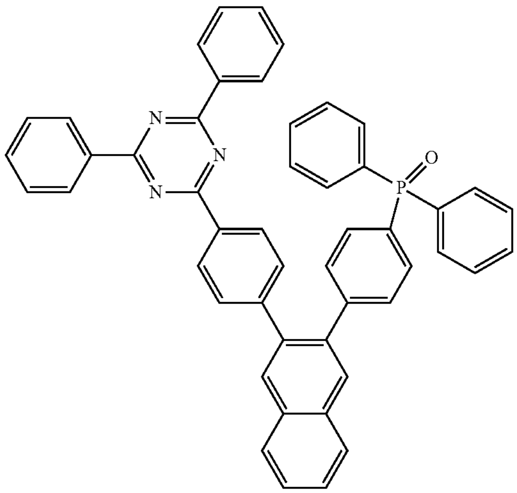
Compound 54
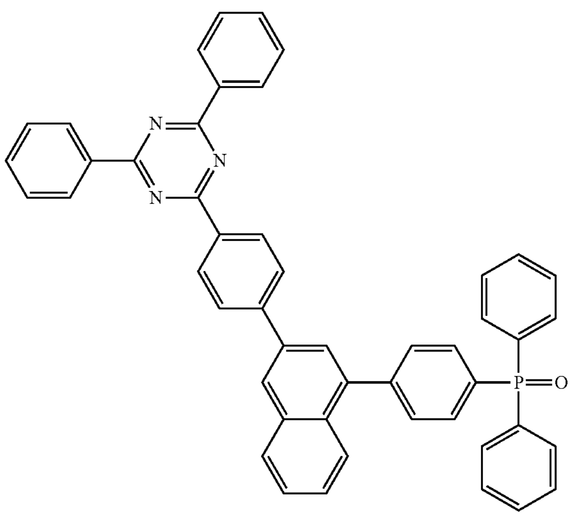
Compound 55
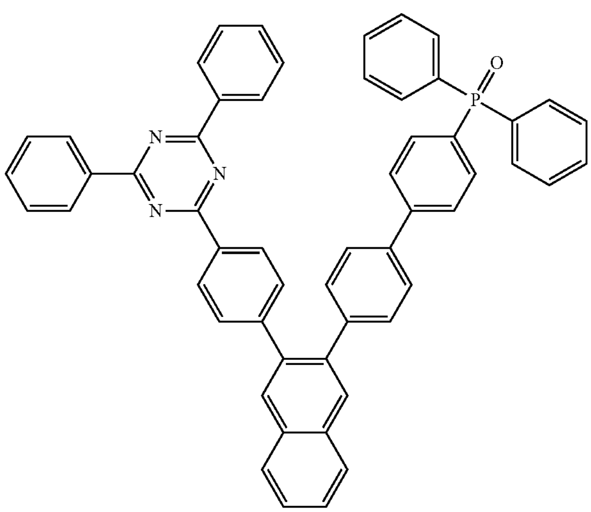

-continued
Compound 56
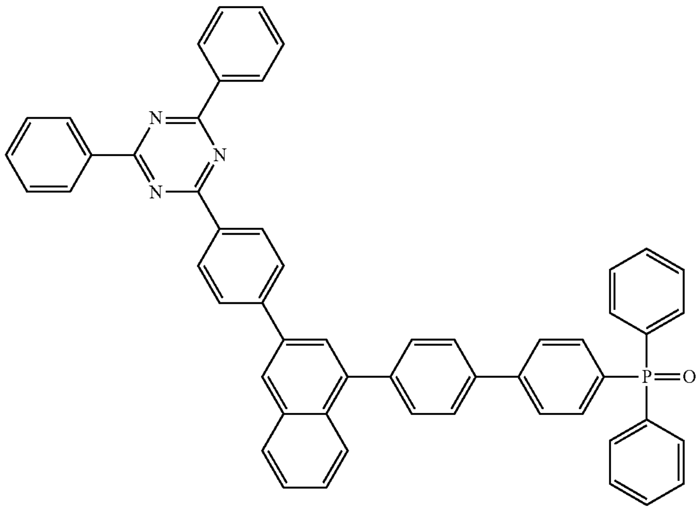
Compound 57
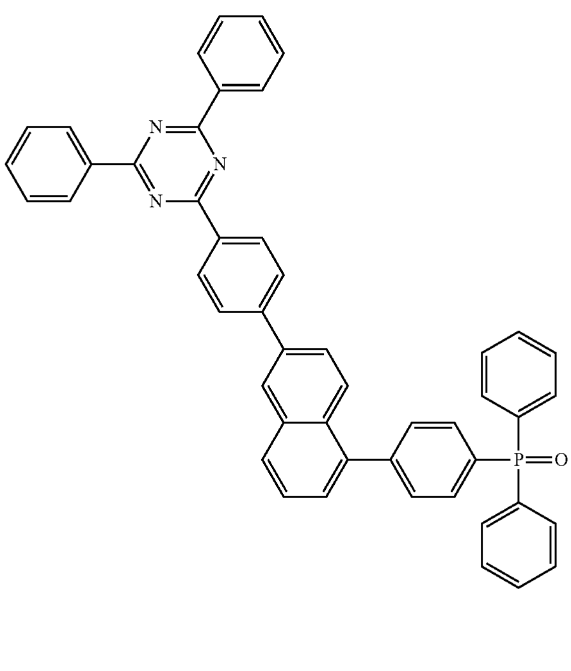

-continued
Compound 58
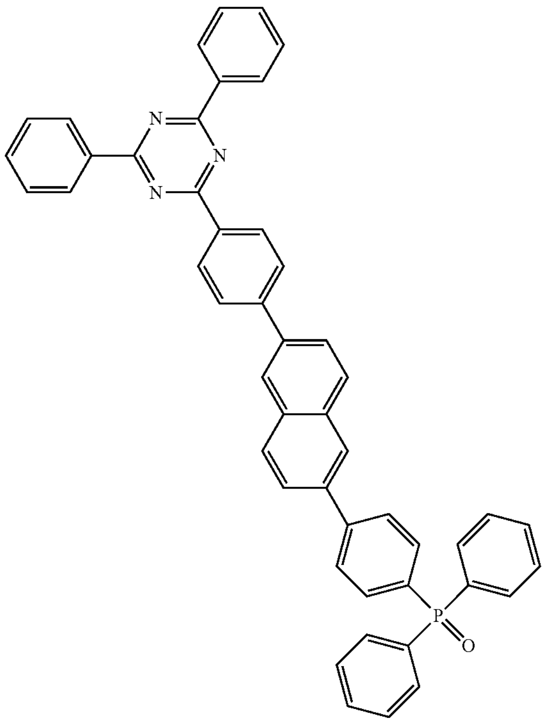
Compound 59
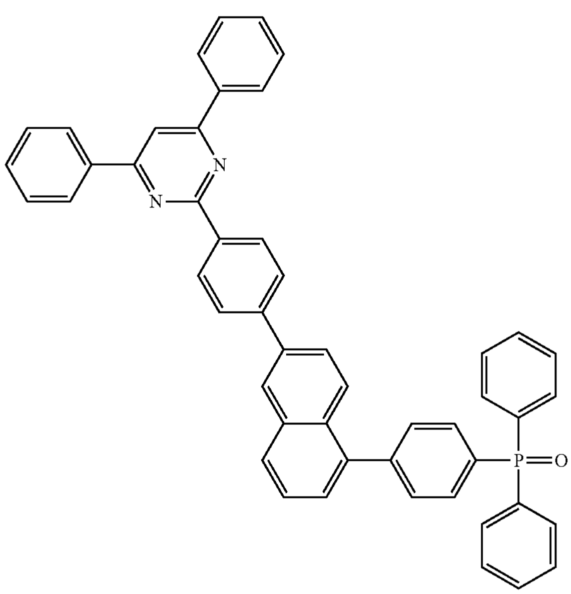

-continued
Compound 60
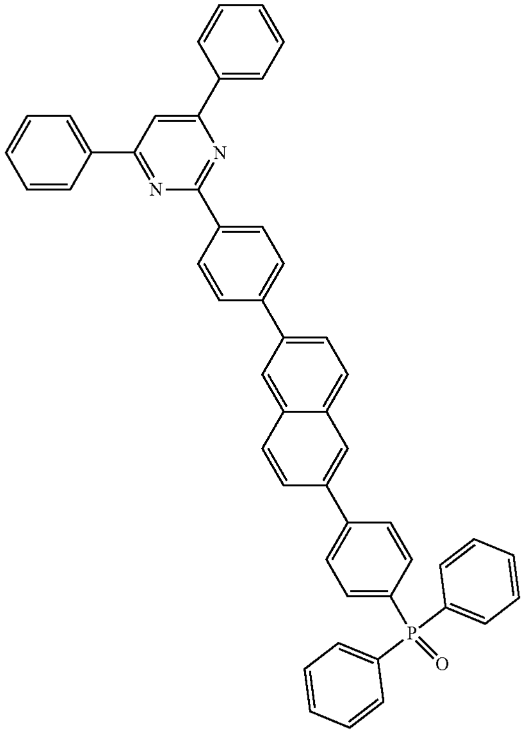
Compound 61
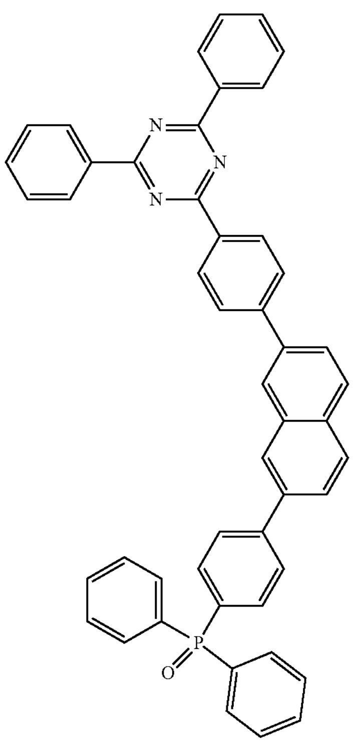

-continued
Compound 62
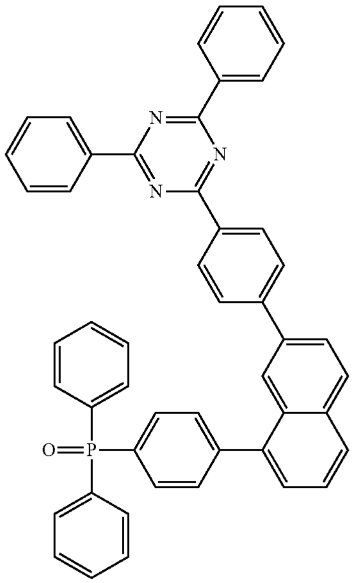
Compound 63
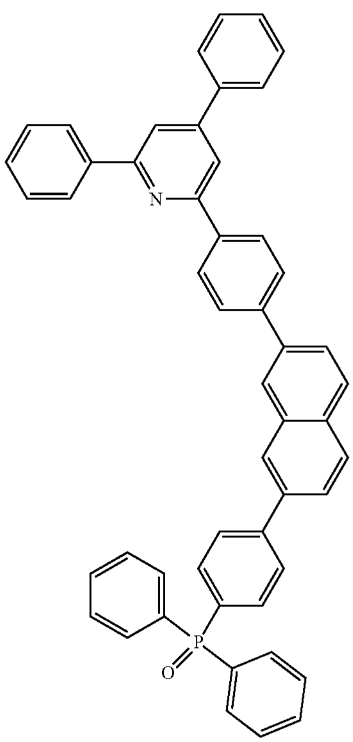

-continued
Compound 64
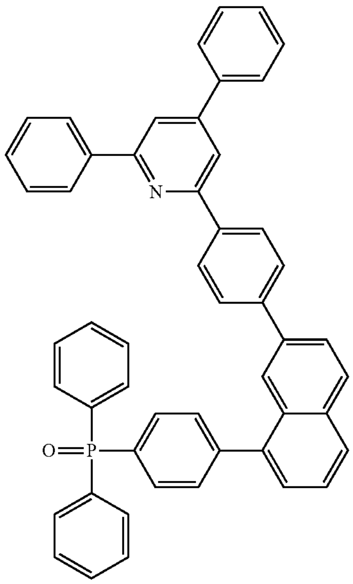
Compound 65
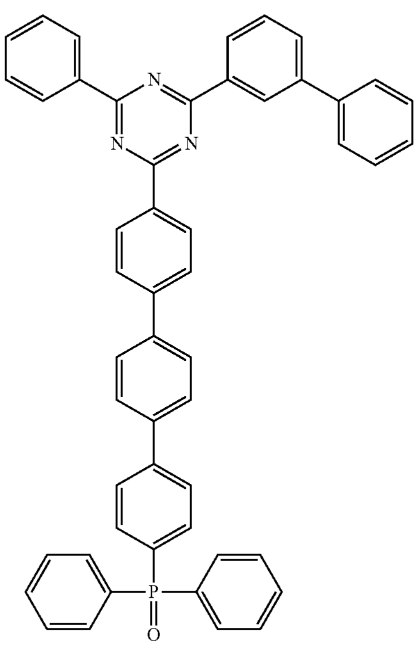

-continued
Compound 66
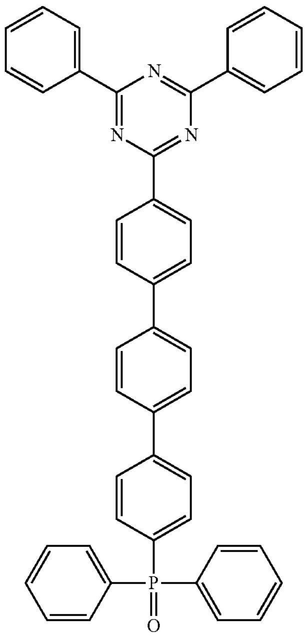
Compound 67
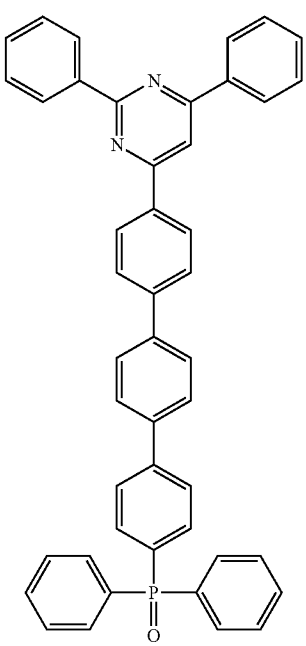

-continued
Compound 68
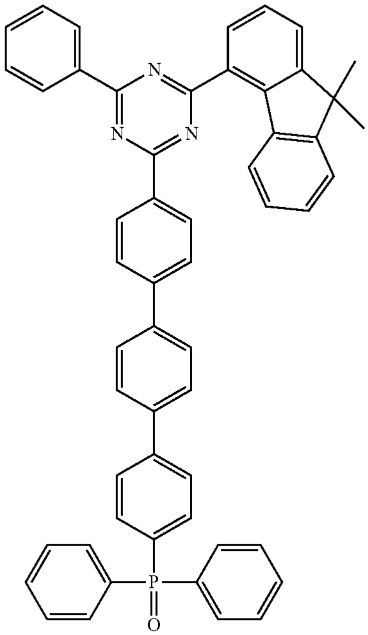
Compound 69
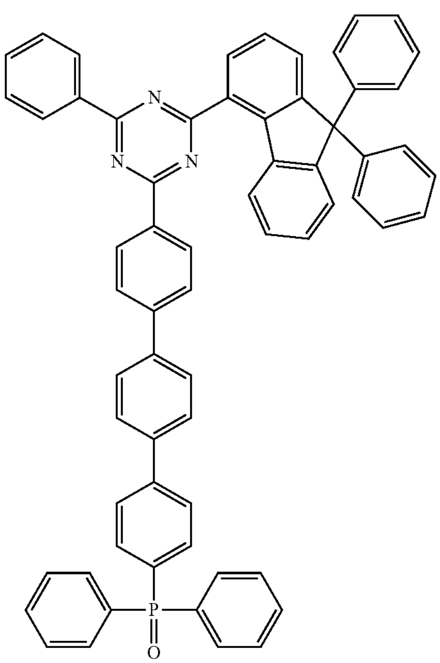

-continued
Compound 70
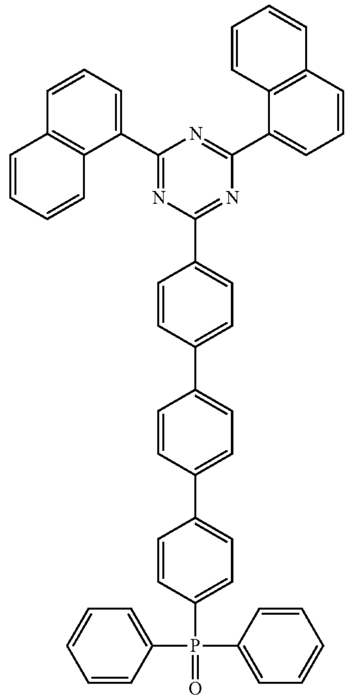
Compound 71
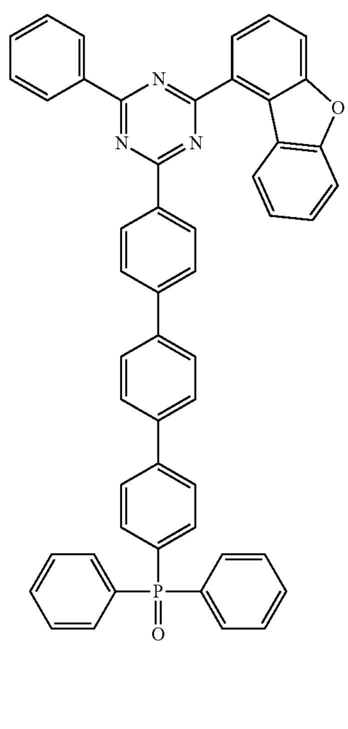

-continued
Compound 72
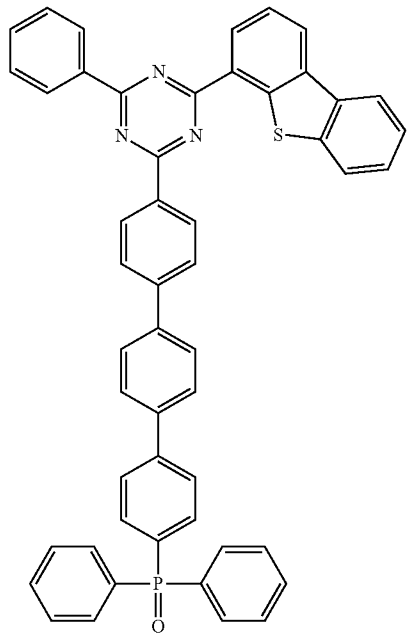
Compound 73
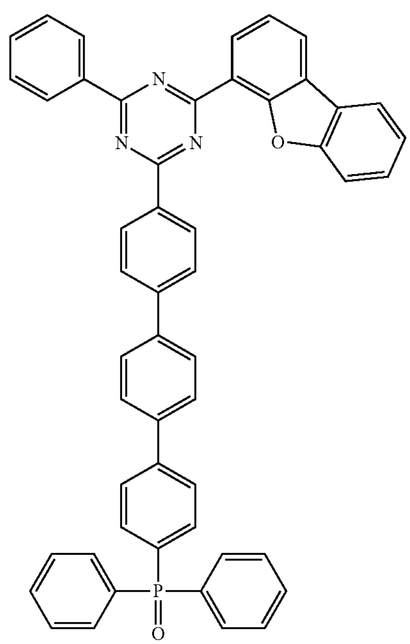

-continued

Compound 74

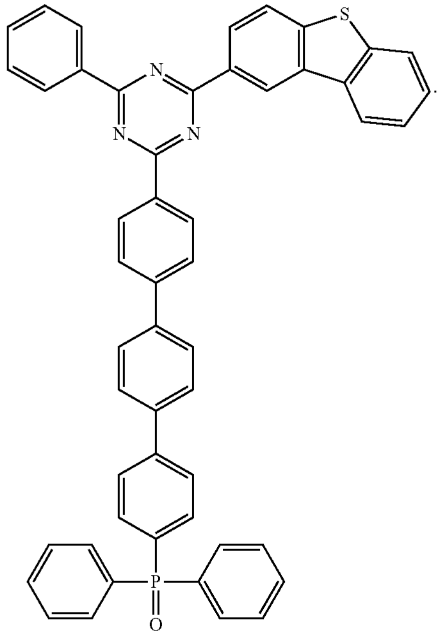

6. An organic light emitting device comprising:

a first electrode;

a second electrode; and one or more organic material layers disposed between the first electrode and the second electrode, wherein the one or more organic material layers comprise the compound of claim 1.

7. The organic light emitting device of claim 6, wherein the organic material layer comprises one or more layers of an electron transport layer; an electron injection layer; or a layer which transports and injects electrons simultaneously, and the one or more layers comprise the compound.

8. The organic light emitting device of claim 6, wherein the organic material layer comprises a light emitting layer, and the light emitting layer comprises the compound as a host of the light emitting layer.

9. The organic light emitting device of claim 6, wherein the organic material layer comprises one or more layers of a hole injection layer; a hole transport layer; or a layer which injects and transports holes simultaneously, and the one or more layers comprise the compound.

10. The organic light emitting device of claim 6, wherein the organic material layer comprises a light emitting layer, and the light emitting layer comprises the compound as a host and another organic compound, a metal, or a metal compound as a dopant.

11. A compound represented by the following Chemical Formula 1:

[Chemical Formula 1]

$$(HAr)_a \text{—}(L_1\text{—}Ar_1\text{—}L_2\text{—}(R)_b)_c$$

in Chemical Formula 1, $L_1$ is a substituted or unsubstituted arylene group, $L_2$ is a substituted or unsubstituted phenylene group; a substituted or unsubstituted biphenylylene group; a substituted or unsubstituted terphenylene group; a substituted or unsubstituted quaterphenylene group; a substituted or unsubstituted naphthylene group; a substituted or unsubstituted anthracenylene group; a substituted or unsubstituted phenanthrenylene group; a substituted or unsubstituted triphenylenylene group; or a substituted or unsubstituted pyrenylene group, $Ar_1$ is a single bond; or a substituted or unsubstituted arylene group, a to c are the same as or different from each other, and are each independently an integer of 1 to 3, when a is 2 or more, c is 1 and HAr's are the same as or different from each other, when b is 2 or more, R's are the same as or different from each other, when c is 2 or more, a is 1 and structures in the parenthesis are the same as or different from each other, HAr is any one selected from the following structures of (a) to (e), (a)

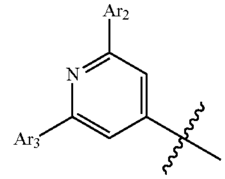

(b)

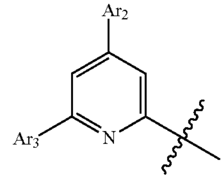

-continued (c)

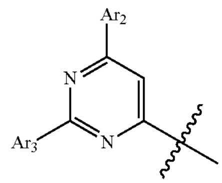

(d)

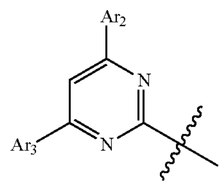

(e)

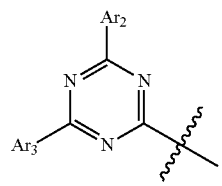

$Ar_2$ and $Ar_3$ are the same as or different from each other, and are each independently a substituted or unsubstituted aryl group; or a substituted or unsubstituted heterocyclic group including O or S, when c is 2, at least one of $Ar_2$ and $Ar_3$ is represented by

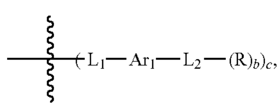

when c is 3, $Ar_2$ and $Ar_3$ are the same as or different from each other, and are each independently represented by

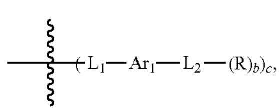

R is represented by the following Chemical Formula 2,

[Chemical Formula 2]

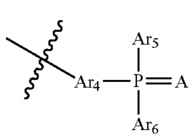

in Chemical Formula 2,

A is O; S; or Se, $Ar_4$ is a substituted or unsubstituted arylene group, and $Ar_5$ and $Ar_6$ are the same as or different from each other, and are each independently a substituted or unsubstituted aryl group, or adjacent groups optionally combine with each other to form a ring.

12. The compound of claim 11, wherein R is any one selected from the following structures:

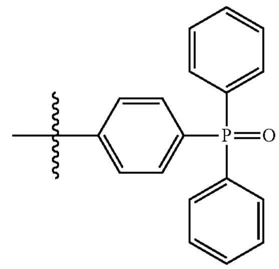

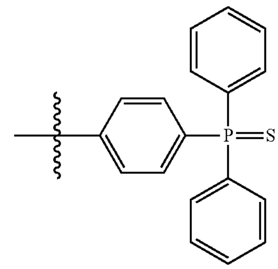

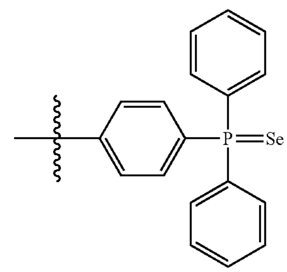

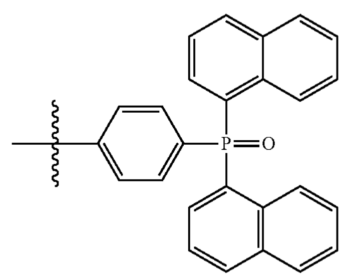

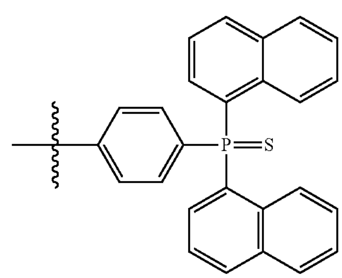

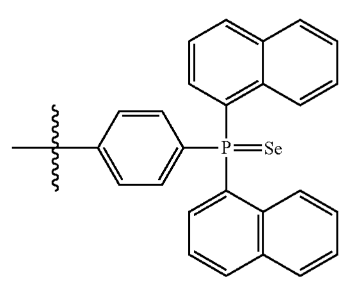

-continued

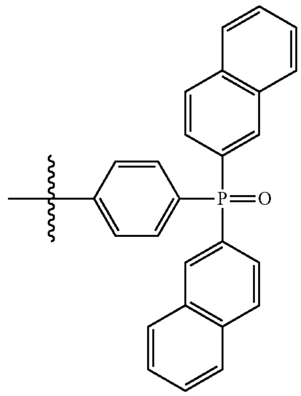

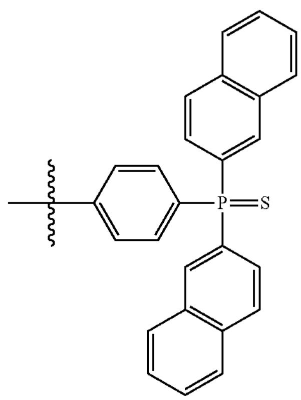

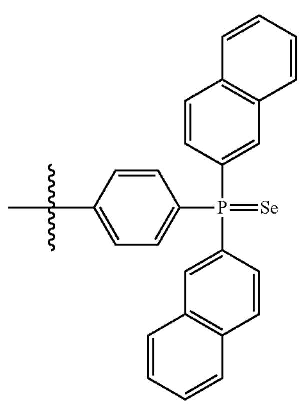

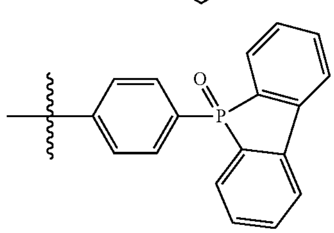

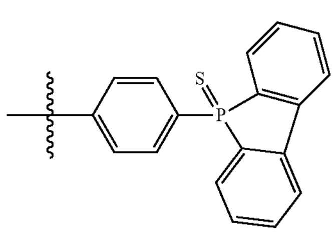

-continued

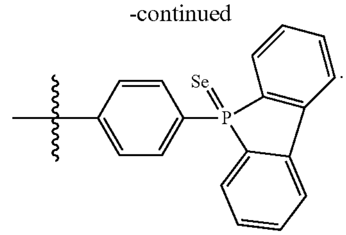

13. The compound of claim 11, wherein the compound of Chemical Formula 1 is represented by any one of the following Chemical Formulae 3 to 5:

[Chemical Formula 3]

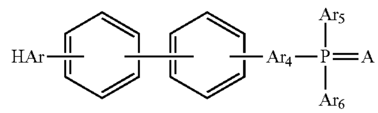

[Chemical Formula 4]

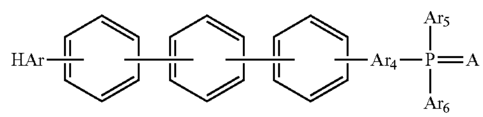

[Chemical Formula 5]

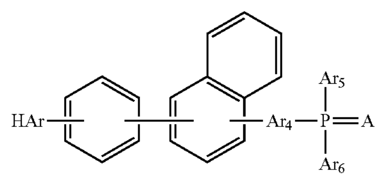

in Chemical Formulae 3 to 5, a definition of HAr is the same as that in Chemical Formula 1, and definitions of $Ar_4$ to $Ar_6$ and A are the same as those in Chemical Formula 2.

14. An organic light emitting device comprising:

a first electrode;

a second electrode; and one or more organic material layers disposed between the first electrode and the second electrode, wherein the one or more organic material layers comprise the compound of claim 11.

15. The organic light emitting device of claim 14, wherein the organic material layer comprises a light emitting layer, and the light emitting layer comprises a compound of the following Chemical Formula A-1:

[Chemical Formula A-1]

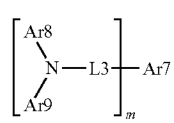

in Chemical Formula A-1, m is an integer of 1 or more,

Ar7 is a substituted or unsubstituted monovalent or more aryl group; or a substituted or unsubstituted monovalent or more heterocyclic group, L3 is a direct bond; a substituted or unsubstituted arylene group; or a substituted or unsubstituted heteroarylene group, Ar8 and Ar9 are the same as or different from each other, and are each independently a substituted or unsubstituted aryl group; a substituted or unsubstituted silyl group; a substituted or unsubstituted alkyl group; a substituted or unsubstituted arylalkyl group; or a substituted or unsubstituted heterocyclic group, or optionally combine with each other to form a substituted or unsubstituted ring, and when m is 2 or more, two or more structures in the parenthesis are the same as or different from each other.

16. The organic light emitting device of claim 15, wherein L3 is a direct bond, Ar7 is a divalent pyrene group, and Ar8 and Ar9 are the same as or different from each other, and are each independently an aryl group which is unsubstituted or substituted with a silyl group substituted with an alkyl group, and m is 2.

17. The organic light emitting device of claim 14, wherein the organic material layer comprises a light emitting layer, and the light emitting layer comprises a compound represented by the following Chemical Formula A-2:

[Chemical Formula A-2]

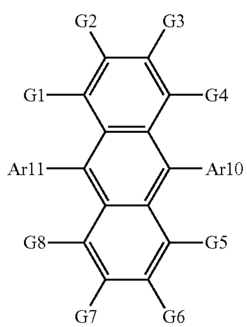

in Chemical Formula A-2,

Ar10 and Ar11 are the same as or different from each other, and are each independently a substituted or unsubstituted monocyclic aryl group; or a substituted or unsubstituted polycyclic aryl group, and G1 to G8 are the same as or different from each other, and are each independently hydrogen; a substituted or unsubstituted monocyclic aryl group; or a substituted or unsubstituted polycyclic aryl group.

18. The organic light emitting device of claim 17, wherein Ar10 and Ar11 is a 1-naphthyl group, and G1 to G8 are hydrogen.

19. The organic light emitting device of claim 15, wherein the light emitting layer comprises a compound represented by the following Chemical Formula A-2:

[Chemical Formula A-2]

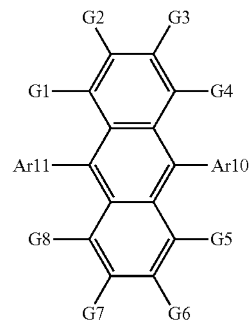

in Chemical Formula A-2,

Ar10 and Ar11 are the same as or different from each other, and are each independently a substituted or unsubstituted monocyclic aryl group; or a substituted or unsubstituted polycyclic aryl group, and G1 to G8 are the same as or different from each other, and are each independently hydrogen; a substituted or unsubstituted monocyclic aryl group; or a substituted or unsubstituted polycyclic aryl group.

* * * * *